(12) United States Patent
Kudoh

(10) Patent No.: US 7,916,195 B2
(45) Date of Patent: Mar. 29, 2011

(54) SOLID-STATE IMAGING DEVICE, IMAGING APPARATUS AND CAMERA

(75) Inventor: Yoshiharu Kudoh, Kanagawa (JP)

(73) Assignee: Sony Corporation, Tokyo (JP)

( * ) Notice: Subject to any disclaimer, the term of this patent is extended or adjusted under 35 U.S.C. 154(b) by 641 days.

(21) Appl. No.: 11/860,192

(22) Filed: Sep. 24, 2007

(65) Prior Publication Data

US 2008/0088724 A1    Apr. 17, 2008

(30) Foreign Application Priority Data

Oct. 13, 2006  (JP) ................... 2006-279733
Nov. 13, 2006  (JP) ................... 2006-306278
Mar. 2, 2007   (JP) ................... 2007-052935

(51) Int. Cl.
  *H04N 3/14*      (2006.01)
(52) U.S. Cl. ...................... 348/294; 348/218.1
(58) Field of Classification Search .............. 348/218.1, 348/294

See application file for complete search history.

(56) References Cited

U.S. PATENT DOCUMENTS

| | | | | |
|---|---|---|---|---|
| 5,793,071 | A * | 8/1998 | Sekine | 257/240 |
| 7,812,878 | B2 * | 10/2010 | Kudoh | 348/308 |
| 2004/0108525 | A1 * | 6/2004 | Sekine | 257/202 |
| 2005/0093894 | A1 * | 5/2005 | Tretter et al. | 345/694 |
| 2006/0038904 | A1 * | 2/2006 | Kudoh | 348/308 |

FOREIGN PATENT DOCUMENTS

| | | |
|---|---|---|
| JP | 10-256521 | 9/1998 |
| JP | 2001-298177 | 10/2001 |
| JP | 29940128193 | 4/2004 |
| JP | 2006-054276 | 2/2006 |
| JP | 2006-303468 | 11/2006 |

OTHER PUBLICATIONS

Office Action issued on Mar. 31, 2009, in the related Japanese application JP 2007-052935.
Office Action issued on Apr. 7, 2009, in the related Japanese application JP 2006-306278.

* cited by examiner

*Primary Examiner* — Jason Chan
*Assistant Examiner* — Usman Khan
(74) *Attorney, Agent, or Firm* — SNR Denton US LLP

(57) ABSTRACT

A solid-state imaging device includes: multiple pixels making up a slanted grid array inclined to a scanning direction, which include a photoelectric conversion unit configured to convert incident light quantity into an electric signal; and a charge-to-voltage conversion unit configured to convert signal charge read out from the photoelectric conversion unit disposed between two pixels adjacent to each other in the diagonal direction of the pixels of the multiple pixels into voltage; wherein the charge-to-voltage conversion unit is shared with the two pixels; and wherein a set of transistor group are disposed in a sharing block, which is configured of a pixel pair made up of the two pixels adjacent to each other in the diagonal direction, and a pixel pair adjacent to that pixel pair, including wiring to which the charge-to-voltage conversion unit of each pixel pair is connected.

10 Claims, 32 Drawing Sheets

— : FIRST LAYER METAL WIRING
······· : SECOND LAYER METAL WIRING
● : CONTACT
◇ : VIA HOLE

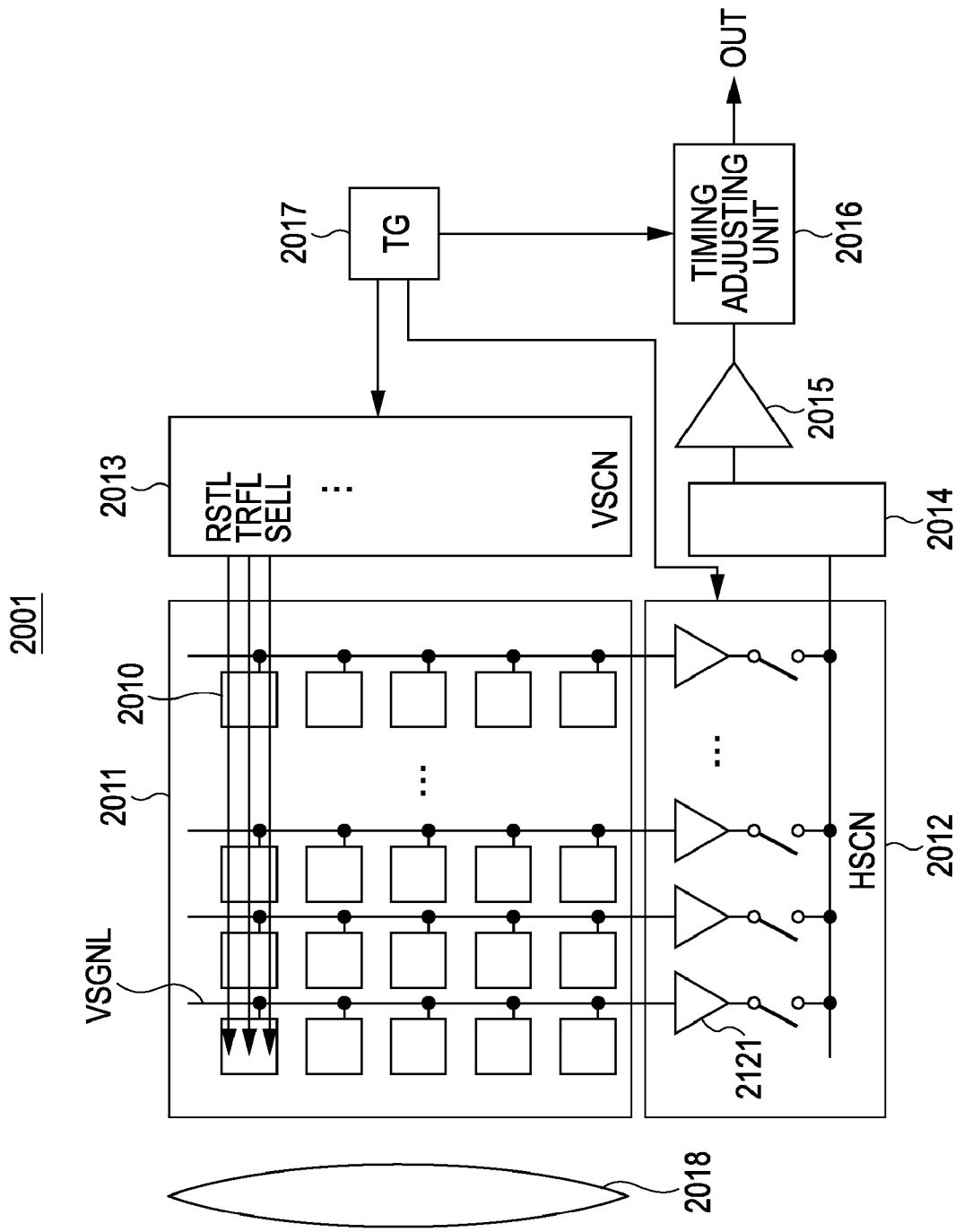

2002a

2002b

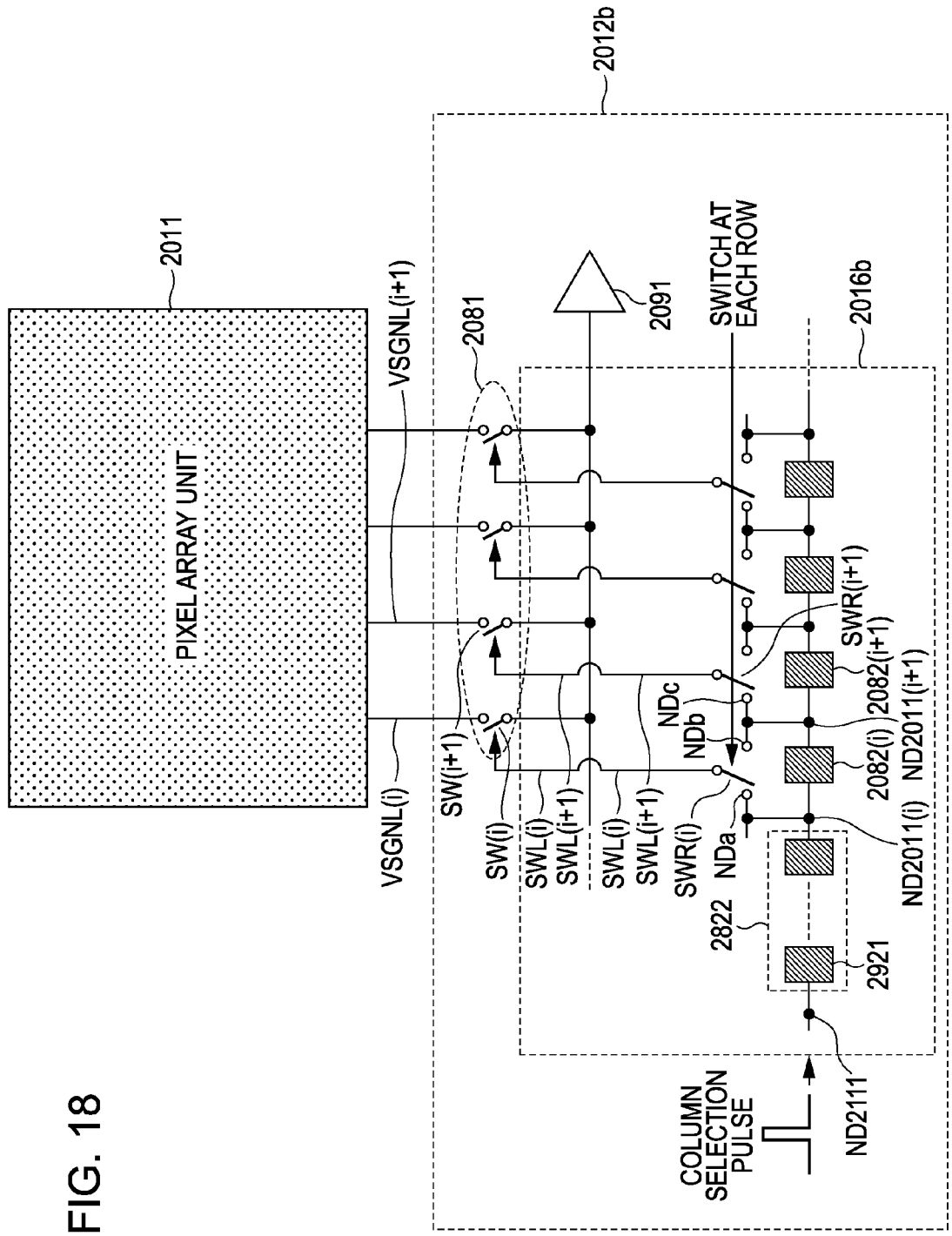

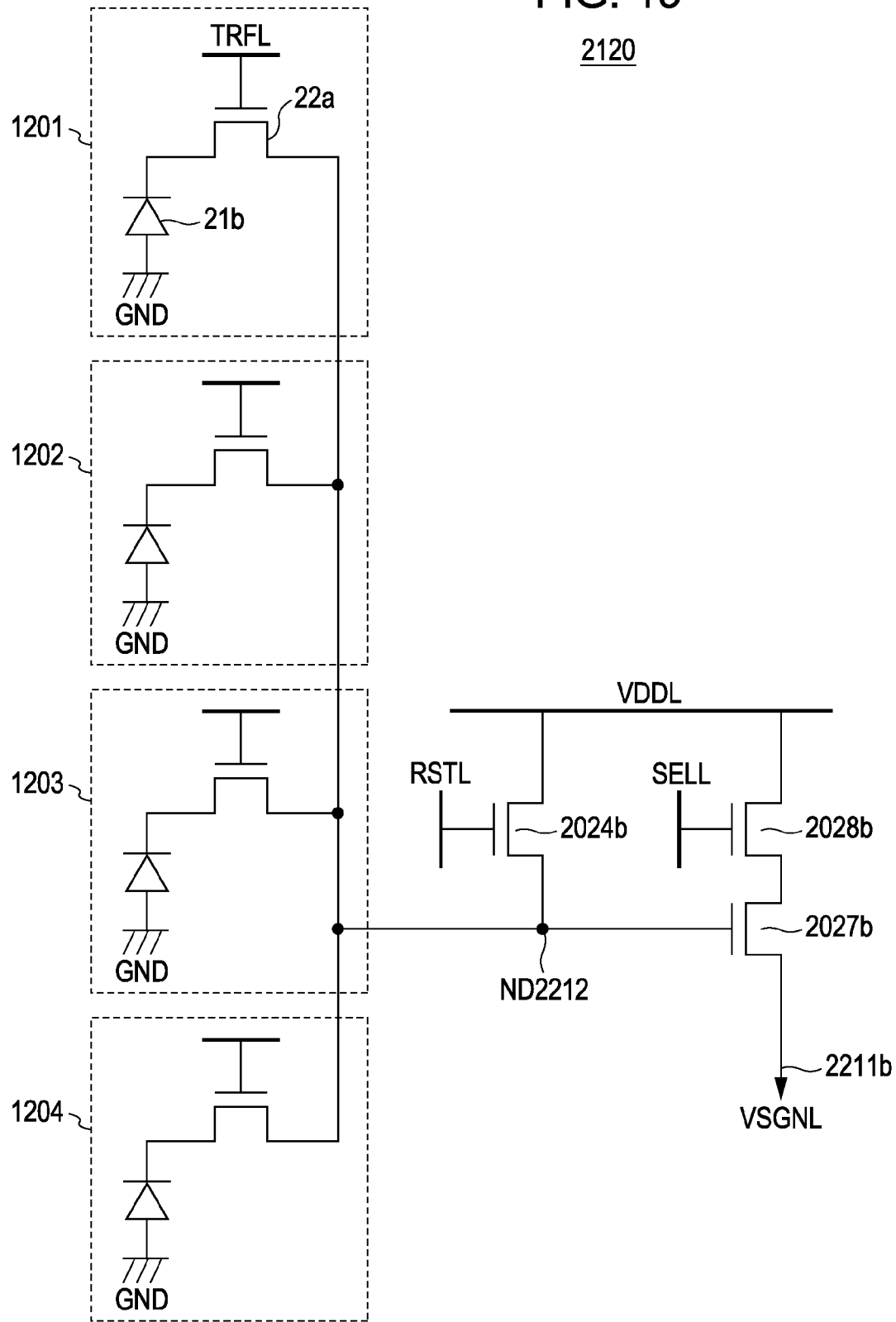

BLK3010

SOLID-STATE IMAGING DEVICE, IMAGING APPARATUS AND CAMERA

CROSS REFERENCES TO RELATED APPLICATIONS

The present invention contains subject matter related to Japanese Patent Application JP 2006-279733 filed in the Japanese Patent Office on Oct. 13, 2006, Japanese Patent Application JP 2006-306278 filed in the Japanese Patent Office on Nov. 13, 2006, and Japanese Patent Application JP 2007-052935 filed in the Japanese Patent Office on Mar. 2, 2007, the entire contents of which are incorporated herein by reference.

BACKGROUND OF THE INVENTION

1. Field of the Invention

The present invention relates to a solid-state imaging device and an imaging apparatus. Also, the present invention relates to an imaging apparatus and a camera, which include an imaging device such as a CCD (Charge Coupled Device), CMOS (Complementary Metal Oxide Semiconductor) sensors and so forth.

2. Description of the Related Art

As digital cameras have come into widespread use in recent years, high resolution has come to be demanded even of lower-priced cameras. Also, there has been demand for high resolution not only in digital cameras, but also video cameras, cameras for cellular phones, and so forth. In general, the optical size (outer size of the solid-state imaging device) has not changed, so increase in the number of pixels is synonymous with microfabrication of pixels.

Microfabrication of a pixel is directly linked with reduction in the number of photons entering into a pixel, leading to deterioration of absolute sensitivity which cannot be compensated for with improvement in quantum efficiency. This holds true for both CCD image sensors and CMOS image sensors. However, in general, it is difficult for a CMOS image sensor to condense light since metal wiring is high (thick), and sensitivity is accordingly low.

In light of the above, a technique has been proposed wherein sensitivity is increased while suppressing the deterioration of resolution from the perspective of image processing. The technique thereof will be described with reference to FIG. 30.

As shown in FIG. 30, it is known that with a so-called honeycomb pixel array, each pixel 111 is made up of a slanted square pixel array, whereby the deterioration of space resolution in the vertical and horizontal directions can be suppressed even with a half of the real number of pixels. The number of pixels can be reduced into a half with the same valid pixel region, so the area per unit pixel increases, and accordingly, sensitivity can be improved. There are many lines in the vertical and horizontal directions with artificial space, and pixel data is represented with XY coordinates, so the space resolution of these two axes is important for the perception of resolution, and accordingly, it can be said that a honeycomb pixel array has high sensitivity in many situations.

However, a honeycomb pixel array is a pixel array unsuitable for being integrated. In general, pixel data is a data array with two axes of vertical and horizontal axes, and a pixel of a square grid image sensor is also an array in accordance therewith. Along with this, control (driving and readout) is also performed in the vertical direction and the horizontal direction. On the other hand, with a honeycomb pixel array, a pixel is made up of a slanted square grid, and consequently, the array of control pixels is in a zigzag pattern.

For example, with a CMOS image sensor, in the case of a common square grid pixel array, wiring can be performed effectively by changing each metal wiring layer of the axes in the vertical and horizontal directions. On the other hand, with a honeycomb pixel array, the pixel of the adjacent row or the adjacent column is inserted between pixels in the same row or the same column, so it is unavoidable to dispose wiring in a zigzag manner, which sometimes makes it difficult to connect to a component such as a transistor or the like formed on the silicon surface at a portion overlapped with wiring.

There is a problem in that a honeycomb pixel array is high in wiring density. Accordingly, it is necessary to keep a metal opening large by reducing the number of wiring. Therefore, it is effective to share a pixel transistor (see Japanese Unexamined Patent Application Publication No. 2004-128193).

However, with the technique disclosed in Japanese Unexamined Patent Application Publication No. 2004-128193, it is unavoidable to subject the property of a fine pixel to deterioration. That is to say, with the technique disclosed in Japanese Unexamined Patent Application Publication No. 2004-128193, as shown in FIG. 31A, a transfer gate TG of a charge-to-voltage conversion unit is disposed in a side portion of a pixel 111, which excels in readout property, but includes a problem in that the condensing spot area is compressed. Also, even if a shared portion of a floating diffusion FD serving as a charge-to-voltage conversion unit is disposed between pixels, sharing a pixel transistor between two pixels makes it difficult to sufficiently secure a photodiode PD area.

Also, with a pixel group wherein multiple pixels are arrayed in a two-dimensional square, as shown in FIG. 31B, a floating diffusion FD serving as a charge-to-voltage conversion unit to be shared is disposed at a corner of the pixel 111 via the transfer gate TG. Between two pixels obliquely adjacent to each other, the distance from the condensing center of the pixel 111 thereof to the transfer gate TG can be separated by disposing the transfer gate TG at the corner of the pixel 111 thereof, thereby suppressing deterioration of sensitivity caused by the transfer gate TG absorbing light.

A CMOS imaging apparatus employing a CMOS (Complementary Metal Oxide Semiconductor) is employed as an imaging device such as a camera or the like, and includes a function such as partial readout which is difficult for a CCD (Charge Coupled Device) imaging apparatus, which is advantageous for low power consumption and reduction in size of an imaging apparatus.

In recent years, there has been demand for increase in the number of pixels in a CMOS imaging apparatus. However, a CMOS imaging apparatus includes within a pixel many driver elements such as a photodiode, a transfer transistor, a reset transistor, an amplification transistor, a select transistor, and so forth, so it is difficult to reduce the size of the pixel. Also, the driving load of a pixel circuit and the readout load of a signal from a pixel circuit are increased due to increase in the number of pixels, which has caused a disadvantageous situation for high-speed driving.

One solution to this problem is reduction in load by sharing a transistor. For example, with an arrangement wherein one amplification transistor is shared by multiple photodiodes and transfer transistors, the number of elements can be reduced, such as an amplification transistor to be connected to a vertical signal line, and so forth, whereby the load of the vertical signal line can be reduced at the time of readout of an output signal. Further, a method has been proposed wherein improvement in image quality of an output signal is realized by sharing a photoelectric conversion unit (see Japanese Unexamined Patent Application Publication No. 2006-54276).

Also, one solution relating to microfabrication of a pixel is a method wherein a transistor within a pixel is shared, the number of transistors per one pixel is reduced, and the size of the pixel is reduced (e.g., see Japanese Unexamined Patent Application Publication No. 2001-298177). For example, an arrangement is made wherein a transfer transistor is disposed as to each of multiple photodiodes, and a select transistor, a reset transistor, and an amplification transistor are shared as to the multiple photodiodes and transfer transistors.

In the event of not sharing a transistor, four transistors per pixel are provided in general, but on the other hand, upon four pixels sharing three transistors, the number of transistors can be reduced to 1.75 per pixel. Note that there is an arrangement including no select transistor, depending on the transistor driving method, etc. (see Japanese Unexamined Patent Application Publication No. 2006-54276).

SUMMARY OF THE INVENTION

A problem regarding which the need to solve has been recognized, is in that with a so-called honeycomb pixel array, a charge-to-voltage conversion unit is disposed at a side portion of a pixel, which excels in readout property, but includes a problem in that the condensing spot area is compressed, and also, in that even if the shared portion of a charge-to-voltage conversion unit (e.g., floating diffusion: FD) which is a charge-to-voltage conversion unit is disposed between pixels, sharing a pixel transistor between the two pixels makes it difficult to sufficiently secure the area of a photoelectric conversion unit (e.g., photodiode: PD).

Accordingly, there has been recognized a need to improve optical property and enable an effective pixel array to be provided by devising the layout of a transistor group such as a charge-to-voltage conversion unit, a transfer transistor, an amplification transistor, a reset transistor, and so forth.

Also, with a solution proposed by sharing a transistor of a pixel circuit, a problem has been known in that there are many cases wherein control of each transistor is restricted.

Accordingly, there has been recognized a need for an imaging apparatus and a camera, whereby load applying to a signal line can be reduced, with little influence on readout of a signal, capable of handling increase in the number of pixels.

Also, with the above-mentioned solutions, multiple components are shared, so the number of components can be reduced but the layout within each pixel becomes an uneven layout due to the shape and size and the like of each component.

Next, description will be made regarding unevenness of a layout. FIG. 32 is a diagram for describing unevenness of a layout in the case of sharing multiple components. With the layout shown in FIG. 32, two photoelectric conversion units 3001 adjacent to the diagonal direction as to a charge-to-voltage conversion unit 2 share a charge-to-voltage conversion unit 3002, these photoelectric conversion units 3001 being connected by a wiring 3004 so as to share a transistor region 3003a (width L3003a in the gate length direction) and a transistor region 3003b (width L3003b in the gate length direction) each having a different width in the gate length direction. The transistor region mentioned here is a circuit formed of a transistor making up a pixel, for example, the transistor region 3003a is formed of a reset transistor, and the transistor region 3003b is formed of an amplification transistor and a select transistor.

When a pixel is microfabricated, upon all of the transistors within the pixel being disposed, the width L in the gate length direction of the transistors becomes longer than the width of one side of one pixel. Accordingly, with the placement layout shown in FIG. 32, a transistor region is divided and disposed.

In the event of the placement layout such as shown in FIG. 32, the occupied size of a transistor region differs depending on a combination of shared transistors. The transistor region 3003b of which the occupied size is greater than that of the transistor region 3003a readily interfere mutually on a placement layout, and it is difficult to realize the placement of a transistor to prevent such interference. Also, the occupied size of a transistor region readily affects upon noise property, and consequently, the greater the occupied size is, the better noise property is.

Description will be made regarding the relation between an occupied size and noise property employing the following expression.

$$<Vn2> \propto 1/(WL) \quad (1)$$

Expression (1) is a common expression of 1/f noise quantity regarding an amplification transistor configured to amplify the voltage of a charge-to-voltage conversion unit, which represents a square average value <Vn2> in noise diffusion Vn of voltage is in inverse proportion to a gate area WL obtained by the product between the width W and gate length L of the amplification transistor.

Therefore, according to Expression (1), the occupied size of a transistor region, e.g., the greater the gate area WL of the amplification transistor is, the more 1/f noise quantity decreases, the less readily influence of random noise is received.

However, in the event of reducing a pixel along with increase in the number of pixels, it is necessary to reduce the occupied size of a transistor region. In this case, the noise property of the amplification transistor deteriorates, and also random noise increases, which is caused by trapping of charge in a gate interface or the like. Further, the size of a component affects a placement layout of the component.

In the event that a placement layout is restricted by the size of a component, improvement in a manufacturing process is effective in eliminating a limiting factor. However, in order to eliminate a limiting factor, the shift to a microfabrication process is needed. This causes a problem in that investment in manufacturing facilities is unavoidable, and the number of manufacturing processes increases. Further, with a CCD or CMOS imaging apparatus, a pixel unit has a configuration different from that of a circuit around the pixel unit in many cases, which causes a problem in that manufacturing cost increases.

Another technique to eliminate a limiting factor is the above-mentioned technique for increasing the number of pixels by sharing a component. However, with this technique, in addition to increase in the above-mentioned unevenness of layout, it is necessary to wire between separated pixels, so the layout of wiring is crowded, and further, the floating node capacity of an amplification transistor input unit increases, which leads to deterioration of conversion efficiency. Consequently, it is necessary to raise the area utilization factor on a semiconductor board, and to have the occupied size of a transistor region to be a large as possible by optimizing the placement layout of components.

Accordingly, there has been found a need to provide an imaging apparatus and a camera whereby the area utilization factor on a semiconductor board can be raised, and the occupied size of a transistor region can be increased.

A solid-state imaging device according to an embodiment of the present invention comprises: a plurality of pixels making up a slanted grid array inclined to a scanning direction, which include a photoelectric conversion unit configured to convert incident light quantity into an electric signal; and a charge-to-voltage conversion unit configured to convert signal charge read out from the photoelectric conversion unit disposed between two pixels adjacent to each other in the diagonal direction of the pixels of the plurality of pixels into voltage, wherein the charge-to-voltage conversion unit is shared with the two pixels; and wherein a set of transistor group are disposed in a sharing block, which is configured of a pixel pair made up of the two pixels adjacent to each other in the diagonal direction, and a pixel pair adjacent to that pixel pair, including wiring to which the charge-to-voltage conversion unit of each pixel pair is connected.

With the solid-state imaging device according to an embodiment of the present invention, a charge-to-voltage conversion unit configured to convert signal charge read out from the photoelectric conversion unit into voltage is disposed between two pixels adjacent to each other in the diagonal direction of a pixel, and accordingly, a condensing spot area is secured while obtaining high readout property. A sharing block is provided, which includes two pairs of pixel pairs, and wiring which connects the charge-to-voltage conversion unit of each pixel pair, a set of transistor group are disposed in the sharing block, which makes up an arrangement of sharing a pixel transistor between four pixels, whereby the light receiving area of a photoelectric conversion unit can be secured sufficiently. Note that with two pixels, it is difficult to sufficiently secure the light receiving area of the photoelectric conversion unit. Also, upon exceeding four pixels, the capacity (e.g., floating diffusion) of the charge-to-voltage conversion unit increases, and thus, the conversion efficiency in charge-to-voltage conversion extremely deteriorates, and also accuracy in voltage detection deteriorates. Therefore, an arrangement is employed wherein a pixel transistor is shared between four pixels.

An imaging apparatus according to an embodiment of the present invention comprises: a condensing optical unit configured to condense incident light; a solid-state imaging device configured to receive the light condensed by the condensing optical unit to subject this to photoelectric conversion; and a signal processing unit configured to process the signal subjected to photoelectric conversion, wherein the solid-state imaging device includes a plurality of pixels making up a slanted grid array inclined to a scanning direction, which include a photoelectric conversion unit configured to convert incident light quantity into an electric signal, and a charge-to-voltage conversion unit configured to convert signal charge read out from the photoelectric conversion unit disposed between two pixels adjacent to each other in the diagonal direction of the pixels of the plurality of pixels into voltage, wherein the charge-to-voltage conversion unit is shared with the two pixels, and wherein a set of transistor group are disposed in a sharing block, which is configured of a pixel pair made up of the two pixels adjacent to each other in the diagonal direction, and a pixel pair adjacent to that pixel pair, including wiring to which the charge-to-voltage conversion unit of each pixel pair is connected.

With the imaging apparatus according to an embodiment of the present invention, the solid-state imaging device according to an embodiment of the present invention is employed, and accordingly, as with the above-mentioned description, the light receiving area of the photoelectric conversion unit of each pixel can be sufficiently secured.

With an imaging apparatus according to an embodiment of the present invention, a plurality of pixel circuits including at least an output transistor configured to output signal charge obtained by imaging to a signal line are arrayed, and an output-side diffusion layer of the output transistor connected to the signal line is shared between a plurality of pixel circuits which are not accessed concurrently.

The output-side diffusion layer of the output transistor connected to the signal line may be shared between two pixel circuits adjacent to the wiring direction of the signal line, with the two pixel circuits being accessed at a different timing.

The two pixel circuits may include a plurality of transistors, and the plurality of transistors are formed so as to have reverse array directionality between the two pixel circuits.

The output-side diffusion layer of the output transistor may be shared between two pixel circuits adjacent to the diagonal direction of the pixel circuit arrays, with the two pixel circuits are accessed at a different timing.

The two pixel circuits may include a plurality of transistors arrayed in a direction perpendicular to the wiring direction of the signal line, with the plurality of transistors being formed so as to have reverse array directionality between the two pixel circuits.

The pixel circuit may include a plurality of photoelectric conversion units, with the plurality of photoelectric conversion units sharing the output transistor to form a pixel block.

The plurality of pixel circuits may be arrayed in a matrix shape, with the output-side diffusion layer of the output transistor being connected to the signal line which is different depending on an odd row and even row, and the imaging apparatus reading out an output signal from the output transistor at each row.

The imaging apparatus may include a timing adjusting unit configured to adjust the readout timing of the output signal to be output to the signal line which differs at each row at the time of readout of the output signal.

The timing adjusting unit may include: a selection switch configured to select the output signal depending on regarding whether the output signal is output from which row of an odd row or an even row; and a delay circuit configured to provide delay between the output signal of the odd row and the output signal of the even row, wherein the delay circuit selectively outputs the signal to which the delay is provided.

A camera according to an embodiment of the present invention comprises: an imaging apparatus; and an optical system configured to guide incident light to an imaging area of the imaging apparatus, wherein with the imaging apparatus, a plurality of pixel circuits are arrayed, which include at least an output transistor configured to output signal charge obtained by imaging to a signal line; and wherein the output-side diffusion layer of the output transistor connected to the signal line is shared between multiple pixel circuits which are not accessed concurrently.

According to an embodiment of the present invention, the output-side diffusion layer of the output transistor is shared between multiple pixel circuits which are not accessed concurrently, including at least an output transistor.

An imaging apparatus according to an embodiment of the present invention comprises: a plurality of photoelectric conversion units configured to convert incident light into signal charge; and a plurality of sharing blocks including a plurality of transistors, which is shared with each of the photoelectric conversion units, configured to convert the signal charge obtained at such a photoelectric conversion unit into voltage to output the voltage; wherein with the sharing block, a transistor placement region within such a sharing block is divided, and also wired, and a plurality of sharing blocks where the plurality of transistors of which the occupied sizes differ are disposed at different positions are alternately arrayed.

The plurality of photoelectric conversion units may be disposed so as to be adjacent to a diagonal direction share the plurality of transistors.

The plurality of photoelectric conversion units may be disposed so as to be adjacent to a wiring direction share the plurality of transistors.

The plurality of transistors may include at least a reset transistor configured to reset the voltage of the charge-to-voltage conversion unit, and an amplification transistor configured to amplify the voltage of the charge-to-voltage conversion unit.

An imaging apparatus according to an embodiment of the present invention comprises: a plurality of photoelectric conversion units configured to convert incident light into signal charge; and a plurality of sharing blocks including a plurality of transistors, which is shared with each of the photoelectric conversion units, configured to convert the signal charge obtained at such a photoelectric conversion unit into voltage to the voltage; wherein a transistor placement region within such a sharing block is divided, and also wired, and the plurality of sharing blocks are arrayed by being shifted in a wiring direction at each column so as to match the occupied sizes of the plurality of transistors between columns.

The plurality of photoelectric conversion units may be disposed so as to be adjacent to a diagonal direction share the plurality of transistors.

The plurality of photoelectric conversion units may be disposed so as to be adjacent to a wiring direction share the plurality of transistors.

The plurality of transistors may include at least a reset transistor configured to reset the voltage of the charge-to-voltage conversion unit, and an amplification transistor configured to amplify the voltage of the charge-to-voltage conversion unit.

A camera according to an embodiment of the present invention comprises: an imaging apparatus; and an optical system configured to guide incident light to an imaging area of the imaging apparatus, wherein the imaging apparatus includes a plurality of photoelectric conversion units configured to convert incident light into signal charge, and a plurality of sharing blocks including a plurality of transistors, which is shared with each of the photoelectric conversion units, configured to convert the signal charge obtained at such a photoelectric conversion unit into voltage to the voltage; wherein with the sharing block, a transistor placement region within such a sharing block is divided, and also wired, and a plurality of sharing blocks where the plurality of transistors of which the occupied sizes differ are disposed at different positions are alternately arrayed.

A camera according to an embodiment of the present invention comprises: an imaging apparatus; and an optical system configured to guide incident light to an imaging area of the imaging apparatus, wherein the imaging apparatus includes a plurality of photoelectric conversion units configured to convert incident light into signal charge, and a plurality of sharing blocks including a plurality of transistors, which is shared with each of the photoelectric conversion units, configured to convert the signal charge obtained at such a photoelectric conversion unit into voltage to the voltage; wherein a transistor placement region within such a sharing block is divided, and also wired, and the plurality of sharing blocks are arrayed by being shifted in a wiring direction at each column so as to match the occupied sizes of the plurality of transistors between columns.

According to an embodiment of the present invention, with a sharing block made up of multiple photoelectric conversion units and multiple transistors, a photoelectric conversion unit is shared with multiple transistors, and multiple sharing blocks where the multiple transistors of which the occupied sizes differ are disposed at different positions are alternately arrayed.

According to the solid-state imaging device according to an embodiment of the present invention, there is an advantage wherein the light receiving area of the photoelectric conversion unit of each pixel is sufficiently secured, so high sensitivity can be realized while maintaining resolution, thereby enhancing optical property. Also, an arrangement is employed wherein a pixel transistor is shared with four pixels, whereby wiring can be simplified, and an effective pixel layout can be provided.

According to the imaging apparatus according to an embodiment of the present invention, the solid-state imaging device is employed, whereby the same advantages as those described above can be obtained, and also an advantage can be obtained wherein pixel property, e.g., high sensitivity can be realized.

According to an embodiment of the present invention, an imaging apparatus and a camera can be provided wherein the driving load of a pixel circuit is reduced.

According to an embodiment of the present invention, the area usage efficiency of a semiconductor board can be raised, and the occupied size of a transistor region can be increased.

BRIEF DESCRIPTION OF THE DRAWINGS

FIG. 8 is a block diagram illustrating one configuration example of principal units of an imaging apparatus according to a third embodiment of the present invention;

FIG. 18 is a diagram of one example for describing one configuration example and the operation thereof of a timing adjusting unit according to a sixth embodiment;

FIG. 19 is a diagram illustrating one configuration example of a pixel block according to a seventh embodiment, wherein a CMOS imaging apparatus is illustrated as one example;

DESCRIPTION OF THE PREFERRED EMBODIMENTS

Figure 1:
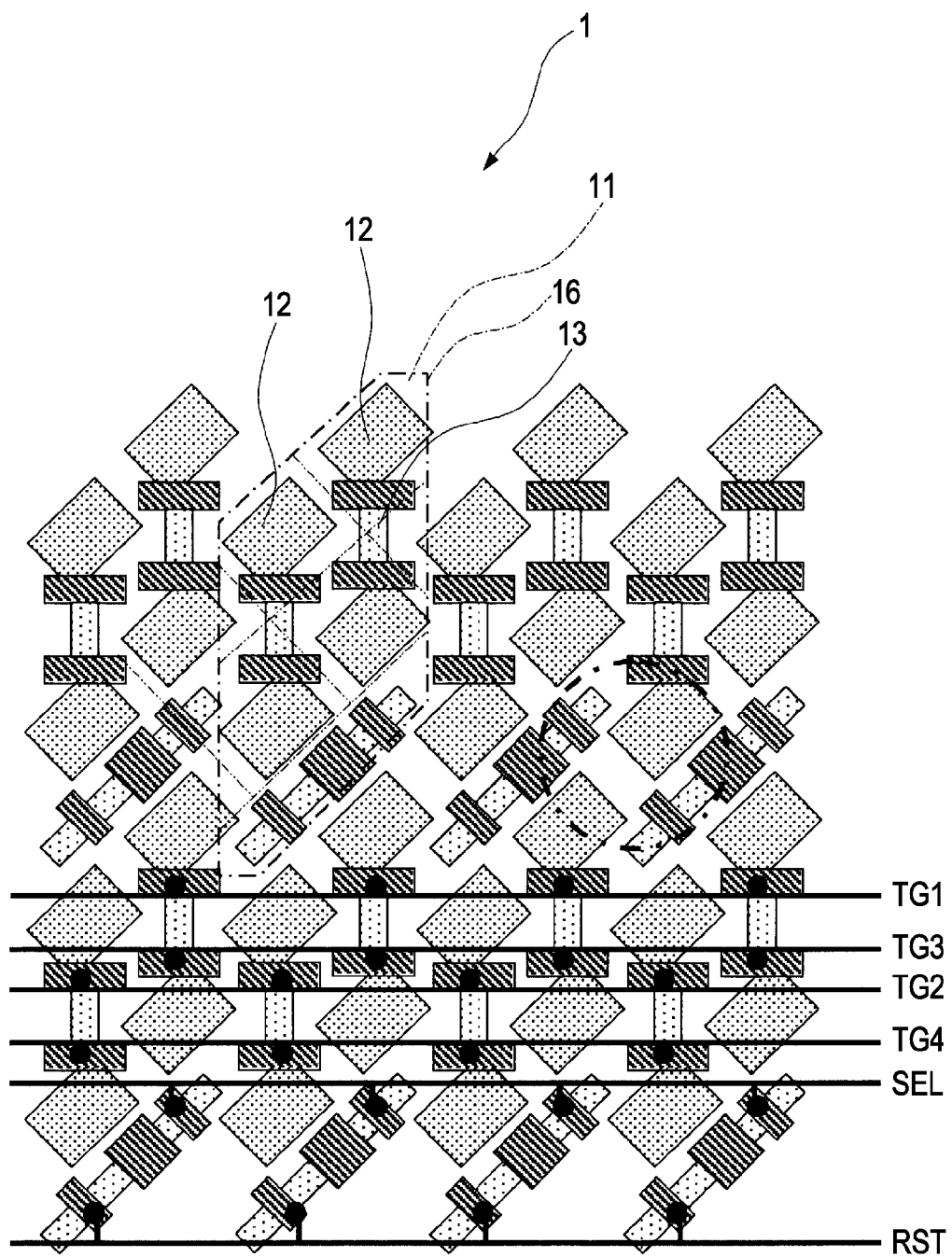
FIG. 1 is a plan layout view illustrating a solid-state imaging device according to an embodiment (first embodiment) of the present invention.
Figure 2:
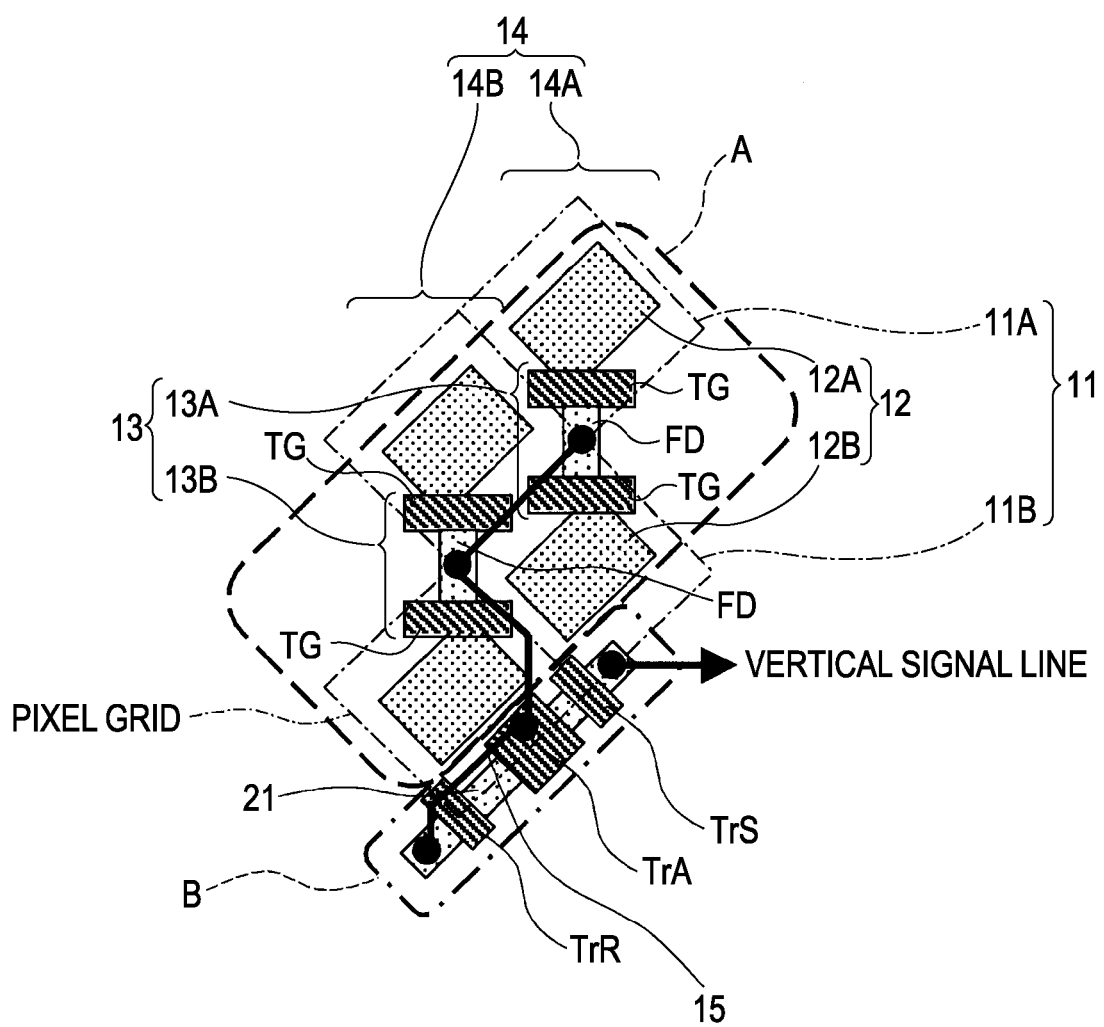
FIG. 2 is an enlarged view of a sharing block.

A solid-state imaging device according to a first embodiment of the present invention will be described with reference to the plan layout view in FIG. 1, and the enlarged view of a sharing block in FIG. 2. FIGS. 1 and 2 illustrate a layout of transistors such as an amplifier and the like, which is configured to maximize optical or electric property.

As shown in FIGS. 1 and 2, a solid-state imaging device 1 is provided with multiple pixels 11 each having a photoelectric conversion unit (e.g., photodiode) 12 configured to convert incident light into an electric signal. The multiple pixels 11 are arrayed by being shifted in the row direction or column direction as to an adjacent pixel, which makes up a so-called honeycomb pixel array. Now, as one example, a slanted square grid pixel array inclined in obliquely 45-degrees direction as to the scanning direction. Of the multiple pixels 11, between the two pixels 11 (11A) and 11 (11B) adjacent to each other in a diagonal direction, a charge-to-voltage conversion unit 13 is disposed, which is configured to convert the signal charge read out from the photoelectric conversion units 12 (12A) and 12 (12B) into voltage. This charge-to-voltage conversion unit 13 is shared with the two pixels 11A and 11B. Further, the solid-state imaging device 1 is provided with a sharing block 16 which includes two pairs of pixel pair made up of a pixel pair 14 (14A) made up of the two pixels 11A and 11B adjacent to a diagonal direction of a pixel (vertical direction or horizontal direction, vertical direction in the drawing), and a pixel pair 14 (14B) adjacent to the pixel pair 14A, and a control signal wiring 15 connecting the charge-to-voltage conversion units 13 (13A) and 13 (13B) of each of the pixel pairs 14A and 14B, and one set of transistor group 21 are disposed in the sharing block 16.

The transistor group 21 includes, for example, an amplification transistor TrA serving as a signal amplification unit, a reset transistor TrR, and a selection transistor TrS. That is to say, four pixels include one set of transistor group 21. A layout is configured wherein pixels equivalent to four rows worth are included in one block. Also, a transfer gate TG of each photoelectric conversion unit 12 is disposed at a corner of the photoelectric conversion unit 12, and a floating diffusion FD of the charge-to-voltage conversion unit 13 is shared between the pixels 11A and 11B adjacent to in the vertical direction (diagonal direction of the photoelectric conversion unit 12). Also, the transfer gate TG is provided between the floating diffusion FD and the photoelectric conversion unit 12.

The sharing blocks 16 are arrayed in a two-dimensional manner in even pitch in the vertical direction and in the horizontal direction. Also, multiple transistors to be accessed concurrently which make up the transistor group 21 are arrayed in the above-mentioned oblique direction in one column. As can be understood at a glance, the sharing block 16 is clearly separated into a region A where the transfer gate TG is disposed, and a region B where the transistor group 21 such as an amplifier and so forth are disposed, whereby wiring can be performed without each of wirings for control becoming intricate. Note that in the drawing, each wiring (transfer gate wiring TG1, transfer gate wiring TG2, reset wiring RST, select wiring SEL, transfer gate wiring TG3, transfer gate wiring TG4, etc.) is illustrated in a straight line, but actually which is disposed so as to avoid above the photoelectric conversion unit 12.

Next, a solid-state imaging device according to a second embodiment of the present invention will be described with reference to the plan layout view in FIG. 4.

Figure 3:
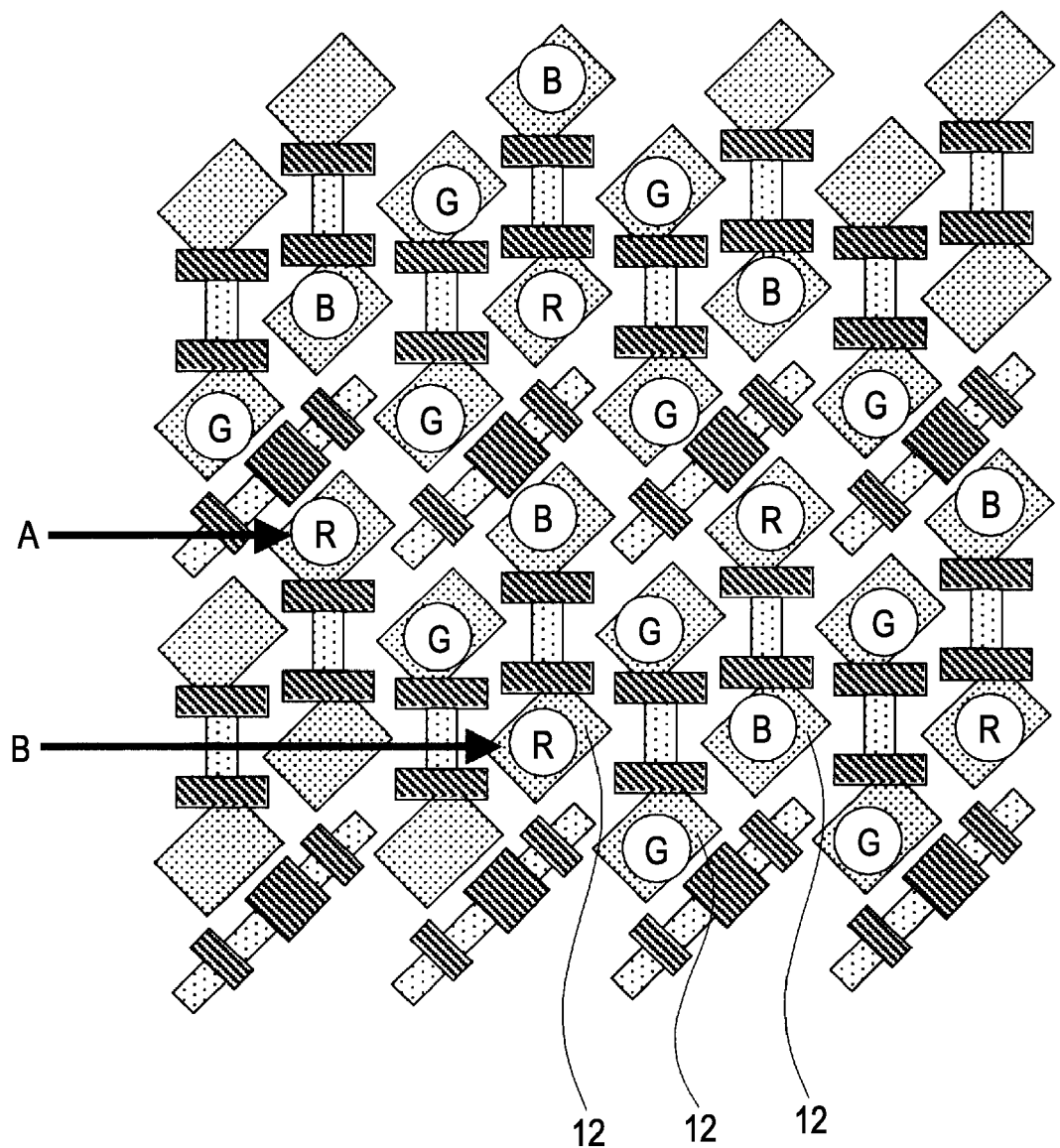
FIG. 3 is a plan layout view illustrating a color array example of the solid-state imaging device according to the first embodiment.

This solid-state imaging device 2 according to the second embodiment is an apparatus obtained by improving the solid-state imaging device 1 according to the first embodiment. With the solid-state imaging device 1, as shown in a portion C in FIG. 1, a portion is generated wherein the transistor groups 21 and 21 are disposed at both sides of the photoelectric conversion unit 12. Thus, when attempting to make the light receiving area of the photoelectric conversion unit 12 the same size, it is necessary to match the light receiving area of the photoelectric conversion unit 12 with a photoelectric conversion unit having a small light receiving surface, which leads to deterioration of saturation charge quantity. Also, as shown in FIG. 3, when employing a color array such as a common Bayer array inclined 45 degrees, such a color array has features wherein the orientation of the photoelectric conversion unit (e.g., photodiode) 12 differs even with the same color pixel such as a pixel A and a pixel B. With a shared configuration, shading changes depending on the orientation of the photoelectric conversion unit 12, it is necessary to provide shading correction tables by two directions for each color.

Figure 4:
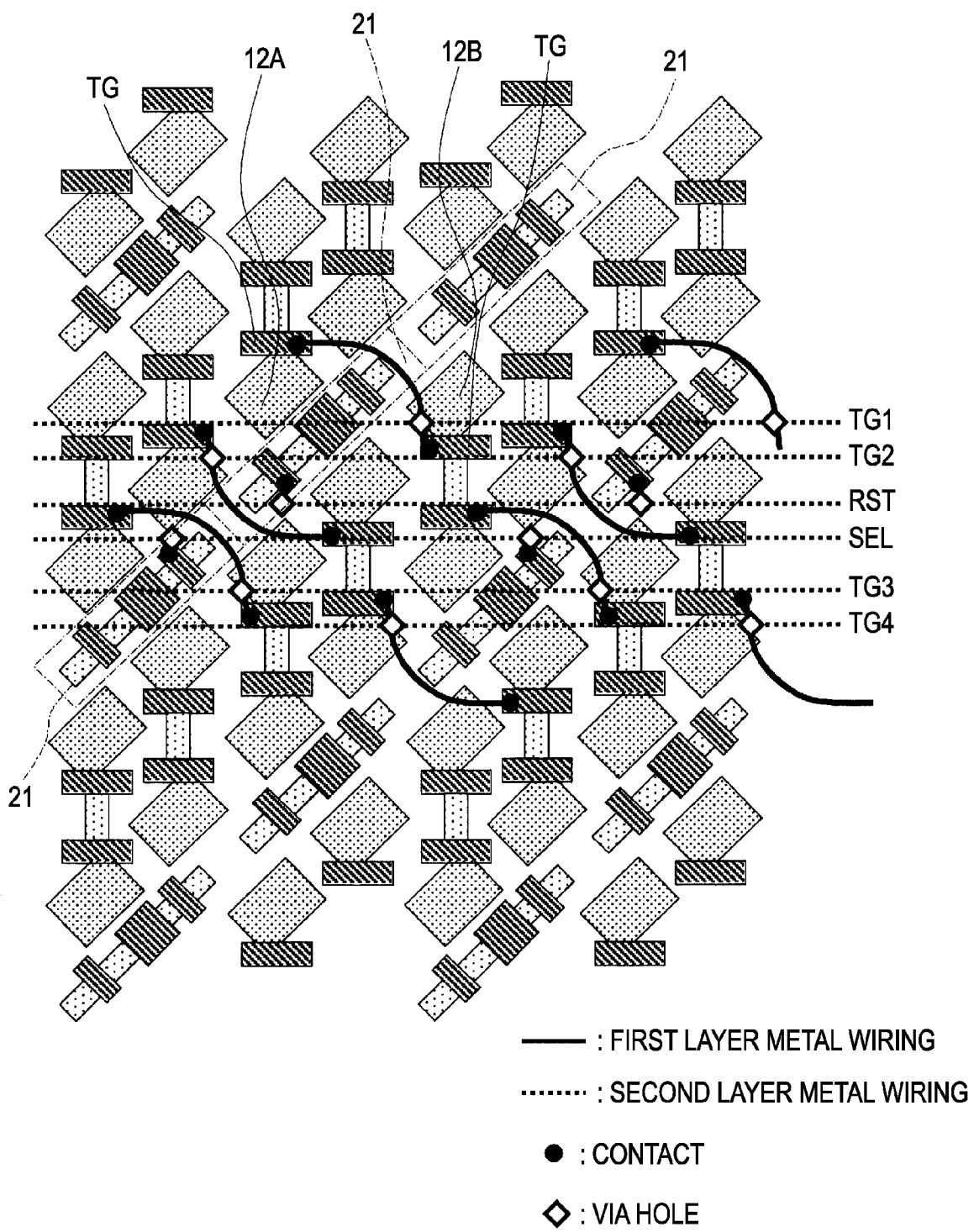
FIG. 4 is a plan layout view illustrating a solid-state imaging device according to an embodiment (second embodiment) of the present invention.
Figure 5:
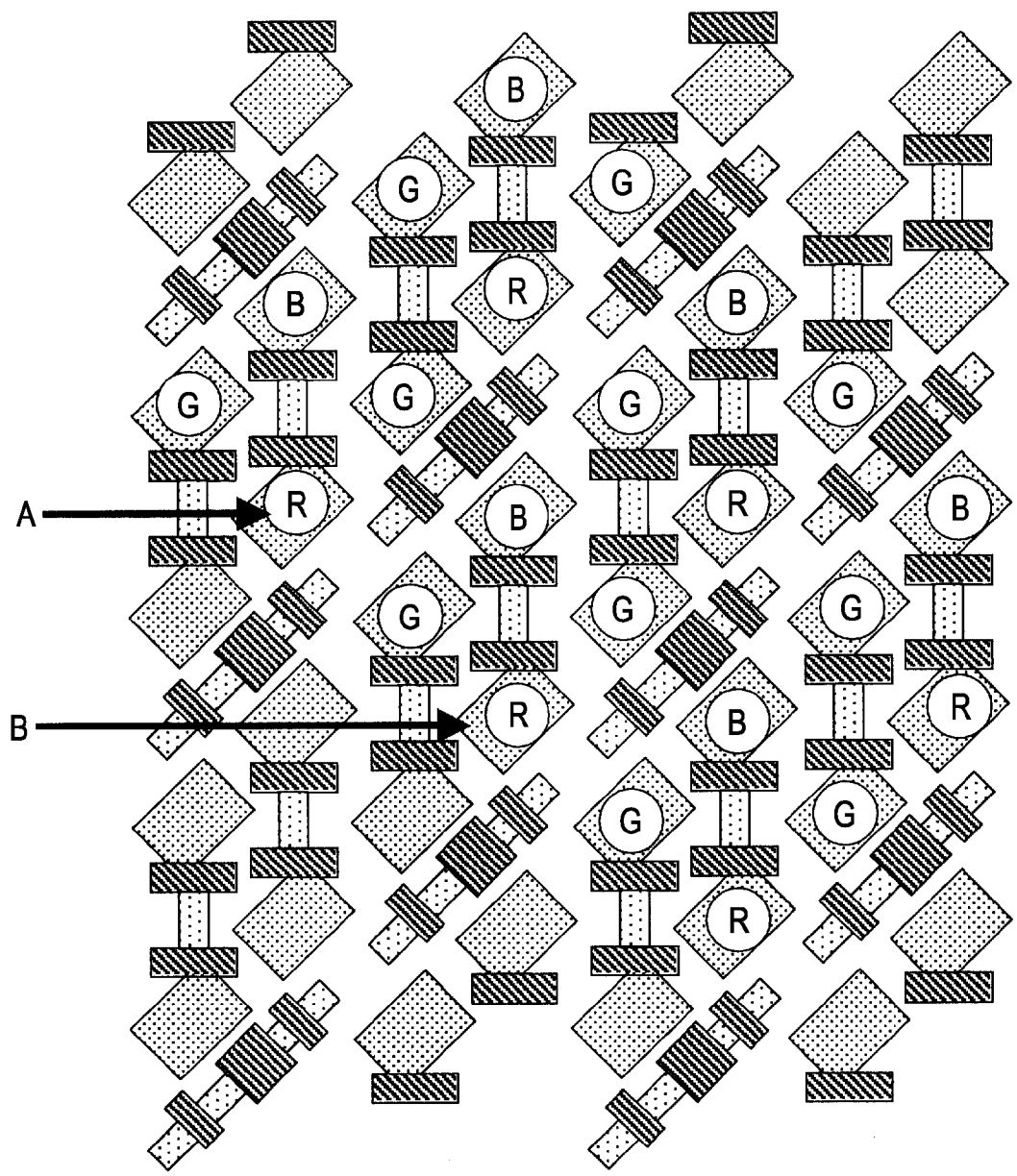
FIG. 5 is a plan layout view illustrating a color array example of the solid-state imaging device according to the second embodiment.

Accordingly, with the solid-state imaging device 2 according to the second embodiment, as shown in FIG. 4, let us say that the configuration of a unit block is generally the same as that in the first embodiment. The features of the present second embodiment are in that the transistor group 21 such as an amplifier, reset, and so forth is disposed in one straight line in the oblique direction. Thus, an invalid region on the semiconductor surface, which has been a problem of the solid-state imaging device 1 according to the first embodiment, can be decreased, whereby the light receiving area of the photoelectric conversion unit 12 can be maximized. Also, with regard to a color array, as shown in FIG. 5, even with a slanted Bayer array, the same color has the same orientation such as the pixel A and pixel B, whereby the number of shading tables can be suppressed.

Figure 6:
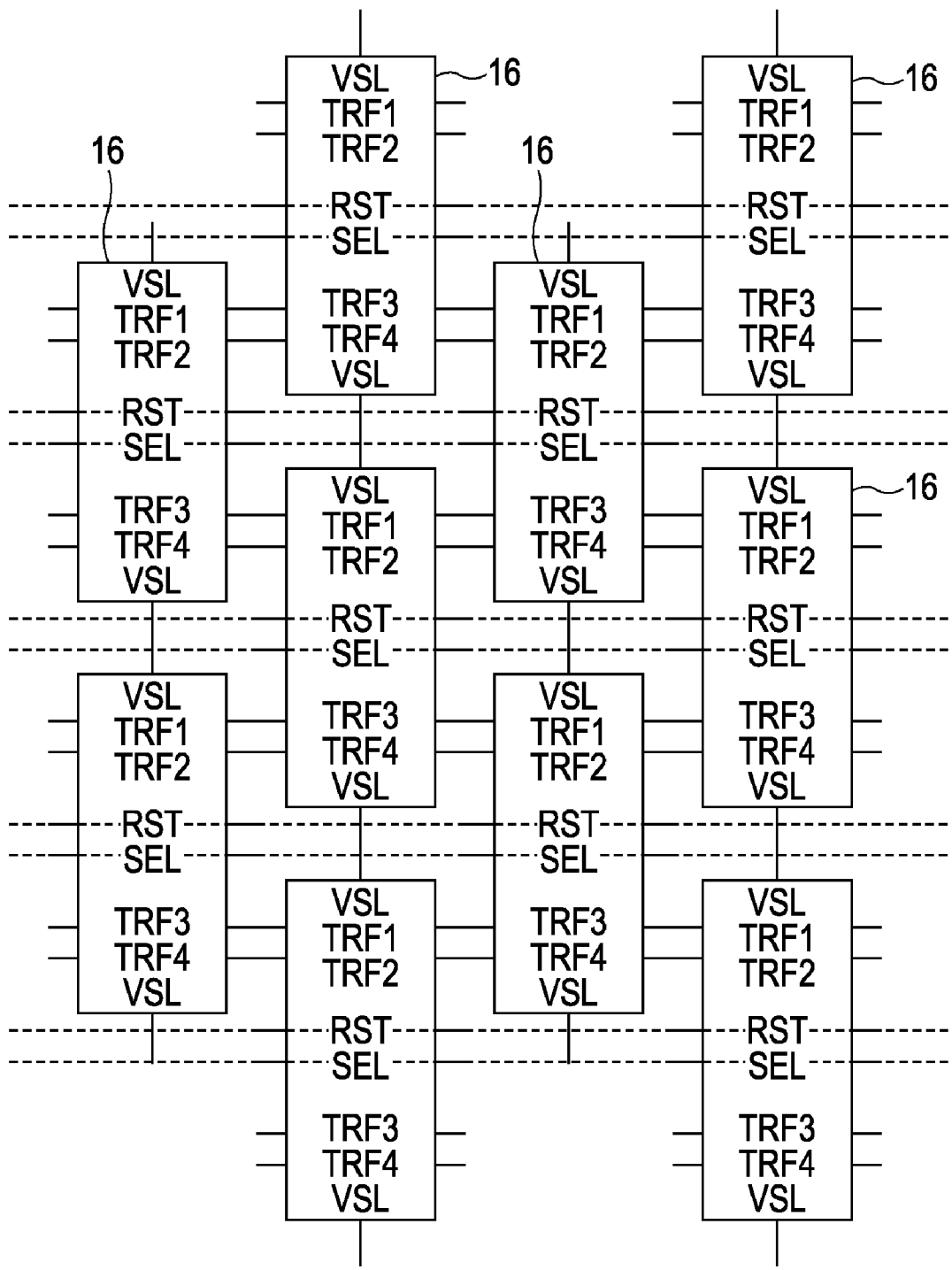
FIG. 6 is a wiring chart illustrating a wiring example of the solid-state imaging device according to the second embodiment.

Note that with the layout arrangement of the solid-state imaging device 2, the readout direction of the photoelectric conversion unit 12 disposed on the same row becomes two directions, whereby the control signal line 15 to the transfer gate TG increases, and all of the control lines (transfer gate wiring TG1, transfer gate wiring TG2, reset wiring RST, select wiring SEL, transfer gate wiring TG3, transfer gate wiring TG4, etc.) pass through above the transistor group 21 made up of a pixel transistor column, whereby wiring is restricted. Therefore, with the solid-state imaging device 2 according to the second embodiment, the transfer gates TG and TG of the photoelectric conversion units 12A and 12B on the same row are locally connected with the metal wiring of a first layer, and further, wiring in the horizontal direction is performed with the metal wiring of a second layer, thereby suppressing increase in density of the metal wiring. In this case, as shown in FIG. 6, the sharing block 16 is disposed, and with regard to the reset wiring RST and select wiring SEL, control lines differ between columns.

With the solid-state imaging devices 1 and 2 according to the first and second embodiments of the present invention, the charge-to-voltage conversion unit 13 configured to convert the signal charge read out from the photoelectric conversion units 12 (12A) and 12 (12B) into voltage is disposed between the two pixels 11 (11A) and 11 (11B) adjacent to each other in a diagonal direction of a pixel, whereby a condensing spot area is secured while obtaining high readout property. Also, there is provided the sharing block 16 including two pairs of pixel pairs 14 (14A) and 14 (14B), and the control signal wiring 15 connecting the charge-to-voltage conversion units 13A and 13B of the pixel pairs 14A and 14B, and one set of transistor group 21 are disposed in the sharing block 16, thereby providing an arrangement wherein a pixel transistor is shared between four pixels, and consequently, the light receiving area of the photoelectric conversion unit 12 is sufficiently secured. Note that with sharing between two pixels, it is difficult to sufficiently secure the light receiving area of the photoelectric conversion unit, but on the other hand, with sharing between not less than four pixels, the capacity (e.g., floating diffusion) of the charge-to-voltage conversion unit increases, and thus, the conversion efficiency in charge-to-voltage conversion extremely deteriorates, and also accuracy in voltage detection deteriorates. Therefore, an arrangement is employed wherein a pixel transistor is shared between four pixels. Thus, the light receiving area of the photoelectric conversion unit 12 of each pixel is sufficiently secured, whereby high sensitivity can be realized while keeping resolution, which provides an advantage wherein optical property is improved. Also, an arrangement is employed wherein a pixel transistor is shared between four pixels, whereby wiring can be simplified, and also an effective pixel layout can be provided.

Next, an imaging apparatus according to an embodiment of the present invention will be described with reference to the block diagram in FIG. 7.

Figure 7:
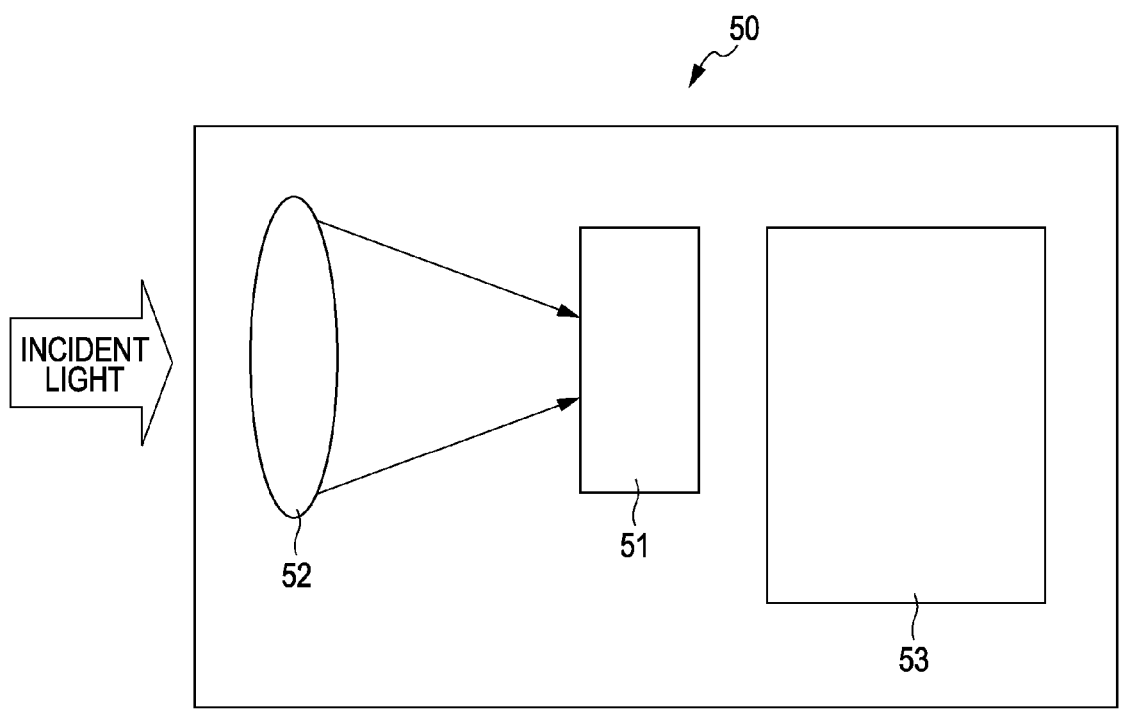
FIG. 7 is a block diagram illustrating an imaging apparatus according to an embodiment of the present invention.

As shown in FIG. 7, an imaging apparatus 50 includes a solid-state imaging device (not shown) at an imaging unit 51. An image forming optical system 52 configured to form an image is provided at the condensing side of the imaging unit 51, and also, the imaging unit 51 is connected with a signal processing unit 53 including a driving circuit configured to drive the image forming optical system 52, a signal processing circuit configured to subject the signal subjected to photoelectric conversion at the solid-state imaging device to image processing, and so forth. Also, the image signal processed at the signal processing unit can be stored by an image storing unit (not shown). With such an imaging apparatus 50, the solid-state imaging device 1 or solid-state imaging device 2 described in the above-mentioned embodiment can be employed for the above-mentioned solid-state imaging device.

With the imaging apparatus 50 according to an embodiment of the present invention, the solid-state imaging device 1 or solid-state imaging device 2 according to the above-mentioned embodiment of the present invention is employed, so as with the above-mentioned description, the area of the photoelectric conversion unit of each pixel is sufficiently secured. Thus, there is provided an advantage wherein pixel property, e.g., high sensitivity can be realized.

Note that the imaging apparatus 50 according to an embodiment of the present invention is not restricted to the above-mentioned arrangement, and can be applied to any arrangement as long as an imaging apparatus employs a solid-state imaging device.

The solid-state imaging devicees 1 and 2 may be formed as one chip, or may be a module having an imaging function wherein a signal processing unit or optical system is integrally packaged with an imaging unit. Also, an embodiment of the present invention can be applied to not only a solid-state imaging device but also an imaging apparatus. In this case, the effect of realizing high image quality can be obtained as an imaging apparatus. Here, an imaging apparatus means a camera or a portable device having an imaging function. Also, "imaging" includes not only taking an image at the time of ordinary camera photographing, but also fingerprint detecting, as a definition in a broad sense.

Reference numeral 1 denotes a solid-state imaging device, 11 denotes a pixel, 12 denotes a photoelectric conversion unit, 13 denotes a charge-to-voltage conversion unit, 14 denotes a pixel pair, 15 denotes a signal control wiring, 16 denotes a sharing block, and 21 denotes a transistor group, respectively.

Third Embodiment

A third embodiment of the present invention will be described below with reference to the drawings. FIG. 8 is a block diagram illustrating one configuration example of principal units of an imaging apparatus according to a third embodiment of the present invention.

The imaging apparatus 2001 includes a pixel circuit 2010, a pixel array unit 2011, a horizontal scan circuit (HSCN) 2012, an amplifier 2121, a vertical scan circuit (VSCN) 2013, a signal processing circuit 2014, an analog-to-digital converter (A/D) 2015, a timing adjusting unit 2016, a timing generator (TG) 2017, and a lens 2018.

With the pixel array unit 2011, for example, the pixel circuit 2010 is arrayed with a predetermined array mode in a matrix shape.

Also, with the pixel array unit 2011, the vertical scan circuit 2013 and each row of a pixel array are connected with a reset line RSTL, a transfer selection line TRFL, and a selection line SELL, and each column of the pixel array is arrayed with a vertical signal line VSGNL.

The horizontal scan circuit 2012 includes the amplifier 2121 therein, which is connected to each vertical signal line VSGNL. Note that the analog-to-digital converter 2015 is employed instead of the amplifier 2121 depending on the configuration of the imaging apparatus.

The signal processing circuit 2014 is configured to adjust the signal level of a signal input from the horizontal scan circuit 2012, and outputs the signal to the analog-to-digital converter 2015.

The analog-to-digital converter 2015 is configured to convert the analog signal input from the signal processing circuit 2014 into a digital signal, and outputs the digital signal to the timing adjusting unit 2016.

The timing adjusting unit 2016 is configured to delay the digital signal input from the analog-to-digital converter 2015 by predetermined time in accordance with a predetermined procedure, and outputs the digital signal. Description will be made later regarding the operation of the timing adjusting unit 2016.

The timing generator 2017 is configured to generate a predetermined clock, and to control the driving timing of the horizontal scan circuit 2012, vertical scan circuit 2013, and the timing adjusting unit 2016.

Also, the present imaging apparatus includes an optical system lens 2018, and a light signal is input to the pixel circuit 2010 of the pixel array unit 2011.

Figure 9A:
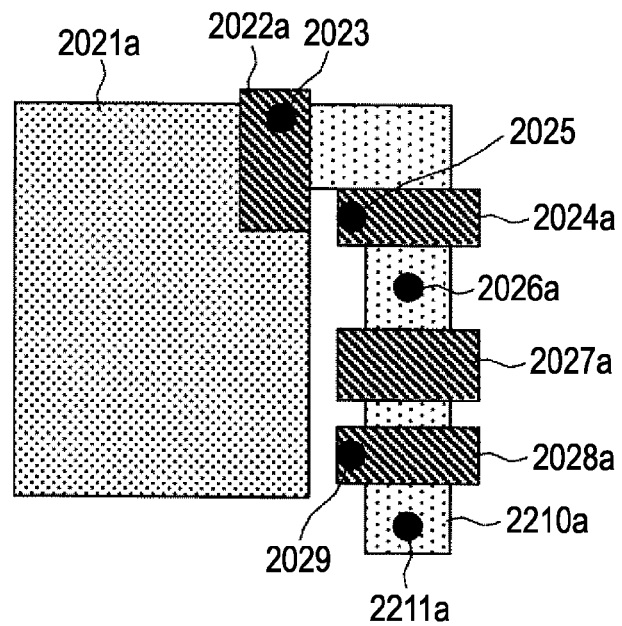
FIGS. 9A and 9B are diagrams illustrating one configuration example of a unit pixel circuit according to the third embodiment of the present invention.
Figure 9B:
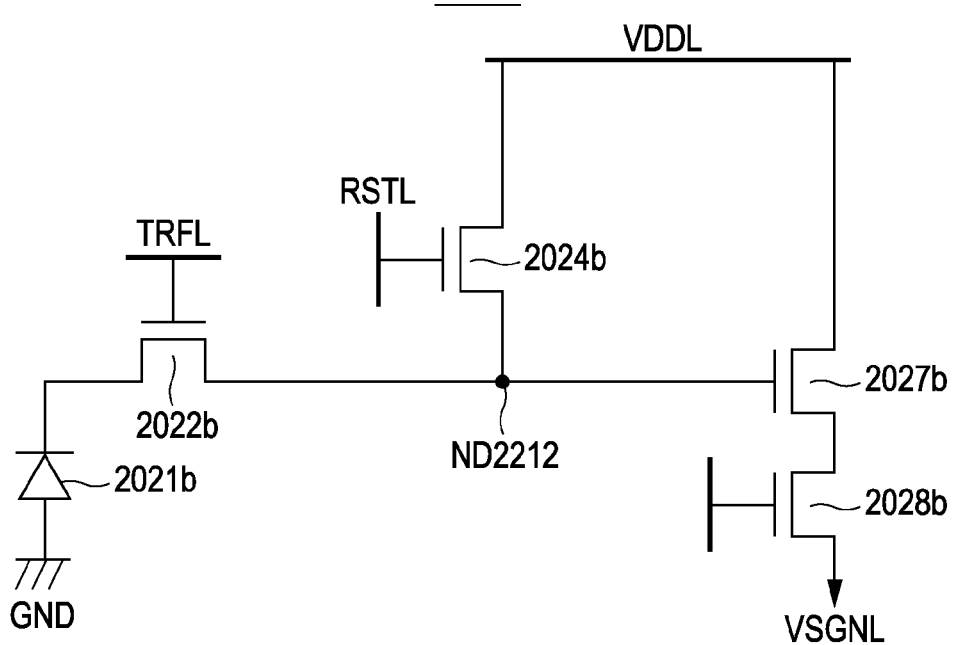

Next, description will be made regarding a configuration example of a unit pixel circuit according to the third embodiment of the present invention. FIGS. 9A and 9B are diagrams illustrating one configuration example of the unit pixel circuit according to the third embodiment of the present invention, illustrating one example of a CMOS imaging apparatus.

FIG. 9A is a schematic view of the unit pixel circuit according to the third embodiment. The unit pixel circuit 2002a shown in FIG. 9A includes a photodiode PD 2021a, a transfer gate TRFG 2022a, a transfer gate electrode 2023, a reset gate RSTG 2024a, a reset gate electrode 2025, a power electrode 2026a, amplification gate 2027a, a selection gate SELG 2028a, a selection gate electrode 2029, a source diffusion layer 2210a of an amplification transistor, and a source electrode 2211a of the amplification transistor.

The photodiode PD 2021a is configured to subject incident light to photoelectric conversion to signal charge (e.g., electron) of charge quantity corresponding to the light quantity thereof.

The transfer gate TRFG 2022a includes the transfer gate electrode 2023. In the event that predetermined voltage is applied to the transfer gate electrode 2023, the potential of the transfer gate 2022a drops, the transfer gate 2022a is switched from a closed state to an open state, and the transfer gate 2022a transfers the signal charge stored in the photodiode PD 2021a to a floating diffusion FD layer not shown in FIG. 9A. In the event that predetermined voltage is not applied to the transfer gate electrode 2023, the transfer gate 2022a is kept in a closed state, and signal charge is stored in the photodiode PD 2021a.

The reset gate RSTG 2024a includes the reset gate electrode 2025. In the event that predetermined voltage is applied to the reset gate RSTG 2024a, the potential of the reset gate RSTG 2024a drops, the reset gate RSTG 2024a is switched from a closed state to an open state. Subsequently, the signal charge stored in the floating diffusion FD layer not shown in FIG. 9A is discharged. In the event that predetermined voltage is not applied to the reset gate RSTG 2024a, the reset gate RSTG 2024a is kept in a closed state, and signal charge is transferred to the amplification gate AMPG 2027a.

The power electrode 2026a to which predetermined power voltage VDD is applied is configured to control whether to open the gates of the reset gate RSTG 2024a and the selection gate 2028a.

The amplification gate 2027a stores signal charge in the floating diffusion FD layer not shown in FIG. 9A. In the event that the selection gate 2028a is open by predetermined voltage being applied to the selection gate 2028a, the voltage of the floating diffusion FD layer is amplified, and the signal charge stored in the floating diffusion FD layer is output to the source electrode 2211a of the amplification transistor serving as an output transistor.

The selection gate 2028a includes the selection gate electrode 2029. In the event that predetermined voltage is applied to the selection gate 2028a, the potential of the selection gate 2028a drops, the selection gate 2028a is switched from a closed state to an open state, and the selection gate 2028a transfers the signal charge of which the potential is amplified to the signal line VSGNL via the amplification gate 2027a. In the event that predetermined voltage is not applied to the selection gate 2028a, the selection gate 2028a is kept in a closed state, and the signal charge is kept in a stored state in the floating diffusion FD layer.

FIG. 9B is an equivalent circuit diagram of the unit pixel circuit 2002a shown in FIG. 9A. The unit pixel circuit 2002b shown in FIG. 9B includes a photodiode PD 2021b, a transfer transistor TTR 2022b, a reset transistor RTR 2024b, a potential line VDDL, an amplification transistor ATR 2027b, a selection transistor STR 2028b, a signal output terminal 2211b, and a node ND 2212.

With the photodiode PD 2021b, the anode is grounded, and the cathode is connected to the source of the transfer transistor TTR 2022b.

With the transfer transistor TTR 2022b, the source is connected to the cathode of the photodiode PD 2021b, the drain is connected to the node ND 2212, and the gate is connected to the transfer selection line TRFL.

With the reset transistor RTR 2024b, the source is connected to the node ND 2212, the drain is connected to a predetermined potential line VDDL, and the gate is connected to the reset line RSTL. Note that the node ND 2212 is equivalent to the floating diffusion FD layer.

With the amplification transistor ATR 2027b serving as an output transistor, the drain is connected to a predetermined potential line VDDL, the source is connected to the drain of the selection transistor STR 2028b, and the gate is connected to the node ND 2212.

The signal output terminal 2211b is connected to the source of the amplification transistor ATR 2027b which is the output-side diffusion layer.

With the selection transistor STR 2028b, the drain is connected to the source of the amplification transistor ATR 2027b, the source is connected to the signal output terminal 2211b, and the gate is connected to the selection line SELL.

The photodiode PD 2021b generates signal charge according to the light quantity of incident light by photoelectric conversion, and stores this.

With the transfer transistor TTR 2022b, upon a high-level voltage being applied to the transfer selection line TRFL, the switch is turned on (conductive state), and a signal is transferred to the node ND 2212.

With the reset transistor RTR 2024b, upon a high-level voltage being applied to the reset line RSTL, the switch is turned on, and the potential of the node ND 2212 is reset to the power voltage VDD.

With the amplification transistor ATR 2027b, upon the potential of the node ND 2212 being switched to a high level, the switch is turned on, the potential of the node ND 2212 is amplified, and a signal is propagated to the vertical signal line VSGNL.

With the selection transistor STR 2028b, upon a high-level voltage being applied to the selection line SELL, the switch is turned on, and a signal is transferred to the vertical signal line VSGNL via the signal output terminal 2211b.

Also, the transfer selection line TRFL, selection line SELL, and reset line RSTL, which are wired to each row of a pixel array, are selectively driven by the vertical scan circuit 2013, and the vertical signal line VSGNL selectively transfers the signal read out from a pixel to the horizontal scan circuit 2012. With regard to the horizontal scan circuit 2012, and vertical scan circuit 2013, driving timing is controlled by the timing generator 2017.

Figure 10A:
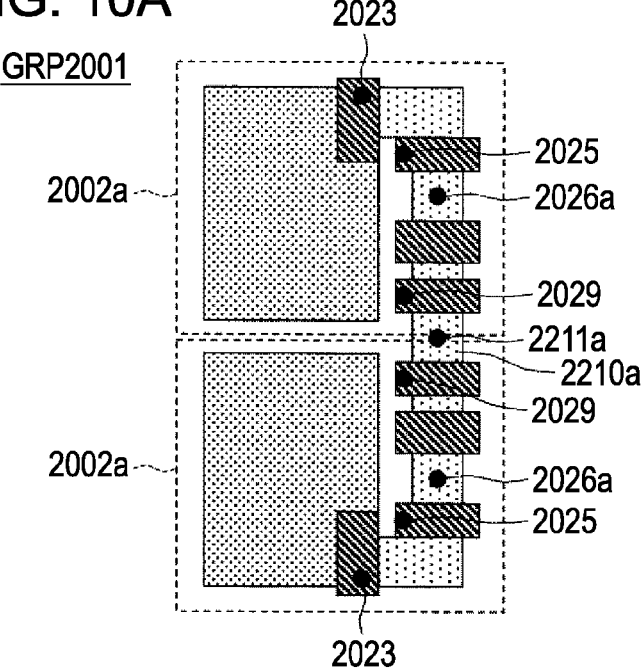
FIGS. 10A and 10B are diagrams illustrating one layout example of a pixel circuit according to the third embodiment of the present invention.
Figure 10B:
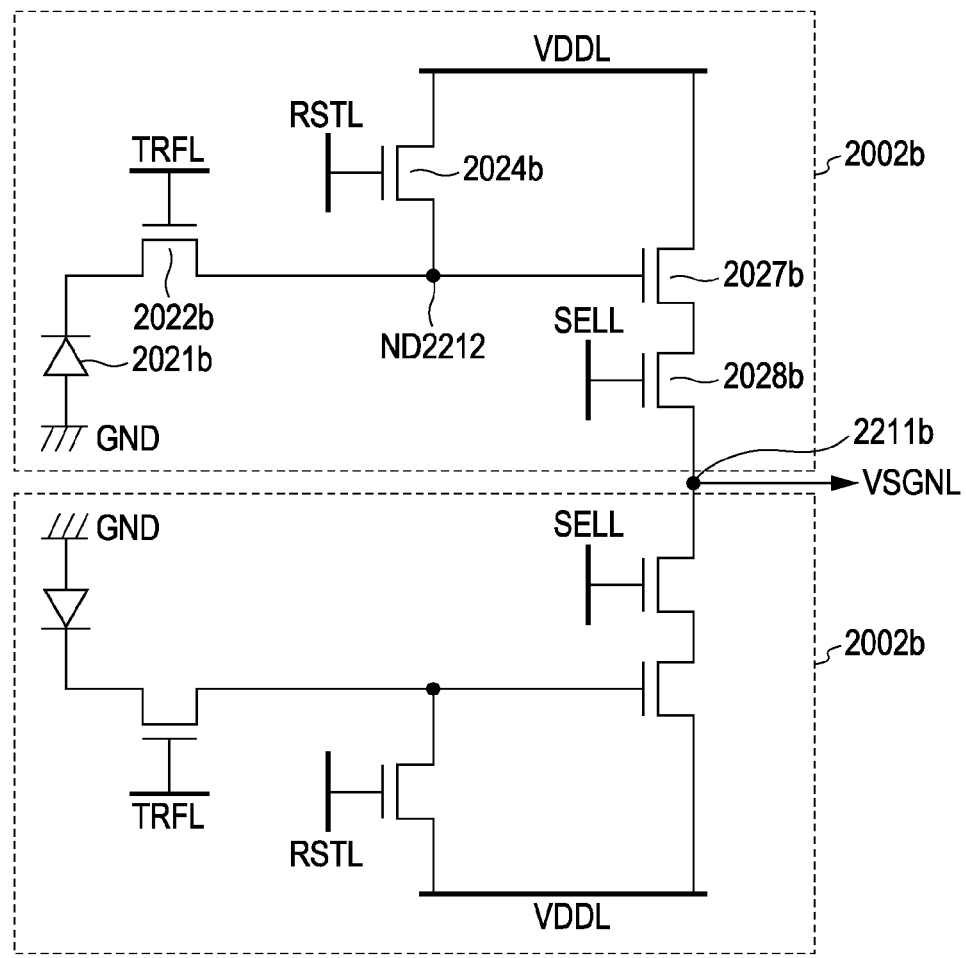

Description will be made below regarding a layout example of a pixel circuit according to the third embodiment of the present invention. FIGS. 10A and 10B are diagrams illustrating one layout example of a pixel circuit according to the third embodiment of the present invention.

The pixel group GRP 2001 shown in FIG. 10A is one example wherein the two pixel circuits 2002a shown in FIG. 9A share the source diffusion layer 2210a of the amplification transistor, and the two pixel circuits 2002a are disposed mutually inverse as to the source diffusion layer 2210a. FIG. 10B is an equivalent circuit diagram of the pixel group GRP 2001 shown in FIG. 10A.

The pixel group GRP 2001 shown in FIG. 10A is one example wherein the two equivalent circuits 2002b shown in FIG. 9B share the signal output terminal 2211b, and are disposed conversely mutually as to signal output terminal 2211b.

Figure 11:
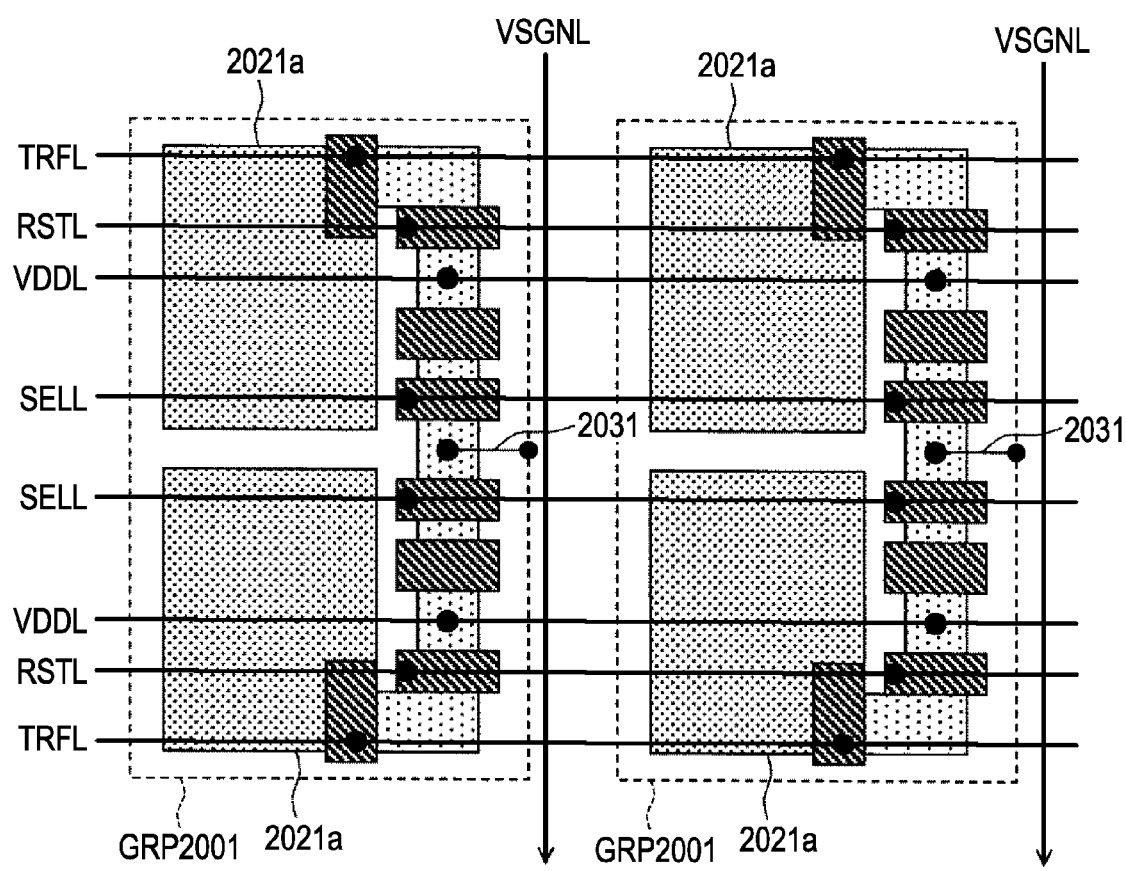
FIG. 11 is a diagram where the pixel block group GRP 2001 shown in FIG. 10A is arrayed in a matrix shape along a vertical signal line VSGNL.

FIG. 11 is a diagram where the pixel group GRP 2001 shown in FIG. 10A is arrayed in a matrix shape along the vertical signal line VSGNL. With the pixel group GRP 2001, each of the transfer gate electrodes 2023 is connected to the transfer selection line TRFL, each of the reset gate electrodes 2025 is connected to the reset line RSTL, each of the power electrodes 2026a is connected to the potential line VDDL, each of the selection gate electrodes 2029 is connected to the selection line SELL, and the source electrode 2211 of the amplification transistor and the vertical signal line VSGNL are each connected to the signal line 2031.

Next, description will be made with reference to FIG. 11 regarding a process wherein with the third embodiment, the signal charge generated at the photodiode PD 2021a is converted into a voltage signal, and the voltage signal is output to the vertical signal line VSGNL.

Figure 12:
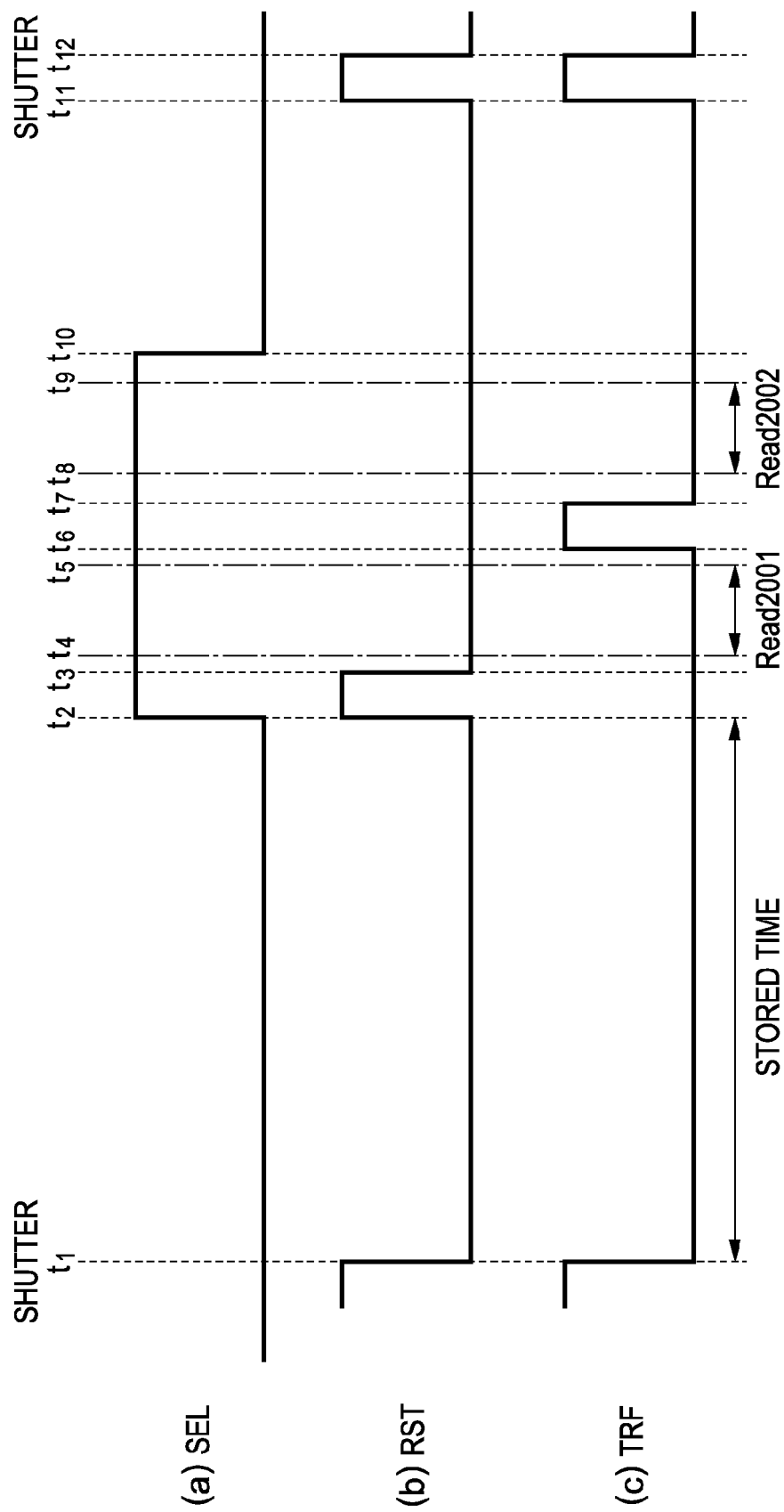
FIG. 12 is a timing chart for describing the operation of an imaging apparatus 2001 according to the third embodiment.

FIG. 12 is a timing chart for describing the operation of the imaging apparatus 1 according to the third embodiment.

Looking at FIG. 12, (a) illustrates the timing of a selection signal SEL configured to control the selection transistor STR 2028b, (b) in FIG. 12 illustrates the timing of a control signal RST configured to control the reset transistor RTR 2024b, and (c) in FIG. 12 illustrates the timing of a control signal TRF configured to control the transfer transistor TTR 2022b.

Note that FIG. 12 illustrates only the timing charts of the rest transistor RTR 2024b, transfer transistor TTR 2022b, and selection transistor STR 2028b in the pixel group GRP 2001.

At point-in-time t1, the shutter of the imaging apparatus opens, the incident light by which an image is formed through the lens of the imaging apparatus enters in the photodiode PD 2021b. At this time, the transfer transistor TTR 2022b, reset transistor RTR 2024b, and selection transistor STR 2028b are in an OFF state.

At point-in-time t1 through point-in-time t2, signal charge is generated at the photodiode PD 2021b due to photoelectric effects, and this signal charge is stored in the photodiode PD 2021b till point-in-time t2 when the reset transistor RTR 2024b is turned on. The period from point-in-time t1 to point-in-time t2 is the storage time of signal charge.

At point-in-time t2, the high-level selection signal SEL from the vertical scan circuit 2013 is propagated to the selection signal SELL, whereby the selection transistor STR 2028b is turned on. At point-in-time t2 through point-in-time t10, the selection transistor STR 2028b is kept in an ON state.

Also, at point-in-time t2, the node ND 2212 is reset. Specifically, the high-level reset signal RST is propagated to the reset line RSTL from the vertical scan circuit 2013, whereby the reset transistor RTR 2024b is turned on, and the voltage of the node ND 2212 is reset to the power potential VDD.

At point-in-time t3, the low-level reset signal RST from the vertical scan circuit 2013 is propagated to the reset line RSTL, whereby the reset transistor RTR 2024b is turned off, and the resetting of the node ND 2212 is completed.

At point-in-time t4 through point-in-time t5, the potential of the node ND 2121 is read out as a reference signal SGLB. Let us say that this readout period of the potential is taken as Read2001.

At point-in-time t6, the high-level transfer signal TRF is propagated to the transfer selection line TRFL from the vertical scan circuit 2013, whereby the transfer transistor TTR 2022b is turned on, the signal charge stored in the photodiode PD 2021b is transferred to the node ND 2212.

Also, at point-in-time t6 through point-in-time t7, the transfer transistor TTR 2022b is kept in an ON state.

At point-in-time t7, the low-level transfer signal TRF is propagated to the transfer selection line TRFL from the vertical scan circuit 2013, whereby the transfer transistor TTR 2022b is turned off.

At point-in-time t8 through point-in-time t9, the difference between the voltage of the node ND 2212 and the voltage of the reference signal SGLB read out during a readout period Read2001 is read out as a signal due to signal charge transferred from the node ND 2212. Let us say that this signal readout period is taken as Read2002. Also, at the time of this signal readout, the amplification transistor ATR 2027b is turned on, the voltage of the node ND 2212 is amplified, and the voltage is output to the vertical signal line VSGNL via the signal output terminal 2211b.

At point-in-time t10, the low-level selection signal SEL is propagated to the selection line SELL from the vertical scan circuit 2013, whereby the selection transistor STR 2028b is turned off, and the signal output to the horizontal scan circuit 2012 is completed.

At point-in-time t11, before the shutter of the imaging apparatus 2001 opens, the high-level reset signal RST is propagated to the reset line RSTL from the vertical scan circuit 2013, whereby the reset transistor RTR 2024b is turned on, and the potential of the node ND 2212 is reset to the power potential VDD.

Also, at the same time, the high-level transfer signal TRF is propagated to the transfer selection line TRFL from the vertical scan circuit 2044, whereby the transfer transistor 2052 is turned on.

Hereafter, with the present embodiment, a signal readout period is based on the signal readout period Read2002.

Note however, with the present embodiment, sharing is restricted to sharing between the pixel circuits 2002a which are not accessed at the same time.

According to the third embodiment, the two pixel circuits 2002a share the source diffusion layer electrode 2210a of the amplification transistor, and accordingly, the two pixel circuits 2002a are disposed mutually conversely (see FIG. 10A). The area of the source diffusion layer of the amplification transistor can be reduced to a half as compared with the case of not sharing the source diffusion layer 2210a of the amplification transistor in the first embodiment.

Also, the most load along with the pixel group GRP 2001 as viewed from the vertical signal line VSGNL is the diffusion layer capacity of the amplification transistor 2027b. With a layout example of the pixel group GRP 2001 according to the first embodiment, the two pixel circuits 2002a share the source diffusion layer 2210a of the amplification transistor, and the source electrode 2211a of the amplification transistor and the vertical signal line VSGNL are connected with the same signal line 2031. Thus, the two pixel circuits 2002a share the same vertical signal line VSGNL, and accordingly, the load of the vertical signal line VSGNL at the time of signal readout can be reduced.

Note however, the source diffusion layer 2210a of the same amplification transistor is shared between the two pixel circuits 2002a, so sharing is restricted to sharing between the pixel circuits 2002a which are not accessed at the same time.

As described above, according to the third embodiment, the load to the vertical signal line connected to each pixel circuit is reduced.

Next, the second layout example of the pixel circuit 2002a will be described as a fourth embodiment.

Fourth Embodiment

Figure 13A:
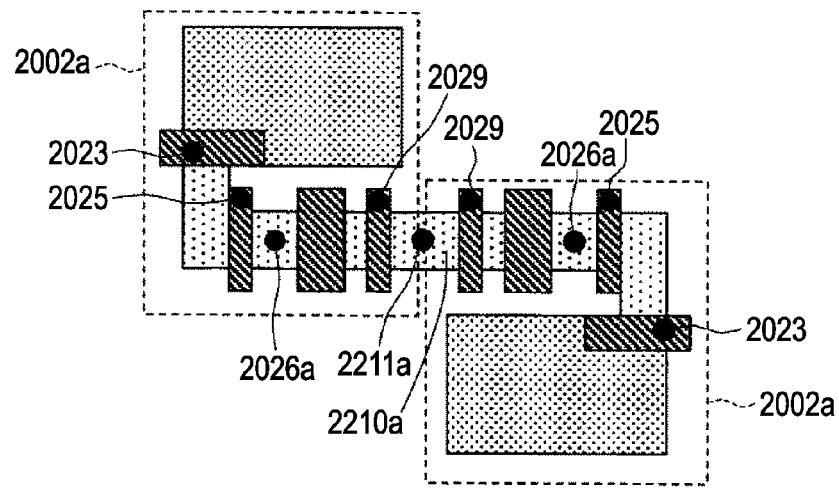
FIGS. 13A and 13B are diagrams illustrating one layout example of a pixel circuit according to a fourth embodiment of the present invention.
Figure 13B:
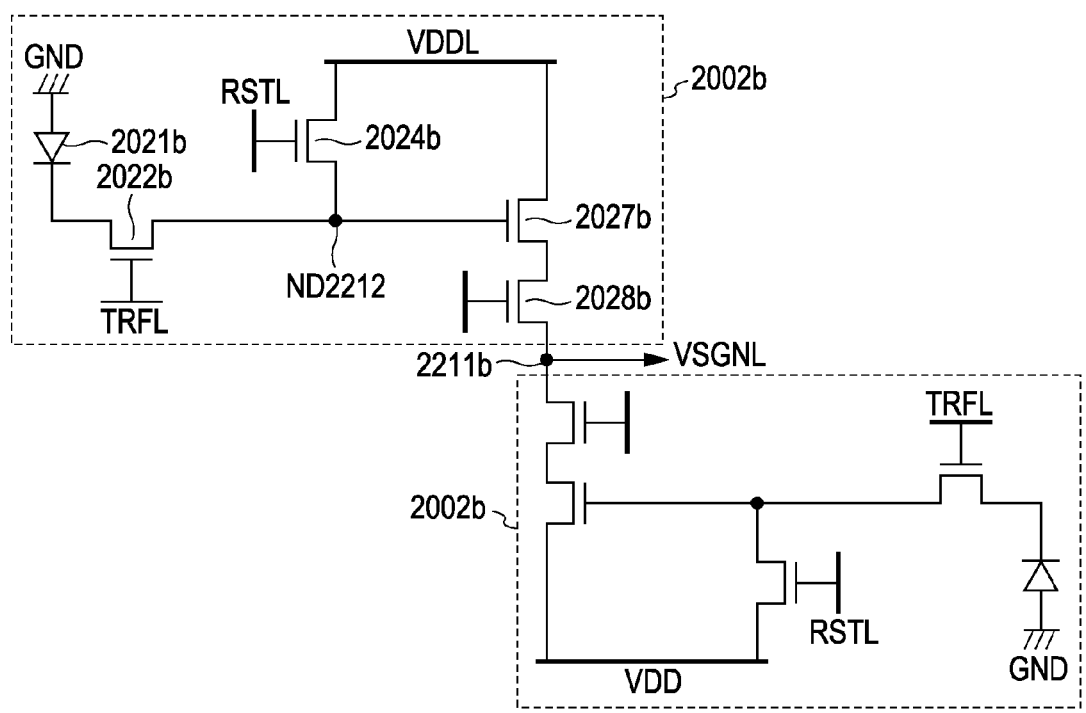

Description will be made below regarding a layout example of a pixel circuit according to a fourth embodiment of the present invention. FIGS. 13A and 13B are diagrams illustrating one layout example of a pixel circuit according to the fourth embodiment of the present invention.

The pixel group GRP 2002 shown in FIG. 13A is one example wherein the two pixel circuits shown in FIG. 9A share the source diffusion layer 2210a of the amplification transistor, and the two pixel circuits 2002a are disposed in a diagonal direction as to the source diffusion layer 2210a of the amplification transistor. FIG. 13B is an equivalent circuit diagram of the pixel group GRP 2002 shown in FIG. 13A.

The pixel group GRP 2002 shown in FIG. 13B is one example wherein the two unit equivalent circuits 2002b shown in FIG. 13B share the signal output terminal 2211b, and are disposed in a diagonal direction as to the signal output terminal 2211b.

Figure 14:
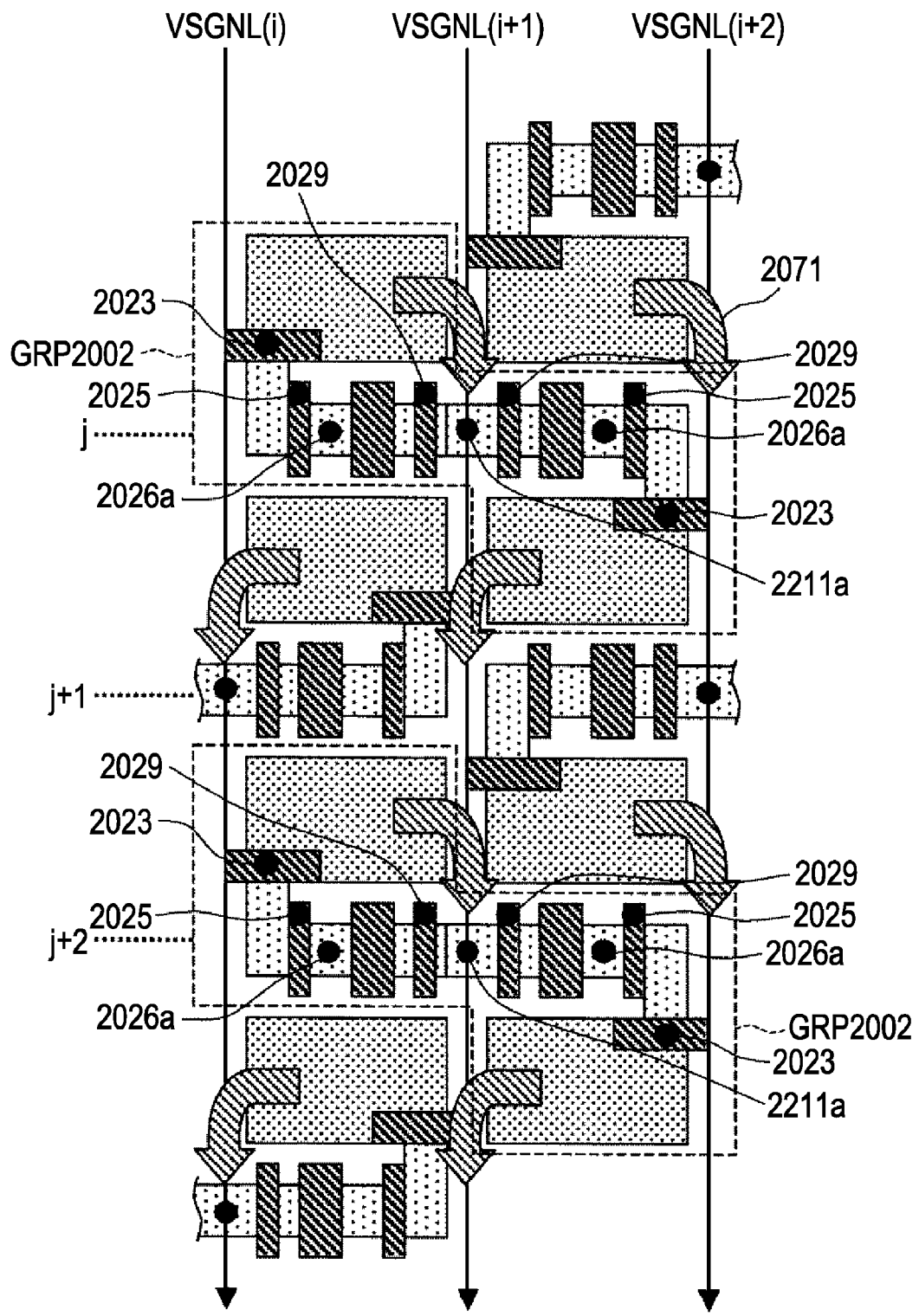
FIG. 14 is a diagram where the pixel block group GRP2002 shown in FIG. 13A is arrayed in a matrix shape along a vertical signal line VSGNL.

FIG. 14 is a diagram wherein the pixel group GRP 2002 shown in FIG. 13A is arrayed in a matrix shape along the vertical signal line VSGNL. With the pixel group GRP 2002, each of the transfer gate electrodes 2023 is connected to the transfer selection line TRFL, each of the reset gate electrodes 2025 is connected to the reset line RSTL, each of the power electrodes 2026a is connected to the potential line VDDL, and each of the selection gate electrodes 2029 is connected to the selection line SELL. The source electrode 2211a of the amplification transistor of the pixel group GRP 2002 is connected with the vertical signal line VSGNL by being shifted at each row, as shown in FIG. 14.

In FIG. 14, if we count rows at a position where the source electrode 2211a of the amplification transistor is disposed, the source electrode 2211a of the amplification transistor of the j'th row is connected to the vertical signal line VSGNL(i+1), the source electrode 2211a of the amplification transistor of the (j+1)'th row is connected to the vertical signal line VSGNL(i) or vertical signal line VSGNL(i+1), and the source electrode 2211a of the amplification transistor of the (j+2)'th row is connected to the vertical signal line VSGNL(i+1).

An arrow 2071 represents a signal readout direction from the source electrode 2211a of the amplification transistor to the vertical signal lines VSGNL(i) through VSGNL(i+2).

With regard to FIG. 14, the description regarding the transfer selection line TRFL, reset line RSTL, potential line VDDL, and selection line SELL will be omitted. With the pixel group GRP 2002 according to the fourth embodiment, a process wherein the signal charge generated at the photodiode PD 2021a is converted into a voltage signal, and the voltage signal is output to the vertical signal line VSGNL, is the same as that in the third embodiment, so description thereof will be omitted.

It should be noted however, that the above-mentioned process is restricted to sharing between the pixel circuits 2002a which are not accessed at the same time.

Incidentally, with the layout of the pixel group GRP 2002 according to the fourth embodiment, the source electrode 2211a of the amplification transistor is connected to a different vertical signal line VSGNL depending on the odd row or even row of the pixel array unit. Accordingly, at the time of signal readout, an output signal is output to a different vertical signal line VSGNL for each pixel group GRP 2002.

Specifically, the signal output from the pixel group GRP 2002 of the j'th row is output to the vertical signal line VSGNL(i+1), the signal output from the pixel group GRP 2002 of the (j+1)'th row is output to the vertical signal line VSGNL(i) and vertical signal line VSGNL(i+1), and the signal output from the pixel group GRP 2002 of the (j+2)'th row is output to the vertical signal line VSGNL(i+1).

Accordingly, for example, the vertical signal line VSGNL(i+1) is selected by the horizontal scan circuit 2012 (the point-in-time at this time is assumed to be point-in-time t), and at the time of the signal readout of the pixel group GRP 2002 connected to the vertical signal line VSGNL(i+1), only the signals from the pixel groups GRP 2002 of the j'th and (j+2)'th rows are read out, but the signal from the pixel group GRP 2002 of the (j+1)'th row is not read out.

The time when the signal from the pixel group GRP 2002 of the (j+1)'th row is read out is, for example, when the vertical signal line VSGNL(i) and vertical signal line VSGNL(i+2) are selected by the horizontal scan circuit 2012 time Δt ago or later from point-in-time t. At this time, the signal can be read out from the pixel group GRP 2002 of the (j+1)'th row.

Accordingly, the signal read out from the pixel group GRP 2002 to the vertical signal line VSGNL is shifted by only time Δt equivalent to one column worth wherein the vetical signal line VSGNL is selected.

As described above, with the imaging apparatus 2001 according to the fourth embodiment, it is necessary to adjust the time lag of a signal to be read out.

Next, description will be made regarding the timing adjusting unit 2016 configured to adjust the time lag of an output signal at the time of readout of an output signal by citing one configuration example with reference to FIG. 15.

Figure 15:
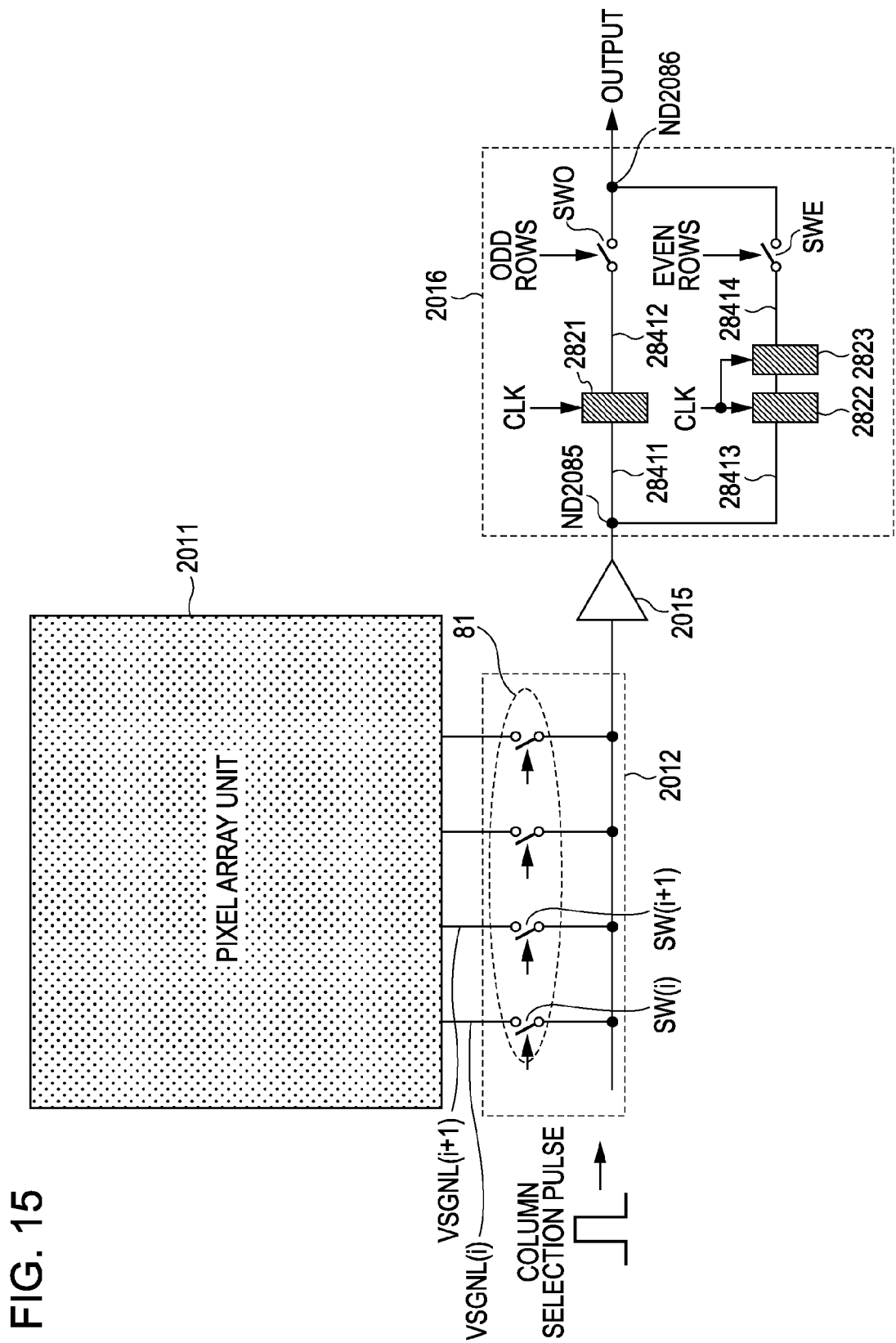
FIG. 15 is a diagram of one example for describing one configuration example and the operation thereof of a timing adjusting unit according to the fourth embodiment.

FIG. 15 is a diagram of one example for describing one configuration example of a timing adjusting unit according to the fourth embodiment, and the operation thereof.

The pixel array unit 2011 is connected to the horizontal scan circuit 2012 via the vertical signal line VSGNL(i).

The horizontal scan circuit 2012 includes a column selection switch group 2081, of which the input side is connected to the pixel array unit 2011, and the output side is connected to the input side of the analog-to-digital converter 2015.

Also, the horizontal scan circuit 2012 is controlled with a column selection pulse, the vertical signal line VSNGL(i) is selected by opening/closing the column selection switch group 2081, a signal is read out from the pixel array unit 2011, and the signal is output to the analog-to-digital converter 2015.

With the analog-to-digital converter 2015, the input side is connected to the output side of the horizontal scan circuit 2012, and the output side is connected to the input side of the timing adjusting unit 2016 via a node ND 2085. Also, the analog-to-digital converter 2015 converts the analog signal input from the horizontal scan circuit 2012 into a digital signal, and outputs this to the timing adjusting unit 2016.

With the timing adjusting unit 2016, the input side is connected to the output side of the analog-to-digital converter 2015 via the node ND 2085.

Next, description will be made regarding the internal configuration of the timing adjusting unit 2016 according to the fourth embodiment. The timing adjusting unit 2016 includes, for example, delay circuits 2821 through 2823, a row selection switch SWO, a row selection switch SWE, and signal lines 28411 through 28414.

With the delay circuit 2821, the input side is connected to the node ND 2085 via the signal line 28411, and the output side is connected to a first terminal of the row selection switch SWO via the signal line 28412.

With the delay circuit 2822, the input side is connected to the node ND 2085 via the signal line 28413, and the output side is connected to the input side of the delay circuit 2823.

With the delay circuit 2823, the input side is connected to the output side of the delay circuit 2822, and the output side is connected to a first terminal of the row selection switch SWE via the signal line 28414.

With the row selection switch SWO, the first terminal is connected to the output side of the delay circuit 2821 via the signal line 28412, and the second terminal is connected to a node ND 2086.

With the row selection switch SWE, the first terminal is connected to the output side of the delay circuit 2823 via the signal line 28414, and the second terminal is connected to the node ND 2086.

The delay circuits 2821 through 2823 are controlled with a clock CLK generated by the timing generator 2017, and output an input signal with delay of time $\Delta t$.

The delay circuits 2822 and 2823 are serially connected, so the signal is delayed by $2\Delta t$ in total until a signal is input to the delay circuit 2822, and is output from the delay circuit 2823.

The row selection switch SWO is turned on (conductive state) in the event of a signal being output from the pixel circuit 2002(a) (see FIG. 13A) disposed on an odd row of the pixel array unit 2011.

The row selection switch SWE is turned on (conductive state) in the event of a signal being output from the pixel circuit 2002(a) (see FIG. 13A) disposed on an even row of the pixel array unit 2011.

Note that with the timing adjusting unit 2016, the delay circuits 2821 and 2822 are configured to perform time adjusting such as blanking time or the like, and for example, in the event that an even row is delayed by time $\Delta t$ as to an odd row, a circuit configuration including the delay circuit 2823 alone may be employed as an embodiment.

Next, description will be made regarding the operation of the timing adjusting unit 2016 according to the fourth embodiment.

In the following description, as shown in FIG. 14, let us say that the source electrode 2211a of the amplification transistor arrayed on an odd row is connected to the vertical signal line VSGNL(i+1), and the source electrode 2211a of the amplification transistor arrayed on an even row is connected to the vertical signal line VSGNL(i) or vertical signal line VSGNL(i+2).

<Step ST1>

The horizontal scan circuit 2012 selects the column selection switch SW(i) of the i'th column using a column selection pulse, and the vertical signal line VSGNL(i) of the i'th column is changed to a conductive state.

<Step ST2>

The signal is read out from the source electrode 2211a of the amplification transistor of the (j+1)'th row connected to the vertical signal line VSGNL(i), and this signal is input to the analog-to-digital converter 2015.

<Step ST3>

The timing adjusting unit 2016 turns off the row selection switch SWO, and turns on the row selection switch SWE.

<Step ST4>

The signal output from the analog-to-digital converter 2015 is input to each of the delay circuits 2821 through 2823.

<Step ST5>

The row selection switch SWE is ON, so the delay circuits 2822 and 2823 delay an input signal by time $2\Delta t$, and output the signal via the node ND 2086.

The row selection switch SWO is OFF, so the signal input to the delay circuit 2821 is not output to the node ND 2086.

<Step ST6>

The horizontal scan circuit 2012 selects the column selection SW(i+1) of the (i+1)'th column using a column selection pulse, and the vertical signal line VSGNL(i+1) of the (i+1)'th column is changed to a conductive state.

<Step ST7>

The signals are read out from the source electrode 2211a of the amplification transistor of the (j)'th row and (j+2)'th row connected to the vertical signal line VSGNL(i+1), and the signals are input to the analog-to-digital converter 2015.

<Step ST8>

The timing adjusting unit 2016 turns off the row selection switch SWE, and turns on the row selection switch SWO.

<Step ST9>

The signal output from the analog-to-digital converter 2015 is input to each of the delay circuits 2821 through 2823.

<Step ST10>

The row selection switch SWE is OFF, so the signals input to the delay circuits 2822 and 2823 are not output to the node ND 2086.

The row selection switch SWO is ON, so the delay circuit 2821 delays an input signal by time $\Delta t$, and outputs the signal via the node ND 2086.

<Step ST11>

The processing returns to Step ST1, where the same operation is performed. The timing adjusting unit 2016 executes the above-mentioned operation of Step ST1 through Step ST11, whereby even in the event that the source electrode 2211a of the amplification transistor is connected to a different vertical signal line VSGNL depending on whether the row connected thereto is an odd row or even row, the time lag wherein a signal is output to the vertical signal line VSGNL can be corrected.

As described above, according to the present embodiment, the load to the vertical signal line connected to each pixel circuit is reduced.

Next, a fourth configuration example of the timing adjusting unit 2016 according to the fourth embodiment will be described as a fifth embodiment according to the present invention.

Fifth Embodiment

Figure 16:
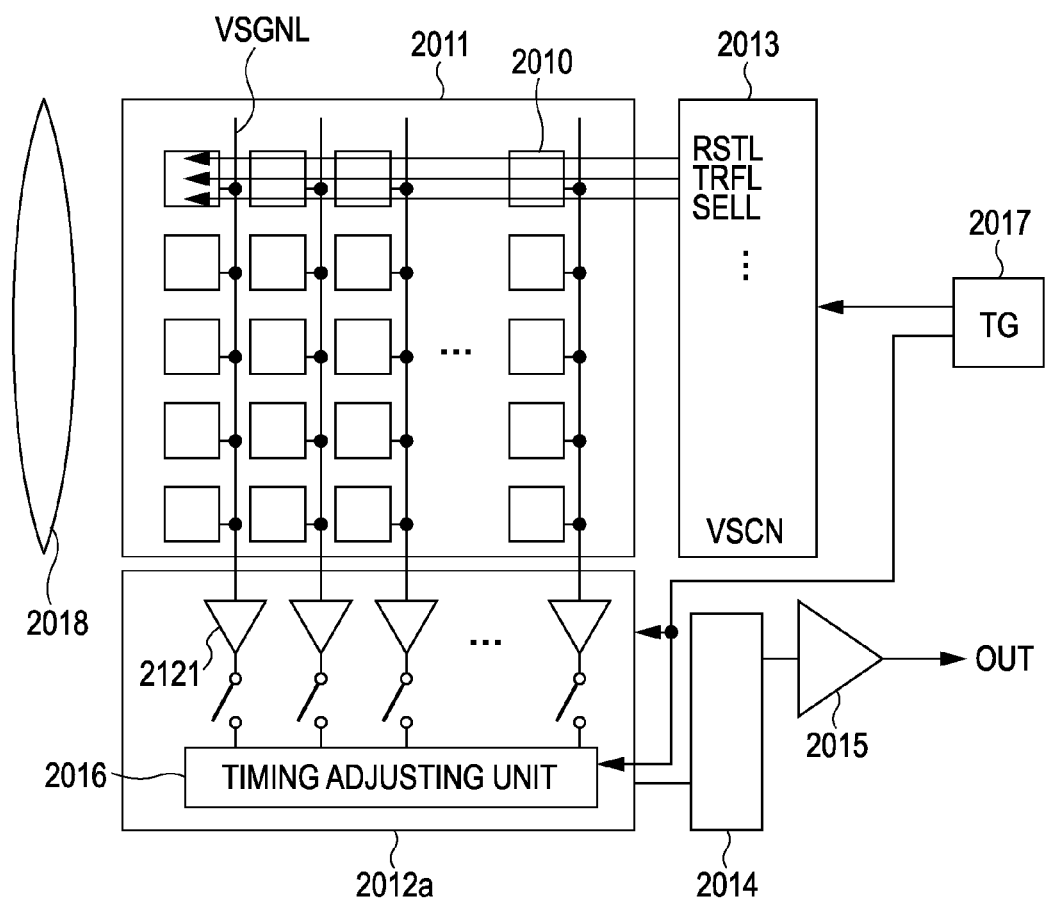
FIG. 16 is a block diagram illustrating one configuration example of principal units of an imaging apparatus according to a fifth embodiment of the present invention.

The fifth embodiment of the present invention will be described below with reference to the drawings. FIG. 16 is a block diagram illustrating one configuration example of principal units of an imaging apparatus according to the fifth embodiment of the present invention.

The present imaging apparatus 2001*a* includes a pixel circuit 2010, a pixel array unit 2011, a horizontal scan circuit (HSCN) 2012*a*, an amplifier 2121, a vertical scan circuit (VSCN) 2013, a signal processing circuit 2014, an analog-to-digital converter (A/D) 2015, a timing adjusting unit 2016*a*, a timing generator TG (2017), and a lens 2018.

The timing adjusting unit 2016*a* is disposed in the inside of the horizontal scan circuit 2012*a*, delays an analog signal input from the pixel array unit 2011 via the amplifier 2121 by a predetermined time in accordance with a predetermined procedure, and outputs this to the signal processing circuit 2014. Description will be made later regarding the operation of the timing adjusting unit 2016.

The present imaging apparatus 2001*a* has the same configuration as those in the third embodiment and the fourth embodiment according to the present invention except for the placement of the timing adjusting unit 2016*a*, so description thereof will be omitted.

Also, the fifth embodiment employs the same arrangement as the layout of the pixel group GRP 2002 according to the second embodiment (see FIGS. 13 and 14), so description will be omitted regarding the operation of the pixel group GRP 2002 and the layout method thereof.

Figure 17:
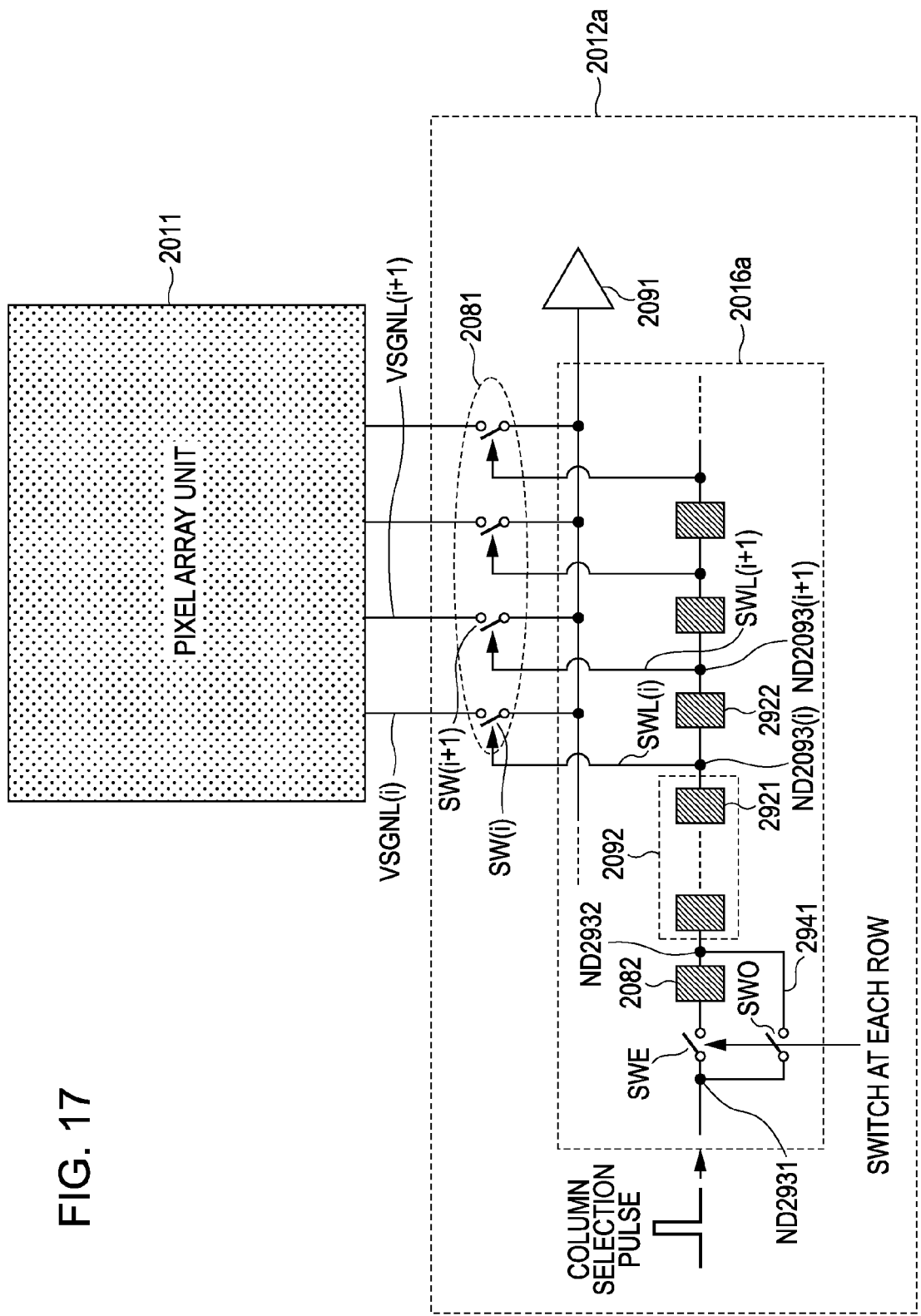
FIG. 17 is a diagram of one example for describing one configuration example and the operation thereof of a timing adjusting unit according to the fifth embodiment.

FIG. 17 is a diagram of one example for describing one configuration example of the timing adjusting unit according to the fifth embodiment and the operation thereof.

The pixel array unit 2011 is connected to the horizontal scan circuit 2012 via the vertical signal line VSGNL(i).

The horizontal scan circuit 2012*a* includes a column selection switch group 2081, of which the input side is connected to the pixel array unit 2011, and the output side is connected to the input side of the signal processing circuit 2014 (see FIG. 16) via an output buffer 2091.

The column selection switch group 2081 is disposed between the output side of the pixel array unit 2011 and the input side of the timing adjusting unit 2016*a*.

Also, the horizontal scan circuit 2012*a*, which is controlled with a column selection pulse, selects the vertical signal line VSGNL(i) by opening/closing the column selection switch group 2081, reads out a signal from the pixel array unit 2011, and outputs the signal to the signal processing circuit 2014.

With the timing adjusting unit 2016*a* disposed in the inside of the horizontal scan circuit 2012*a*, the input side is connected with the output side of the timing generator 2017 (see FIG. 16), and the output side is connected with the input terminal of the output buffer 2091.

Next, description will be made regarding the internal configuration of the timing adjusting unit 2016*a* according to the fifth embodiment.

The timing adjusting unit 2016*a* includes, for example, a delay circuit 2082, a delay circuit group 2092, a row selection switch SWO, a row selection switch SWE, a switch control signal line SWL(i), and a signal line 2041.

With the row selection switch SWO, a first terminal is connected to a node ND 2931, and a second terminal is connected to a node ND 2932 via the signal line 2941.

With the row selection switch SWE, a first terminal is connected to the node ND 2931, and a second terminal is connected to the input side of the delay circuit 2082.

With the delay circuit 2082, the input side is connected to the second terminal of the row selection switch SWE, and the output side is connected to the node ND 2932.

The delay circuit group 2092 includes multiple delay circuits 2921, and is connected to between the node ND 2932 and a node ND 2093(*i*). Note that the delay circuit group 2092 performs time adjusting such as blanking or the like, so is made up of an arbitrary number of delay circuits 2921.

A delay circuit 2922 is disposed between the node ND 2093(i) and the node ND 2093(i+1). Note that the delay circuit 2922 performs time adjusting such as blanking or the like.

The switch control signal line SWL(i) is connected to between a column selection switch SW(i) and the node ND 2093(*i*). The delay circuit 2082 delays an input signal by time $\Delta t$, and outputs this. The delay circuit 2921 delays an input signal by time $\Delta t1$, and outputs this. The delay circuit 2922 delays an input signal by time $\Delta t2$, and outputs this. The delay circuit group 2092 delays an input signal by time $\Delta t1n$, and outputs this.

The row selection switch SWO of which the opening/closing operation is controlled by the timing generator 2017 (see FIG. 16) is turned on in the case of an odd-column selection pulse being input. The row selection switch SWE of which the opening/closing operation is controlled by the timing generator 2017 (see FIG. 16) is turned on in the case of an even-column selection pulse being input.

Next, description will be made regarding the operation of the timing adjusting unit 2016*a* according to the fifth embodiment. In the following description, let us say that the source electrode 2211*a* of the amplification transistor arrayed on an odd row is connected to the vertical signal line VSGNL(i+1), and the source electrode 2211*a* of the amplification transistor arrayed on an even row is connected to the vertical signal line VSGNL(i) or vertical signal line VSGNL(i+2).

First, a signal is read out from the source electrode 2211*a* of the amplification transistor connected to the vertical signal line VSGNL(i).

<Step ST12>

The source electrode 2211*a* of the amplification transistor disposed on an even row is connected to the vertical signal line VSGNL(i), so the row selection switch SWE is turned on, and the row selection switch SWO is turned off. A column selection pulse, which selects the i'th column, is input to the timing adjusting unit 2016*a*.

<Step ST13>

The row selection switch SWE is ON, so the column selection pulse is input to the delay circuit group 2092 via the delay circuit 2082, subjected to delay of time $\Delta t+\Delta t1n$, and then output to the node ND 2093(*i*).

<Step ST14>

The column selection pulse is propagated to the switch control signal line SWL(i), and the column selection switch SW(i) is turned on. In this case, a signal is read out from the source electrode 2211*a* of the amplification transistor of the even row connected to the vertical signal line VSGNL(i), and the readout signal is output to the output buffer 2091. Next, a signal is read out from the source electrode 2211a of the amplification transistor connected to the vertical signal line VSGNL(i+1).

<Step ST15>

The source electrode 2211a of the amplification transistor disposed on an odd row is connected to the vertical signal line VSGNL(i+1), so the row selection switch SWE is turned off, and the row selection switch SWO is turned on. A column selection pulse, which selects the (i+1)'th column, is input to the timing adjusting unit 2016a.

<Step ST16>

The row selection switch SWE is ON, so the column selection pulse is input to the delay circuit group 2092 via the node ND 2932, subjected to delay of time Δt1n, and then output to the node ND 2093(i).

<Step ST17>

The column selection pulse is delayed by time Δt2 at the delay circuit 2922, propagated to the switch control signal SWL(i+1), and the column selection switch SW(i+1) is turned on. In this case, a signal is read out from the source electrode 2211a of the amplification transistor of the odd row connected to the vertical signal line VSGNL(i+1), and the readout signal is output to the output buffer 2091.

The timing adjusting unit 2016a executes the above-mentioned operation of Step ST12 through Step ST17, whereby even in the event that the source electrode 2211a of the amplification transistor is connected to a different vertical signal line VSGNL depending on whether the row connected thereto is an odd row or even row, the time lag wherein a signal is output to the vertical signal line VSGNL can be corrected.

As described above, according to the present embodiment, the load to the vertical signal line connected to each pixel circuit is reduced.

Next, a third configuration example of a timing adjusting unit 2016b according to the fourth embodiment will be described as a sixth embodiment according to the present invention.

Sixth Embodiment

The sixth embodiment of the present invention will be described with reference to the drawings. The principal units of the imaging apparatus 2001a according to the sixth embodiment of the present invention are the same as those in the fifth embodiment, so description thereof will be omitted.

Also, with the sixth embodiment, the pixel group GRP 2002 has the same arrangement as the layout according to the fourth embodiment (see FIGS. 13 and 14), so description will be omitted regarding the operation of the pixel group 2002 and the layout method.

FIG. 18 is a diagram of one example for describing one configuration example of a timing adjusting unit according to the sixth embodiment, and the operation thereof.

The configurations other than a timing adjusting unit 2016b according to the sixth embodiment are the same as those in the fifth embodiment, so description thereof will be omitted.

Next, description will be made regarding the internal configuration of the timing adjusting unit 2016b according to the sixth embodiment.

The timing adjusting unit 2016b includes, for example, a delay circuit 2821, a row selection switch SWR(i), a delay circuit 2822, and a switch control signal line SWL(i).

The delay circuit 2822 includes multiple delay circuits 2821, and is serially connected to between a node ND 2111 and a node ND 2011(i). Note that the delay circuit 2822 performs time adjusting such as blanking or the like, so is made up of an arbitrary number of delay circuits 2821.

A delay circuit 2082(i) is connected to between a node ND(i) and a node ND(i+1). The row selection switch SWR(i) is connected to the switch control signal line SWL(i), and changed to the node ND(i) side or the node ND(i+1) side. The switch control signal line SWL(i) is connected to the column selection switch SW(i) and the row selection switch SWR(i).

The delay circuit 2821 delays an input signal by time Δt, and outputs this. The delay circuit 2822 delays an input signal by time Δt1n, and outputs this. The row selection switch SWR(i) of which the opening/closing operation is controlled by the timing generator 2017 (see FIG. 16) is changed to a node NDb side in the case of delaying a signal by time Δt, and changed to a node NDa side in the case of not delaying a signal by time Δt.

Next, description will be made regarding the operation of the timing adjusting unit 2016b according to the sixth embodiment. In the following description, let us say that the source electrode 2211a of the amplification transistor arrayed on an odd row is connected to the vertical signal line VSGNL(i+1), and the source electrode 2211a of the amplification transistor arrayed on an even row is connected to the vertical signal line VSGNL(i) or vertical signal line VSGNL(i+2).

First, a signal is read out from the source electrode 2211a of the amplification transistor connected to the vertical signal line VSGNL(i).

<Step ST18>

The source electrode 2211a of the amplification transistor disposed on an even row is connected to the vertical signal line VSGNL(i), so the row selection switch SWR(i) is changed to the node NDa side. A column selection pulse, which selects the i'th column, is input to the timing adjusting unit 2016b.

<Step ST19>

The row selection switch SWR(i) is connected to the node NDa side, so the column selection pulse is input to the delay circuit 2822 via a node ND 2111, subjected to delay of time Δt1n, and then output to a node ND 2011(i).

<Step ST20>

The column selection pulse is propagated to the switch control signal line SWL(i), and the column selection switch SW(i) is turned on. In this case, a signal is read out from the source electrode 2211a of the amplification transistor of the even row connected to the vertical signal line VSGNL(i), and the readout signal is output to the output buffer 2091.

Next, a signal is read out from the source electrode 2211a of the amplification resistor connected to the vertical signal line VSGNL(i+1).

<Step ST21>

The source electrode 2211a of the amplification transistor disposed on an odd row is connected to the vertical signal line VSGNL(i+1), so the row selection switch SWR(i) is changed to the node NDb side, and the row selection switch SWR(i+1) is changed to the node NDc side. A column selection pulse, which selects the (i+1)'th column, is input to the timing adjusting unit 2016b.

<Step ST22>

The row selection switch SWR(i) is connected to the node NDb side, so the column selection pulse is input to the delay circuit 2082(i), subjected to delay of time Δt, and output to the node ND 2011(i+1).

<Step ST23>

The column selection pulse is propagated to the switch control signal line SWL(i+1), and the column selection switch SW(i+1) is turned on. In this case, a signal is read out from the source electrode 2211a of the amplification transistor of the odd row connected to the vertical signal line VSGNL(i+1), and the readout signal is output to the output buffer 2091.

The timing adjusting unit 2016b executes the above-mentioned operation of Step ST18 through Step ST23, whereby even in the event that the source electrode 2211a of the amplification transistor is connected to a different vertical signal line VSGNL depending on whether the row connected thereto is an odd row or even row, the time lag wherein a signal is output to the vertical signal line VSGNL can be corrected.

As described above, according to the present embodiment, the load to the vertical signal line connected to each pixel circuit is reduced.

Also, even in the event of an arrangement wherein one amplification transistor is shared with multiple optical elements or pixel circuits, or the like, and the source diffusion layer 2210a of the amplification transistor is shared with pixel blocks, the load to the vertical signal line VSGNL can be reduced. Description will be made regarding this as a seventh embodiment according to the present invention.

Seventh Embodiment

The seventh embodiment of the present invention will be described with reference to the drawings.

FIG. 19 is a diagram illustrating one configuration example of a pixel block according to the seventh embodiment. FIG. 19 illustrates a CMOS imaging apparatus as one example.

A pixel block 2120 in FIG. 19 includes photodiode units 21201 through 21204 including a photodiode PD 2021b, and a transfer transistor TTR 2022b, a reset transistor RTR 2024b, a selection transistor STR 2028b, an amplification transistor ATR 2027b, and a signal output terminal 2211b. The photodiode units 21201 through 21204 are each connected to a node ND 2212.

With the amplification transistor 2027b, the drain is connected to the source of the selection transistor 2028b, the source is connected to a potential line VDDL, and the gate is connected to the node ND 2212.

With the selection transistor 2028b, the drain is connected to the potential line VDDL, the source is connected to the drain of the amplification transistor 2027b, and the gate is connected to a selection line SELL.

The signal output terminal 2211b is connected to the source of the amplification transistor 2027b and the vertical signal line VSGNL.

With the seventh embodiment of the present invention, the photodiode units 21201 through 21204 are connected to the single node ND 2212. Note that the operation of the pixel block 2120 according to the seventh embodiment is the same as that of the equivalent circuit 2002b of the pixel circuit 2002a shown in FIG. 9A, so description thereof will be omitted.

Figure 20A:
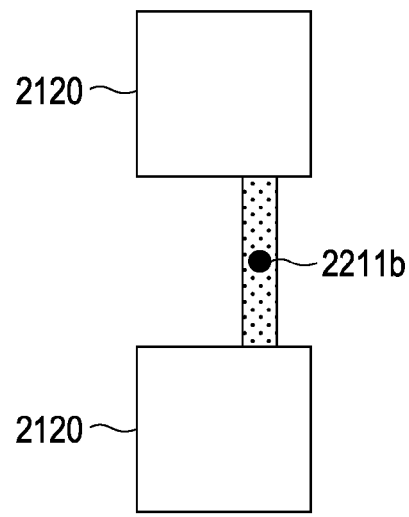
FIGS. 20A and 20B are diagrams illustrating one layout example of a pixel circuit according to the seventh embodiment of the present invention.
Figure 20B:
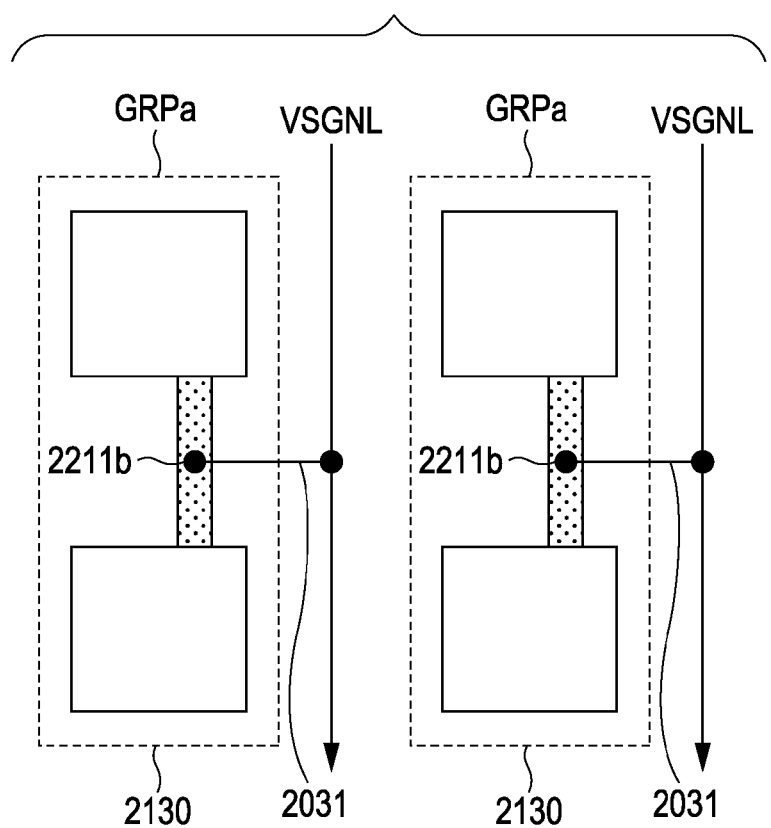

Next, description will be made regarding a layout example of the pixel block 2120 according to the seventh embodiment of the present invention. FIGS. 20A and 20B are diagrams illustrating a layout example of a pixel circuit according to the seventh embodiment of the present invention.

The pixel block group GRPa shown in FIG. 20A is one example wherein the two pixel blocks 2120 illustrated in FIG. 19 share a signal output terminal 2211b, and the two pixel blocks 2120 are disposed oppositely as to the signal output terminal 2211b.

FIG. 20B is a layout wherein the pixel block group GRPa illustrated in FIG. 20A is arrayed in a matrix shape along the vertical signal line VSGNL.

The gate of each transfer transistor TRT 2022b is connected to the transfer selection line TRFL, the gate of each reset transistor RTR 2024b is connected to the reset line RSTL, the drain of each reset transistor 2024b and the drain of each selection transistor STR 2028b are connected to the potential line VDDL, the gate of each selection transistor STR 2028b is connected to the selection line SELL, and the signal output terminal 2211b and the vertical signal line VSGNL are each connected with a signal line 2031.

With regard to FIGS. 20A and 20B, the descriptions of the transfer selection signal TRFL, reset line RSTL, potential line VDDL, and selection line SELL are omitted.

With regard to the layout of the pixel block group GRPa according to the seventh embodiment as well, the source diffusion layer 2120a of a single amplification transistor can be shared with multiple pixel blocks in the same way as the third embodiment according to the present invention, and the same advantage can be obtained. Detailed description thereof is the same as that in the third embodiment, and accordingly will be omitted.

Note however, the two pixel blocks 2120 share the source diffusion layer 2210a of the same amplification transistor, so sharing is restricted to sharing between the pixel blocks 2120 which are not accessed at the same time.

As described above, according to the present embodiment, the load to the vertical signal line connected to each pixel block is reduced.

Next, a second layout example of the pixel block 2120 will be described as an eighth embodiment.

Eighth Embodiment

Figure 21A:
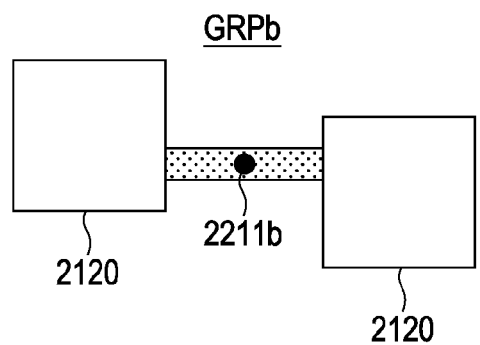
FIGS. 21A and 21B are diagrams illustrating one layout example of a pixel circuit according to an eighth embodiment of the present invention.
Figure 21B:
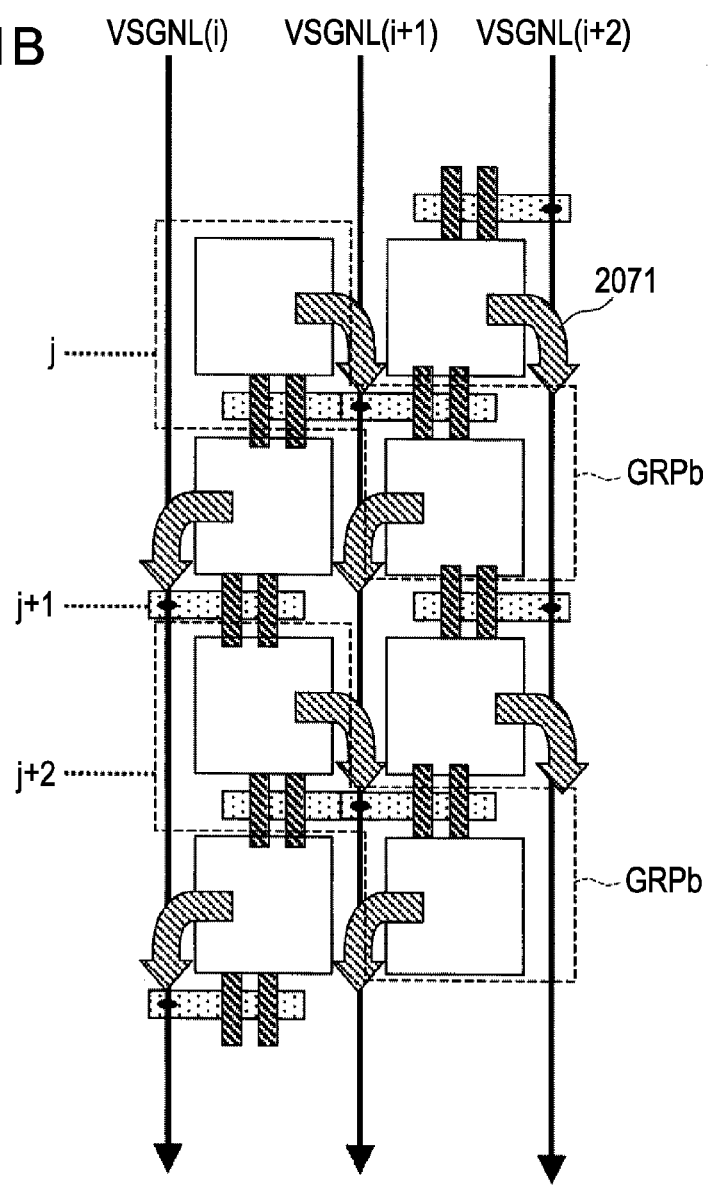

FIGS. 21A and 21B are diagrams illustrating one layout example of a pixel circuit according to the eighth embodiment of the present invention.

The pixel block group GRPb shown in FIG. 21A is one example wherein the two pixel blocks 2120 illustrated in FIG. 20A share a signal output terminal 2211b, and the two pixel blocks 2120 are disposed so as to face to each other in a diagonal direction as to the signal output terminal 2211b. FIG. 21B is a layout wherein the pixel block group GRPb illustrated in FIG. 21A is arrayed in a matrix shape along the vertical signal line VSGNL.

The gate of each transfer transistor TRT 2022b is connected to the transfer selection line TRFL, the gate of each reset transistor RTR 2024b is connected to the reset line RSTL, the drain of each reset transistor 2024b and the drain of each selection transistor STR 2028b are connected to the potential line VDDL, the gate of each selection transistor STR 2028b is connected to the selection line SELL, and the signal output terminal 2211b and the vertical signal line VSGNL are each connected with a signal line 2031.

With regard to FIGS. 21A and 21B, the descriptions of the transfer selection line TRFL, reset line RSTL, potential line VDDL, and selection line SELL are omitted.

The signal output terminal 2211b is connected with the vertical signal line VSGNL by being shifted at each row, as shown in FIG. 21B.

In FIG. 21B, if we count rows at a position where the signal output terminal 2211b is disposed, the signal output terminal 2211b of the j'th row is connected to the vertical signal line VSGNL(i+1), the signal output terminal 2211b of the (j+1)'th row is connected to the vertical signal line VSGNL(i) or vertical signal line VSGNL(i+1), and the signal output terminal 2211b of the (j+2)'th row is connected to the vertical signal line VSGNL(i+1).

An arrow 2071 represents a signal readout direction from the signal output terminal 2211b to the vertical signal lines VSGNL(i) through VSGNL(i+2), wherein signal charge generated at the photodiode PD 2021b is transferred to the amplification transistor ATR 2027b.

With regard to the layout of the pixel block group GRPb according to the eighth embodiment as well, a single amplification transistor can be shared with multiple pixel blocks in the same way as the fourth embodiment according to the present invention, and the same advantage can be obtained.

It should be noted however, that with the eighth embodiment according to the present invention, the two pixel blocks 2120 share the same vertical signal line VSGNL, so sharing is restricted to sharing between the pixel blocks 2120 which are not accessed at the same time.

Also, the present embodiment causes time lag regarding the output signal from the pixel array unit 2011, as with the fourth embodiment. Therefore, with the present embodiment, the timing adjusting unit 2016 is provided. The configuration and operation thereof are the same as those in the fourth embodiment, the description of the timing adjusting unit 2016 will be omitted.

As described above, according to the present embodiment, the load to a vertical signal line connected to each pixel block is reduced.

Ninth Embodiment

The present embodiment is an embodiment obtained by replacing the timing adjusting unit 2016 according to the eighth embodiment with the timing adjusting unit 2016a according to the fifth embodiment.

Thus, with the present embodiment, the same advantage as that in the fifth embodiment can be obtained, and consequently, the load to the vertical signal line connected to each pixel block is reduced.

Tenth Embodiment

The present embodiment is an embodiment obtained by replacing the timing adjusting unit 2016 according to the eighth embodiment with the timing adjusting unit 2016b according to the sixth embodiment.

Thus, with the present embodiment, the same advantage as that in the sixth embodiment can be obtained, and consequently, the load to the vertical signal line connected to each pixel block is reduced.

Note that with regard to the pixel blocks according to the seventh embodiment through tenth embodiment, the same advantages as those in the embodiments of the present invention can be obtained by employing an arbitrary circuit configuration as long as the configuration shares the source diffusion layer 2210a of the amplification transistor.

Also, as for a layout method of a pixel circuit or pixel block, for example, the same advantages as those of the embodiments of the present invention can be obtained even in the event of employing a honeycomb pixel array or the like.

As described above, with the third embodiment through tenth embodiment according to the present invention, the present imaging apparatus shares a source of an amplification transistor between pixel circuits or pixel blocks which are not accessed at the same time. Therefore, with the embodiments according to the present invention, the load to a vertical signal line connected to each pixel circuit or each pixel block is reduced.

Also, a high-speed-driven imaging apparatus can be obtained whereby the transition time of a readout signal is reduced, and increase in the number of pixels can be handled. Further, the capacity of the diffusion layer of an amplification transistor making up a pixel circuit is reduced, whereby signal coupling with the board of an imaging device can be suppressed, and the image deterioration of an imaging apparatus can be prevented.

Note that reference numeral 2002a denotes a pixel circuit, 2021a and 2021b denote photodiodes PD, 2022a denotes a transfer gate TRFG, 2023 denotes a transfer gate electrode, 2024a denotes a reset gate RSTG, 2025 denotes a reset gate electrode, 2026a denotes a power electrode, 2027a denotes amplification gate AMPG, 2028a denotes a selection gate SELG, 2029 denotes a selection gate electrode, 2210a denotes an amplification source diffusion layer, 2211a and 2211b denote signal output terminals, 2022b denotes a transfer transistor TTR, 2024b denotes a reset transistor RTR, VDDL denotes a potential line, VDD denotes power voltage, 2027b denotes an amplification transistor ATR, 2028b denotes a selection transistor STR, VSGNL denotes a vertical signal line, TRFL denotes a transfer selection line, RSTL denotes a reset line, VDDL denotes a power potential line, SELL denotes a selection line, 2120 denotes a pixel block, 2011 denotes a pixel array unit, 2012 denotes a horizontal scan circuit HSCN, 2121 denotes an amplifier, 2013 denotes a vertical scan circuit VSCN, 2014 denotes a signal processing circuit, 2014 denotes a signal processing circuit, 2015 denotes an analog-to-digital converter (A/D), 2016 denotes a timing adjusting unit, and 2017 denotes a timing generator (TG).

Figure 22:
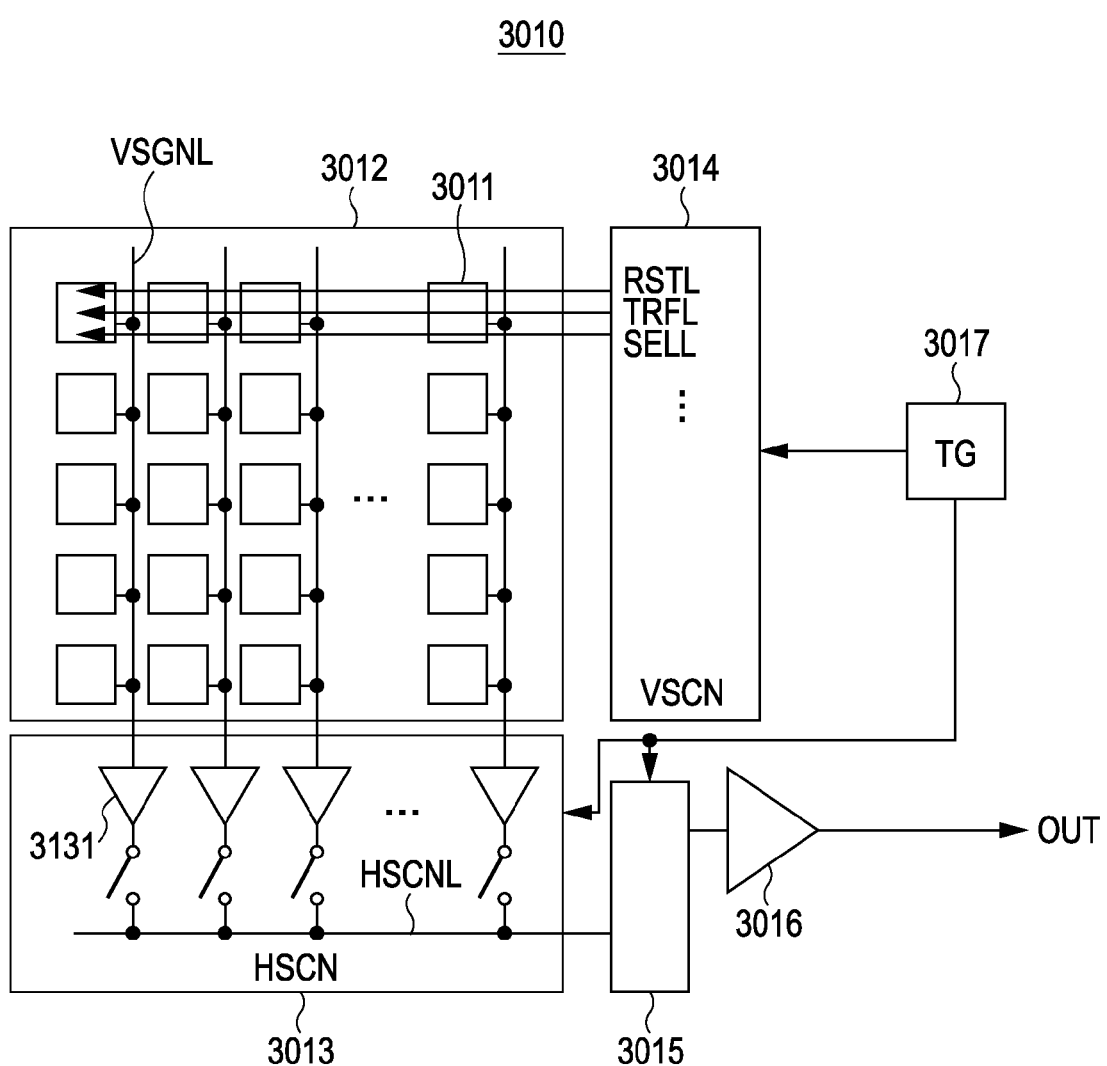
FIG. 22 is a block diagram illustrating one configuration example of principal units of an imaging apparatus according to an embodiment of the present invention.

FIG. 22 is a block diagram illustrating one configuration example of the principal units of an imaging apparatus according to an eleventh embodiment of the present invention. The imaging apparatus 3010 shown in FIG. 22 is made up of a pixel circuit (PIXEL) 3011, a pixel array unit (corresponding to the imaging area described above) 3012, a horizontal scan circuit (HSCN) 3013, an analog-to-digital converter (AD) 3131, a vertical scan circuit (VSCN) 3014, an analog front end unit 3015, an output buffer 3016, and a timing generator (TG) 3017.

With the pixel array unit 3012, for example, the pixel circuit 3011 including a photoelectric conversion unit is arrayed in a matrix shape with a predetermined array mode, the vertical scan circuit 3014 and each row of a pixel array are connected with the reset line RSTL, transfer selection line TRFL, and selection line SELL respectively, and the vertical signal line VSGNL is disposed in each column of the pixel array. Each pixel circuit 3011 of the pixel array unit 3012 is controlled by the vertical scan circuit 3014. Also, the photoelectric conversion unit (not shown) included in the pixel circuit 3011 converts incident light into an electric signal depending on the light quantity thereof, and outputs this electric signal to the horizontal scan circuit 3013 via the vertical signal line VSGNL.

The vertical scan circuit 3014 is connected to each pixel circuit 3011 of the pixel array unit 3012 with the reset line RSTL, transfer selection line TRFL, and selection line SELL, and also connected to the timing generator 3017 disposed in the outside of the vertical scan circuit 3014. The vertical scan circuit 3014 propagates a reset signal, a transfer signal, and a selection signal to the reset line RSTL, transfer selection line TRFL, and selection line SELL in sync with a predetermined clock from the timing generator 3017 respectively, thereby controlling the pixel circuits 3011.

Also, the horizontal scan circuit 3013 includes an analog-to-digital converter (simply referred to as an AD converter) 3131 connected to each vertical signal line VSGNL therein, which is connected to the analog front end unit 3015 with the horizontal signal line HSCNL, and also connected to the timing generator 3017. The horizontal scan circuit 3013 converts an input electric signal into a digital signal at the AD converter 3131, and outputs the digital signal to the analog front end unit 3015 via the horizontal signal line HSCNL, in sync with a predetermined clock from the timing generator 3017. Note that an amplifier can be employed instead of the AD converter 3131, depending on the configuration of the imaging apparatus.

With the analog front end unit 3015, the input side is connected to the horizontal scan circuit 3013 via the horizontal signal line HSCNL, and the output side is connected to the output buffer 3016. Also, the analog front end unit 3015 is connected to the timing generator 3017. The analog front end unit 3015 adjusts the signal level or the like of the digital signal input from the horizontal scan circuit 3013 to output this to the output buffer 3016 in sync with a predetermined clock from the timing generator 3017. Note that an amplifier or analog-to-digital converter or the like can be employed instead of the analog front end unit 3015, depending on the configuration of the imaging apparatus.

With the output buffer 3016, the input side is connected to the analog front end unit 3015, and the output side is, for example, a signal processing circuit, respectively. The output buffer 3016 outputs an input digital signal to the signal processing circuit.

Note that the timing generator 3017 generates a predetermined clock, and controls the horizontal scan circuit 3013, vertical scan circuit 3014, and analog front end unit 3015.

Next, description will be made regarding one configuration example of the imaging apparatus according to the eleventh embodiment with reference to a circuit diagram. Note that in the following description, a CMOS imaging apparatus is shown as one example.

Figure 23:
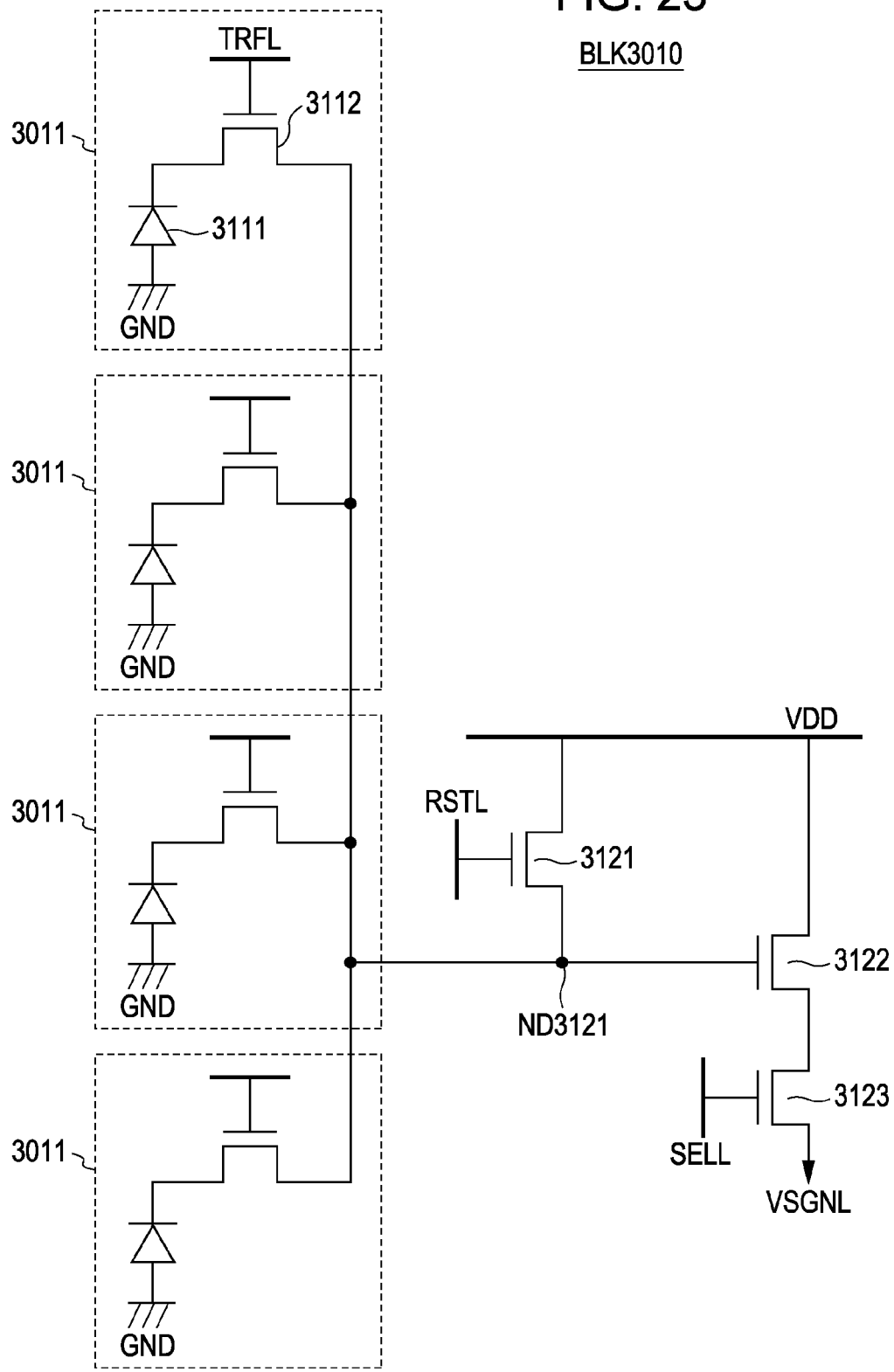
FIG. 23 is an equivalent circuit diagram illustrating one configuration example of an imaging apparatus according to an eleventh embodiment.

FIG. 23 is an equivalent circuit diagram illustrating one configuration example of the imaging apparatus according to the eleventh embodiment.

The pixel array unit 3012 of the imaging apparatus 3010 according to the eleventh embodiment includes, as shown in FIG. 23, a sharing block BLK 3010, and the sharing block BLK 3010 is made up of a photoelectric conversion unit (PD) 3111, four pixel circuits 3011 made up of a transfer transistor (TTR) 3112, a reset transistor (RTR) 3121, an amplification transistor (ATR) 3122, a selection transistor (STR) 3123, and a node ND 3121. Hereafter, such a configuration is referred to as a sharing block. Note that as for the photoelectric conversion unit 3111, for example, a photodiode is employed (in FIG. 23, the symbol of a photodiode is employed for the photoelectric conversion unit 3111, and hereafter, description will be made regarding this as a photodiode).

As shown in FIG. 23, with the photoelectric conversion unit (photodiode) 3111 of the pixel circuit 3011, the anode is grounded, and the cathode is connected to the source of the transfer transistor 3112. With the transfer transistor 3112, the source is connected to the cathode of the photoelectric conversion unit 3111, the drain is commonly connected to a node ND 3121, and the gate is connected to the transfer selection line TRFL, respectively.

With the reset transistor 3121, the source is connected to the node ND 3121, the drain is connected to the power potential VDD, and the gate is connected to the reset line RSTL, respectively. Also, the amplification transistor 3122 and the selection transistor 3123 are serially connected between the source and the drain thereof. With the amplification transistor 3122, the drain is connected to the power potential VDD, and the gate is connected to the node ND 3121, respectively. Also, with the selection transistor 3123, the source is connected to the vertical signal line VSGNL, and the gate is connected to the selection line SELL, respectively.

With the above-mentioned configuration example, the photoelectric conversion unit 3111 generates signal charge according to the light quantity of incident light by photoelectric conversion, and stores this.

Also, upon the state of the reset line RSTL being changed to a high level from a low level for example, the reset transistor 3121 is turned on (conductive state), and the potential of the node ND 3121 is reset to the power potential VDD.

Also, upon the state of the transfer selection line TRFL being changed to a high level, the transfer transistor 3112 is turned on, and the signal charge stored in the photoelectric conversion unit 3111 is transferred to the node ND 3121.

The amplification transistor 3122 amplifies the potential of the node ND 3121 during a period when the transfer transistor 3112 is turned on.

Also, upon the state of the selection line SELL being changed to a high level, the selection transistor 3123 is turned on, and signal charge is output to the vertical signal line VSGNL.

As described above, the drain of the transfer transistor 3112 in each pixel circuit 3011 is commonly connected to the node ND 3121, and four sets of pixel circuits 3011 share the reset transistor 3121, amplification transistor 3122, and selection transistor 3123.

The present embodiment reduces the number of elements, and the number of wirings within a pixel circuit, performs microfabrication of pixels, and increases the speed of the imaging apparatus, by employing the imaging apparatus having such a configuration.

First Placement Layout Example

Next, description will be made regarding a first placement layout example where each component of the equivalent circuit described in FIG. 23 is laid out on a semiconductor board.

Figure 24:
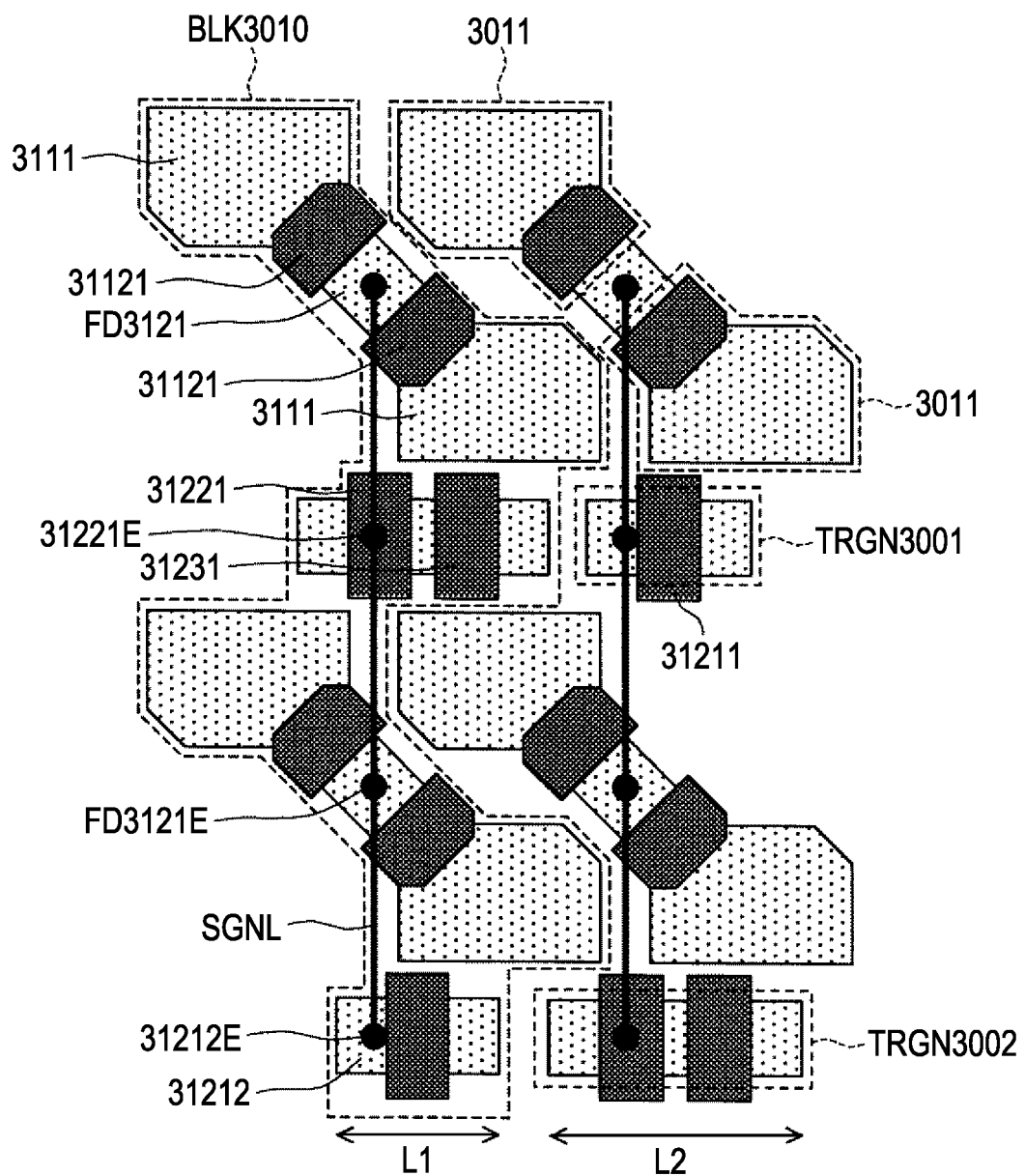
FIG. 24 is a diagram illustrating a first placement layout example according to the eleventh embodiment.

FIG. 24 is a diagram illustrating a first placement layout example according to the eleventh embodiment. With the imaging apparatus according to the eleventh embodiment, the equivalent circuit having the configuration described in FIG. 23 is laid out on a semiconductor board.

Specifically, the sharing block BLK 3010 is made up of a photoelectric conversion unit 3111, a transfer transistor 3112, a charge-to-voltage conversion unit FD 3121, a wiring SGNL, and transistor regions TRGN 3001 and TRGN 3002. Also, the transfer transistor 3112 includes a transfer gate 31121. The transistor region TRGN 3001 is formed at the reset transistor 3121, and the width in the gate length direction thereof is L3001. Note that the reset transistor 3121 includes the source 31212 and reset gate 31211 thereof. Further, the transistor region TRGN 3002 is formed at the amplification transistor 3122 and selection transistor 3123, and the width in the gate length direction thereof is L3002. Note that the amplification transistor 3122 includes an amplification gate 31221, the selection transistor 3123 includes a selection gate 31231.

With the first placement layout according to the eleventh embodiment, two pixel circuits 3011 made up of the photoelectric conversion unit 3111 and the transfer transistor 3112 share the charge-to-voltage conversion unit FD 3121, and two photoelectric conversion units 3111 are disposed in a diagonal direction sandwiching the charge-to-voltage conversion unit FD 3121. Further, within the single sharing block BLK 3010, two charge-to-voltage conversion units FD 3121 are each connected with the wiring SGNL such that the electrode FD 3121E thereof, the gate electrode 31221E of the amplification gate 31221, and the source electrode 31212E of the reset transistor 3121 share the transistor regions TRGN 3001 and TRGN 3002 which are disposed in a distributed manner. Accordingly, the single sharing block BLK 3010 includes four photoelectric conversion units 3111.

Also, as shown in FIG. 24, with the present first placement layout, multiple sharing blocks BLK 3010 are alternately disposed, and the transistor regions TRGN 3001 and TRGN 3002 of which the widths in the gate direction differ are disposed in a mutually different manner. At this time, the total (L1+L2) of the occupied sizes in the gate length direction of the transistor regions TRGN 3001 and TRGN 3002 is constant.

Next, description will be made regarding the operation of the imaging apparatus 3010 employing the eleventh embodiment with reference to a timing chart. Note that in order to simplify the description, of the pixel circuits shown in FIG. 23, the single pixel circuit 3011 will be described.

Figure 25:
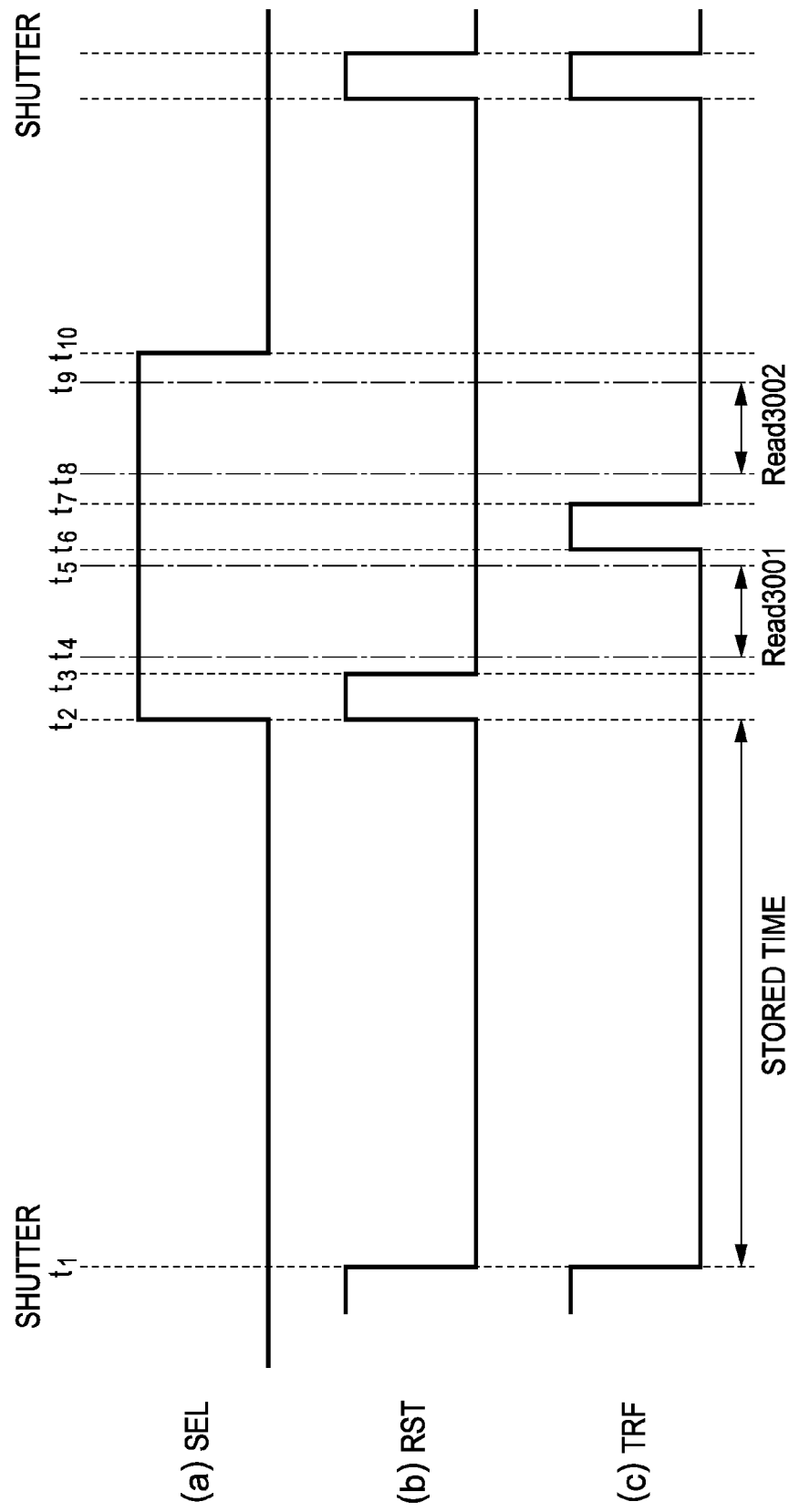
FIG. 25 is a timing chart for describing the operation of the equivalent circuit according to the eleventh embodiment.

FIG. 25 is a timing chart for describing the operation of the equivalent circuit according to the eleventh embodiment. In FIG. 25, (a) is a timing chart of the selection signal SEL which is propagated to the selection line SELL, (b) in FIG. 25 is a timing chart of the reset signal RST which is propagated to the reset line RSTL, and (c) in FIG. 25 is a timing chart of the transfer selection signal TRF which is propagated to the transfer selection line TRFL.

At point-in-time t1, incident light enters in the photoelectric conversion unit 3111. At this time, the transfer transistor 3112, reset transistor 3121, and selection transistor 3123 are in an OFF state (nonconductive state).

At point-in-time t1 through point-in-time t2, the photoelectric conversion unit 3111 converts the incident light into signal charge due to photoelectric effects. Subsequently, the photoelectric conversion unit 3111 stores signal charge till point-in-time t2 when the reset transistor 3121 is turned on. The period from point-in-time t1 to point-in-time t2 is the storage time of signal charge.

At point-in-time t2, the high-level selection signal SEL from the vertical scan circuit 3014 is propagated to the selection line SELL, whereby the selection transistor 3123 is turned on. At point-in-time t2 through point-in-time t10, the selection transistor 3123 is kept in an ON state.

Also, at point-in-time t2, the voltage of the node ND 3121 is reset. Specifically, the high-level reset signal RST is propagated to the reset line RSTL from the vertical scan circuit 3014, whereby the reset transistor 3121 is turned on, and the potential of the node ND 3121 is reset to the power potential VDD.

At point-in-time t3, the low-level reset signal RST from the vertical scan circuit 3014 is propagated to the reset line RSTL, whereby the reset transistor 3121 is turned off, and the voltage resetting of the node ND 3121 is completed.

At point-in-time t4 through point-in-time t5, the potential of the node ND 3121 is read out as a reference signal. Let us say that this readout period of the potential is taken as Read3001.

At point-in-time t6, the high-level transfer selection signal TRF is propagated to the transfer selection line TRFL from the vertical scan circuit 3014, whereby the transfer transistor 3112 is turned on, and the signal charge stored in the photoelectric conversion unit 3111 is transferred to the node ND 3121.

Also, at point-in-time t6 through point-in-time t7, the transfer transistor 3112 is kept in an ON state.

At point-in-time t7, the low-level transfer selection signal TRF is propagated to the transfer selection line TRFL from the vertical scan circuit 3014, whereby the transfer transistor 3112 is turned off.

At point-in-time t8 through point-in-time t9, the difference between the voltage of the node ND 3121 and the voltage of the reference signal read out during a readout period Read3001 is read out as a signal due to signal charge transferred from the node ND 3121. Let us say that this signal readout period is taken as Read3002. Also, at the time of this signal readout, the amplification transistor 3122 is turned on, the potential of the node ND 3121 is amplified, and the amplified voltage signal is output to the vertical signal line VSGNL via the signal output terminal 3211b.

At point-in-time t10, the low-level selection signal SEL is propagated to the selection line SELL from the vertical scan circuit 3014, whereby the selection transistor 3123 is turned off, and the voltage signal output to the horizontal scan circuit 3013 is completed.

With the eleventh embodiment, by employing such a layout, a vacant region around the photoelectric conversion unit 3111 and the like is reduced, and the semiconductor board surface can be efficiently used. Therefore, with the present embodiment, there is no need to reduce the use region of a component such as a transistor region or the like. Also, with the present embodiment, the gate length of a transistor can be increased, whereby the minimum pixel size of the same process generation can be reduced. Further, with the eleventh embodiment, the gate length of the amplification transistor can be increased, whereby the gate area can be increased, and also random noise can be reduced.

Second Placement Layout Example

Next, description will be made regarding a second placement layout example where each component of the equivalent circuit described in FIG. 23 is laid out on a semiconductor board.

Figure 26:
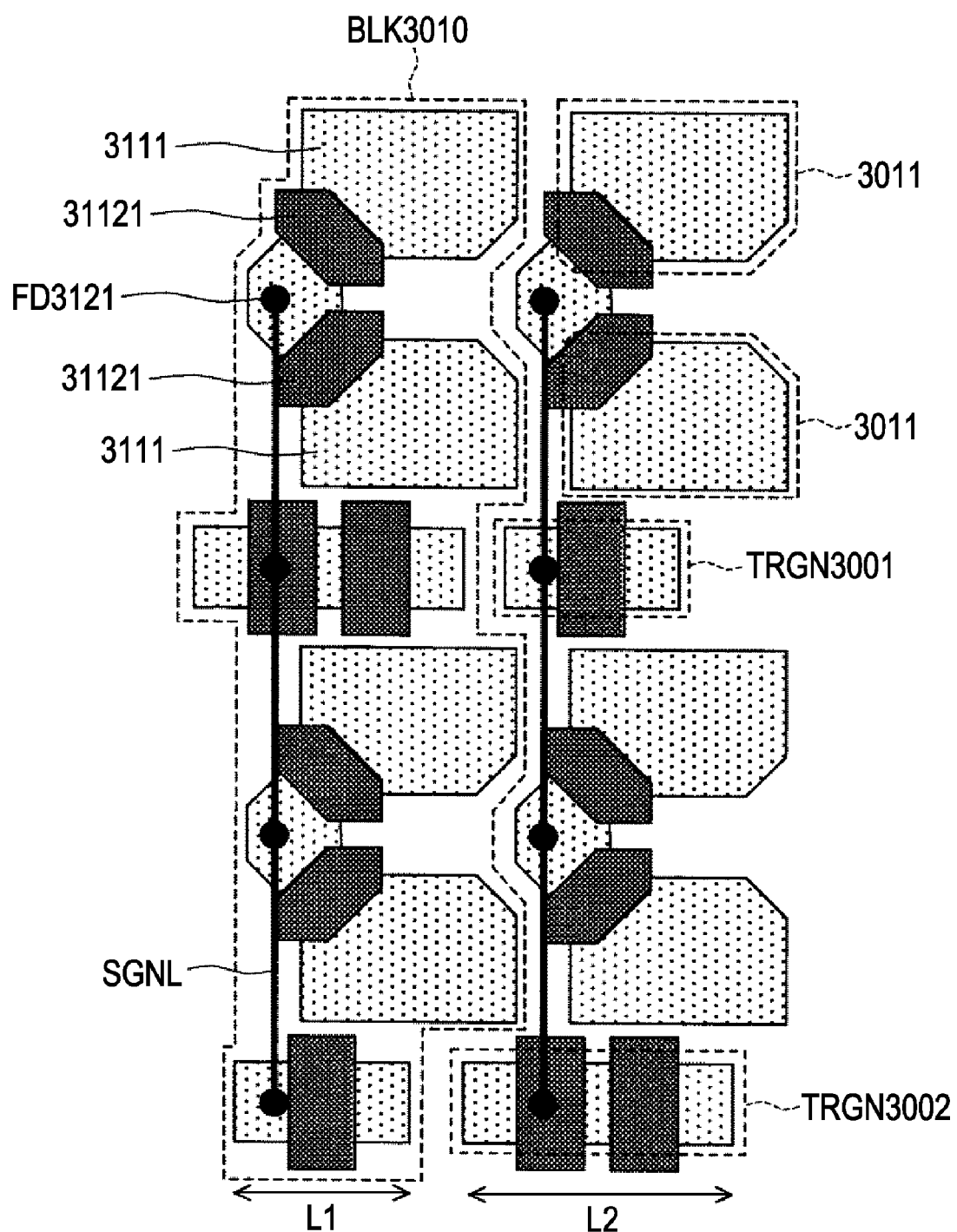
FIG. 26 is a diagram illustrating a second placement layout example according to the eleventh embodiment.

FIG. 26 is a diagram illustrating a second placement layout example according to the eleventh embodiment. The present placement layout example, as shown in FIG. 26, includes a sharing block BLK 3010 having the same configuration as that in the first placement layout example. Further, multiple sharing blocks BLK 3010 are alternately disposed, and transistor regions TRGN 3001 and TRGN 3002 of which the widths in the gate direction differ are disposed in a mutually different manner, but the placement mode of the photoelectric conversion unit 3111 differs from that in the first placement layout example.

Specifically, as shown in FIG. 26, two photoelectric conversion units 3111 are disposed vertically as to the wiring SGNL sandwiching the charge-to-voltage conversion unit FD 3121.

As shown in FIG. 26, the second placement layout is laid out such that the transistor regions TRGN 3001 and TRGN 3002 of which the widths in the gate length direction differ are combined so as to be adjacent to each other. At this time, the total (L3001+L3002) of the occupied sizes in the gate length direction of the transistor regions TRGN 3001 and TRGN 3002 is constant.

With the present placement layout example as well, a semiconductor board surface can be used efficiently, and the gate length of a transistor can be increased, whereby the same advantage as that in the first placement layout example according to the eleventh embodiment can be obtained.

Third Placement Layout Example

Next, description will be made regarding a third placement layout example where each component of the equivalent circuit described in FIG. 23 is laid out on a semiconductor board.

Figure 27:
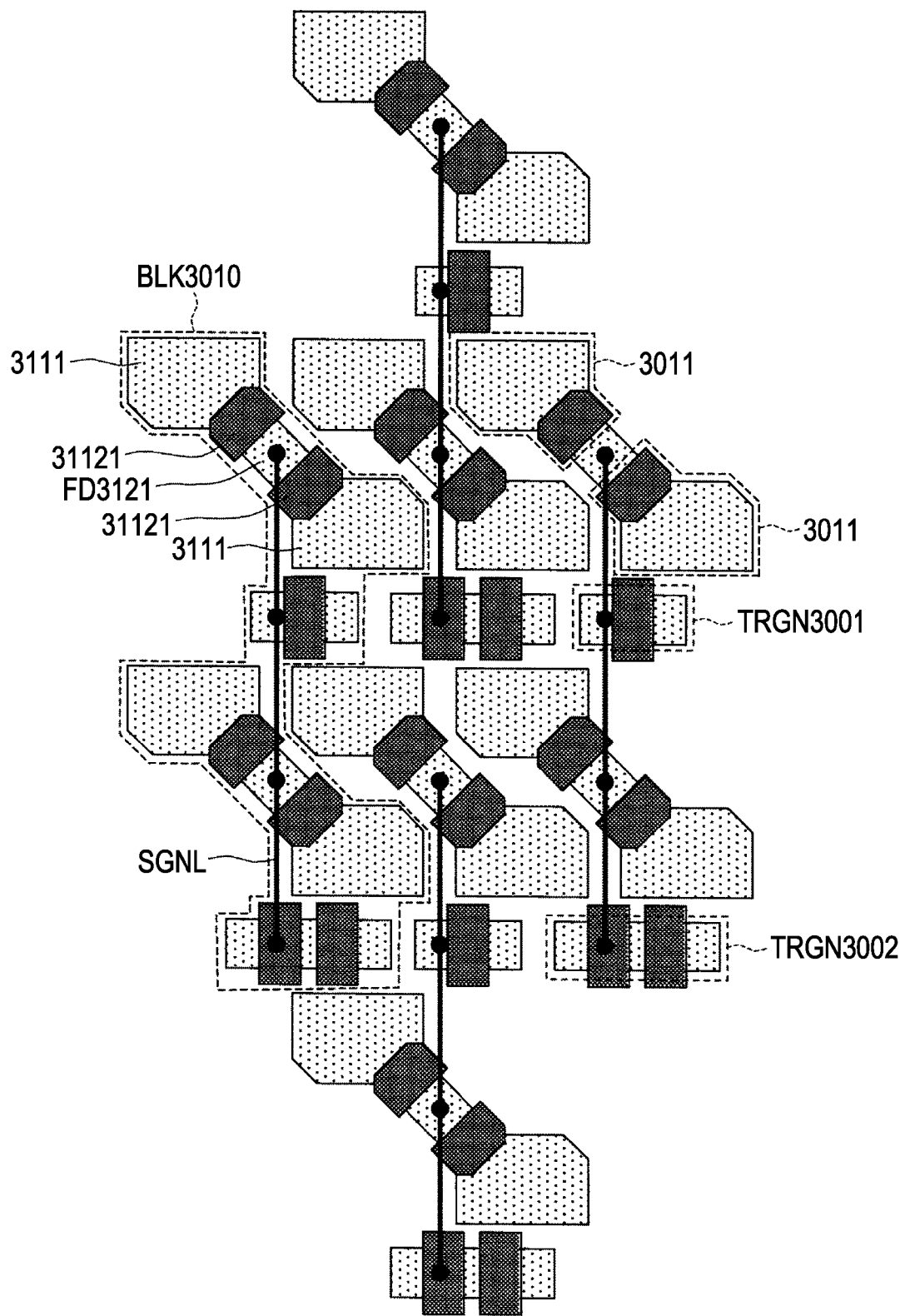
FIG. 27 is a diagram illustrating a third placement layout example according to the eleventh embodiment.

FIG. 27 is a diagram illustrating a third placement layout example according to the eleventh embodiment. The present placement layout example, as shown in FIG. 27, includes a sharing block BLK 3010 wherein the placement mode of the photoelectric conversion unit 3111 is the same as that in the first placement layout example, but the placement mode by multiple sharing blocks BLK 3010 differs from that in the first placement layout example.

Specifically, as shown in FIG. 27, the sharing block BLK 3010 is disposed by being shifted at each column. With the present placement layout example, the sharing block BLK 3010 is shifted at each column, and disposed such that the total (L3001+L3002) of the widths in the gate length direction of the transistor regions TRGN 3001 and TRGN 3002 of the same column is constant.

Note however, as shown in FIG. 27, the sharing block BLK 3010 is laid out by being shifted at each column, so the row to which the sharing block BLK 3010 belongs differs between adjacent columns.

Figure 28:
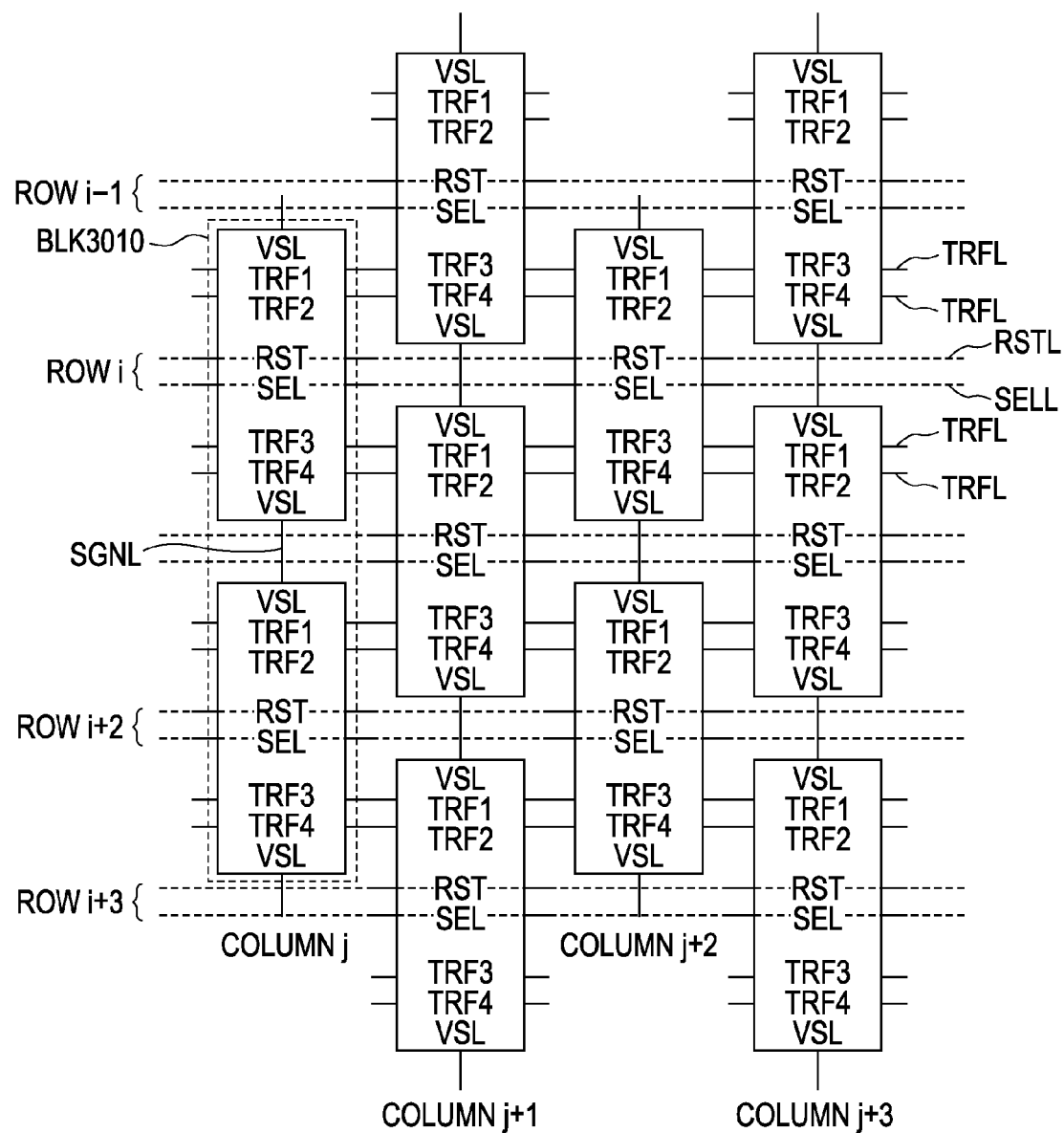
FIG. 28 is a diagram for describing shifting of a row to which a sharing block BLK 3010 belongs, according to the eleventh embodiment.

Next, description will be made with reference to FIG. 28 regarding shifting of the row to which the sharing block BLK 3010 belongs. FIG. 28 is a diagram for describing shifting of the row to which the sharing block BLK 3010 belongs.

In FIG. 28, VSL of the sharing block BLK 3010 denotes a photoelectric conversion unit 3111, TRF 3001 through TRF 3004 denote first through fourth transfer gates 31121, RST denotes a reset gate 31211, and SEL denotes a selection gate 31231, respectively.

With the single sharing block BLK 3010 shown in FIG. 28, two photoelectric conversion units 3111 which share the charge-to-voltage conversion unit FD 3121 are connected with the wiring SGNL. Accordingly, the single sharing block BLK 3010 share four photoelectric conversion units 3111.

The sharing block BLK 3010 having such a configuration is laid out so as to be shifted at each column such that the total of the widths in the gate length direction of the transistor regions TRGN 3001 and TRGN 3002 of the same column is constant.

Specifically, the reset gates 31211 of the same row are commonly connected with the reset line RSTL, and the selection gates 31231 of the same row are commonly connected with the selection line SELL. However, the reset gates 31211 and selection gates 31231 are each connected with the reset line RSTL and selection line SELL which differ depending on a column. For example, as shown in FIG. 27, if we say that the placement of the reset line RSTL or selection line SELL is on a row, the reset gates 31211 and selection gates 31231 of row i column j and row i column (j+2) row are commonly connected, and the reset gates 31211 and selection gates 31231 of row (i+1) column (j+1) and row (i+1) column (j+3) are commonly connected.

Also, a first transfer gate 31121 (TRF 3001) and a third transfer gate 31121 (TRF 3003) of the same row are commonly connected with the transfer selection line TRFL, and a second transfer gate 31121 (TRF 3002) and a fourth transfer gate 31121 (TRF 3004) of the same row are commonly connected with the transfer selection line TRFL.

As shown in FIG. 28, the first through fourth transfer gates 31121 in the same row direction are commonly connected with the transfer selection line TRFL, whereby the first through fourth transfer transistors 3112 can be controlled at each row. However, the reset gate 31211 and selection gate 31231 of each column are each connected to a different reset line RSTL and selection line SELL by being shifted by one row worth. Accordingly, the vertical scan circuit 3014 (see FIG. 22) propagates a reset signal and a selection signal which control the reset transistor 3121 and selection transistor 3121 respectively to the reset line RSTL and selection line SELL by shifting rows by one row worth, in accordance with the column.

With the present placement layout example as well, a semiconductor board surface can be used efficiently, and the gate length of a transistor can be increased, whereby the same advantage as that in the first or second placement layout example according to the present embodiment can be obtained.

Note that the placement mode of the photoelectric conversion unit 3111 employed with the present placement layout example is the same as that in the first placement layout example, but the same placement mode as that in the second placement layout may be employed. In this case as well, the same advantage as that in the first, second or third placement example according to the present embodiment can be obtained.

Figure 29:
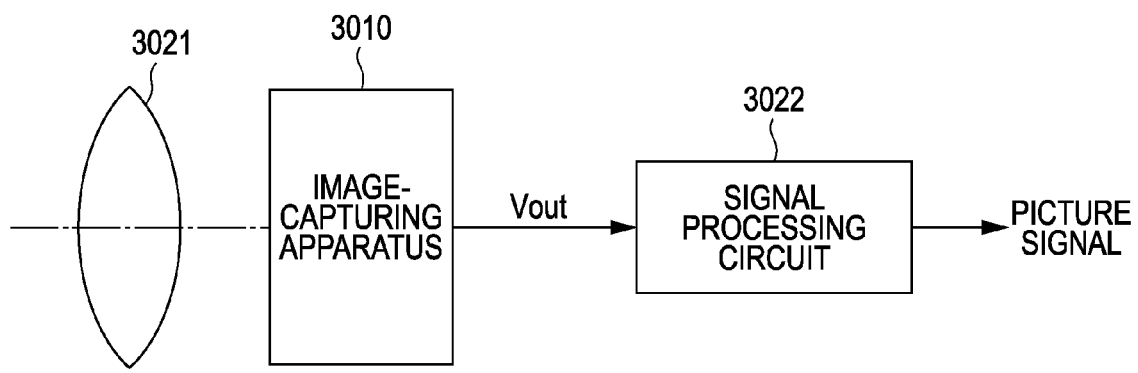
FIG. 29 is a block diagram illustrating an overview of the configuration of a camera according to the eleventh embodiment.
Figure 30:
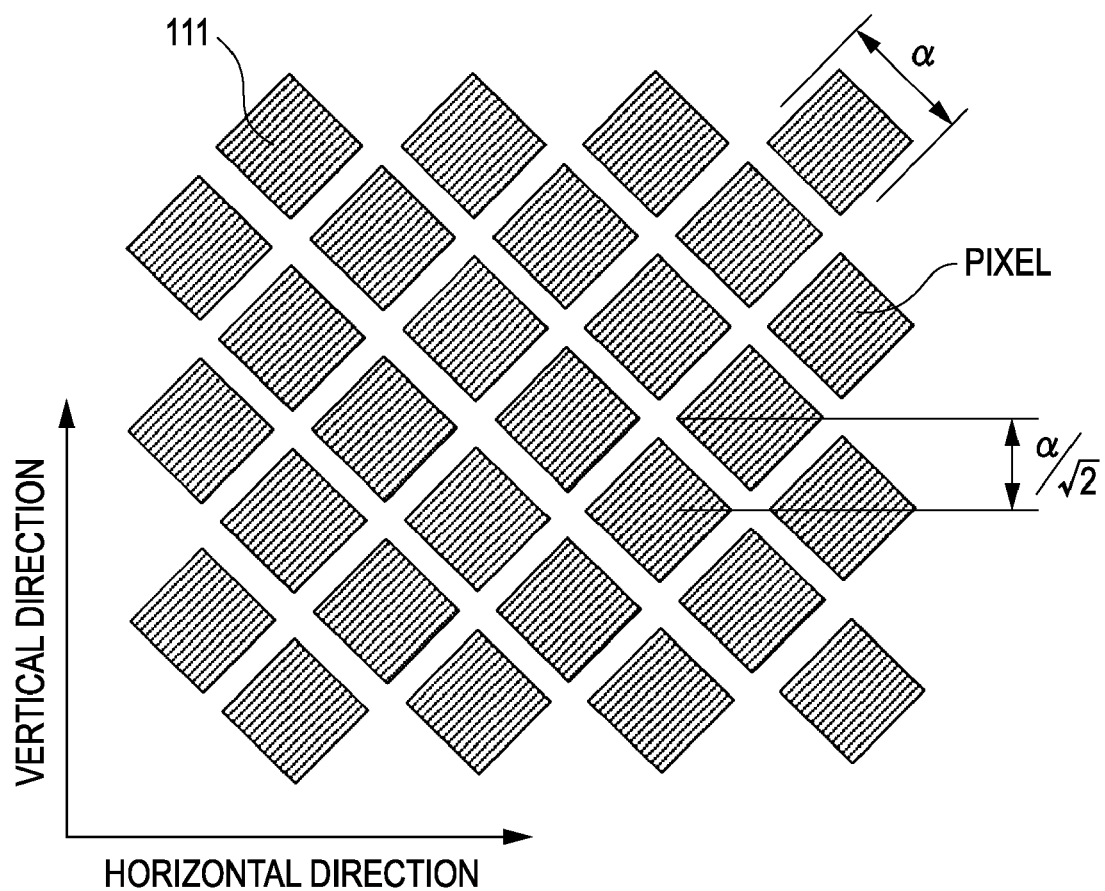
FIG. 30 is a plan layout view illustrating one example of a common honeycomb pixel array.
Figure 31A:
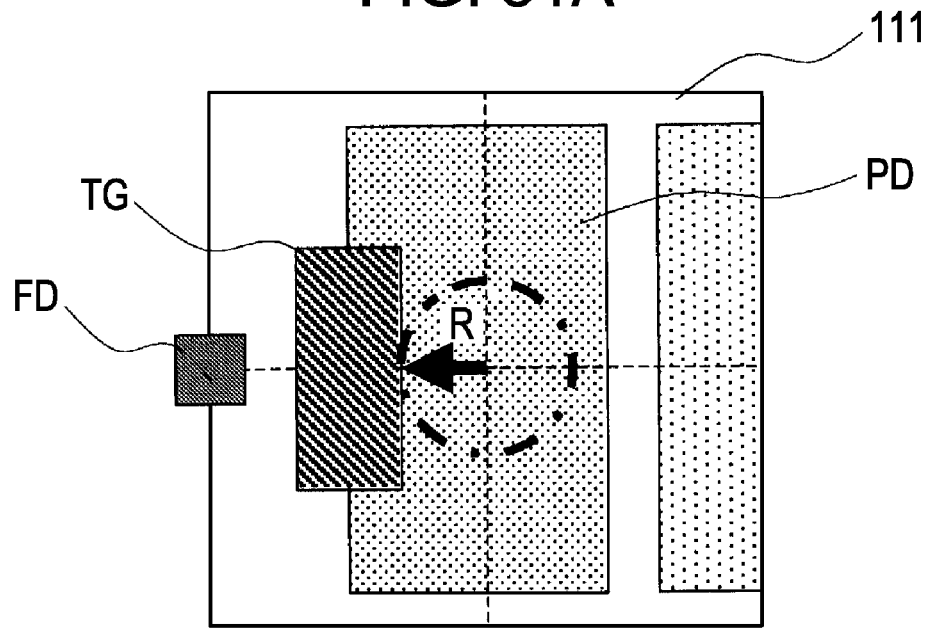
FIGS. 31A and 31B are plan layout views illustrating one example of a shared state of an existing charge-to-voltage conversion unit.
Figure 31B:
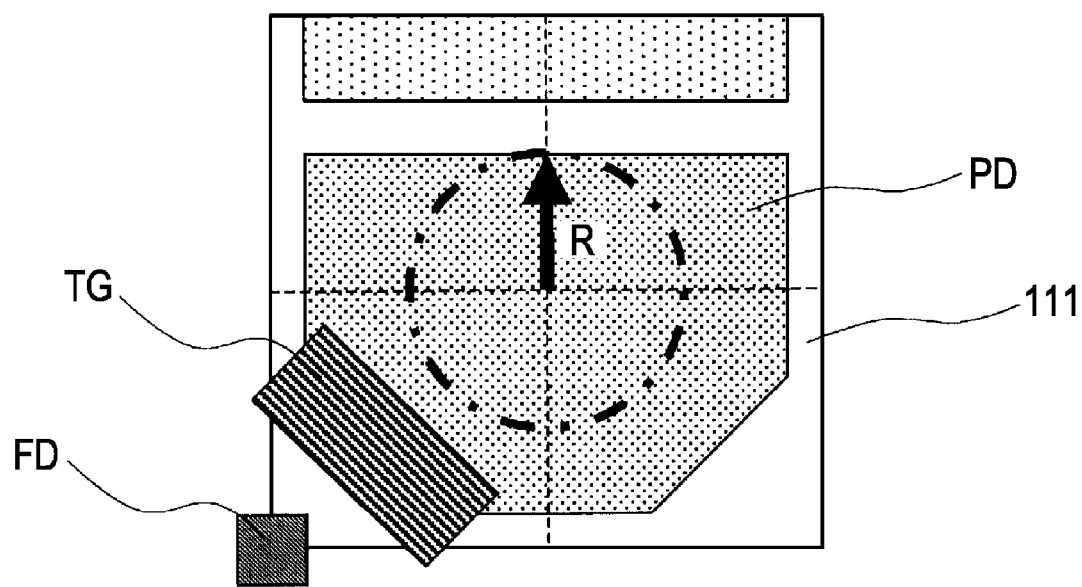
Figure 32:
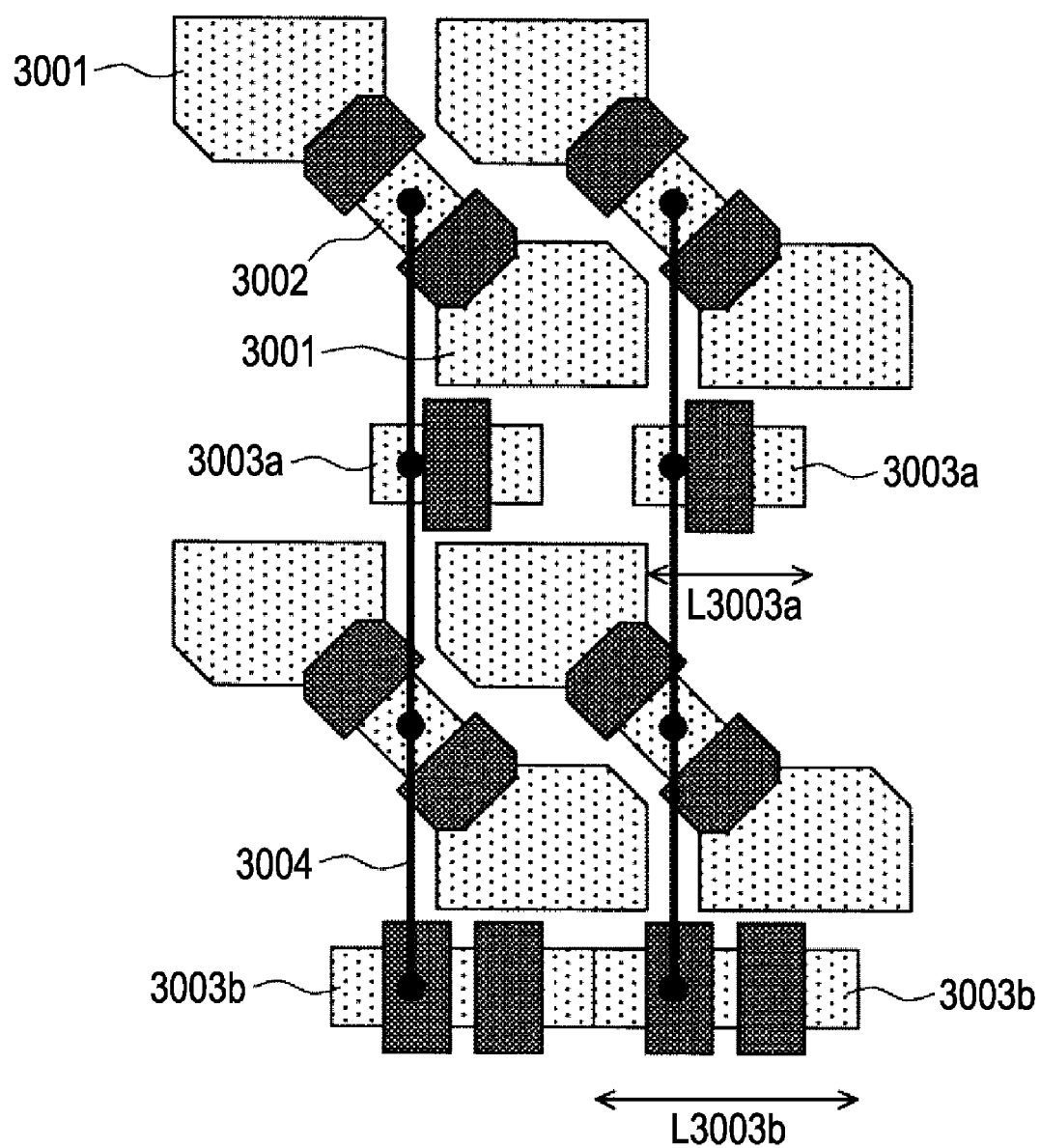
FIG. 32 is a diagram for describing layout unevenness in the case of sharing multiple components.

Next, description will be made regarding a camera according to the eleventh embodiment of the present invention. FIG. 29 is a block diagram illustrating an overview of the configuration of a camera according to the eleventh embodiment of the present invention.

The camera 3020 is configured to include an imaging apparatus 3010, an optical system configured to guide incident light to a pixel array unit 3012 of the imaging apparatus 3010, e.g., a lens 3021 configured to subject incident light (image light) to image formation of the imaging surface, a signal processing circuit 3022 configured to process the output signal of the imaging apparatus 3010, and so forth.

With the camera 3020, as for the imaging apparatus 3010, the imaging apparatus according to the above-mentioned embodiment is employed. The signal processing circuit 3022 subjects an output signal Vout from the output buffer 3016 of the imaging apparatus 3010 to various types of signal processing, and outputs a picture signal.

According to the present camera 3020, a high-quality taken image which corresponds to increase in the number of pixels can be obtained by employing the imaging apparatus 3010 according to the above-mentioned embodiment.

Note that the imaging apparatus 3010 may be an imaging apparatus formed as one chip, or may be a module-type imaging apparatus formed as a multiple-chips assembly. An imaging apparatus formed as a multiple-chips assembly may be formed by a sensor chip configured to perform imaging, and a signal processing chip configured to perform digital signal processing being formed separately, and further includes an optical system in some cases.

As described above, the present embodiment includes a transistor region made up of a reset transistor, and a transistor region made up of a selection transistor and an amplification transistor, and further forms a sharing block wherein these transistor regions are shared with multiple photoelectric conversion units. This sharing block is laid out such that the total of occupied sizes in the gate length direction in the transistor regions is constant, and the respective transistor regions are combined to be adjacent to each other.

Consequently, a vacant region around the photoelectric conversion units is reduced, and the semiconductor board surface can be efficiently used. Further, the gate length of the amplification transistor can be increased, whereby an advantage can be obtained wherein the gate area increases, which prevents the amplification transistor from readily receiving influence of noise.

Note that the present embodiment includes a transistor region made up of a reset transistor, and a transistor region made up of a selection transistor and an amplification transistor. A combination of components making up a transistor region is not restricted, as long as a layout is employed wherein a shared component is disposed in multiple places. Also, the transistors serving as components employed for the present embodiment may be an n-channel type or p-channel type.

Note that reference numeral 3011 denotes a pixel circuit (PIXEL), 3012 denotes a pixel array unit, 3013 denotes a horizontal scan circuit (HSCN), 3131 denotes an AD converter, 3014 denotes a vertical scan circuit (VSCN), 3015 denotes an analog front end unit, 3016 denotes an output buffer, 3017 denotes a timing generator (TG), BLK 3010 denotes a sharing block, 3111 denotes a photoelectric conversion unit (PD), 3112 denotes a transfer transistor (TTR), 3121 denotes a reset transistor (RTR), 3122 denotes an amplification transistor (ATR), 3123 denotes a selection transistor (STR), FD 3121 denotes a charge-to-voltage conversion unit, TRGN 3001 and TRGN 3002 denote transistor regions, 31121 denotes a transfer gate, 31212 denotes the source of the reset transistor, 31211 denotes a reset gate, 31221 denotes an amplification gate, 31231 denotes a selection gate, L1 and L2 denote the widths in the gate length direction, SGNL denotes a wiring, RSTL denotes a reset line, TRFL denotes a transfer selection line, SELL denotes a selection line, VSGNL denotes a vertical signal line, and HSCNL denotes a horizontal signal line.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device with a pixel block comprising:
   four pixels arranged in a slanted grid array which is inclined relative to a scanning direction, each pixel including a photoelectric conversion unit configured to convert incident light quantity into an electric signal, the photoelectric conversion units arranged in two linear pixel pairs arranged along adjacent slanted lines of the grid;
   two charge-to-voltage conversion units (a) configured to convert signal charge read out from said photoelectric conversion units into a voltage signal and (b) respectively disposed between two pixels closest to each other, the two pixels being from different pixel pairs, each charge-to-voltage conversion unit coupled to and shared by its respective two pixels; and
   a transistor group coupled to the charge-to-voltage conversion units and shared by the pixel pairs and located proximate to one of the pixel pairs.

2. The solid-state imaging device according to claim 1, wherein the transistor group includes a signal amplifier.

3. The solid-state imaging device according to claim 1, wherein said set of transistor group can transfer charge from said photoelectric conversion unit to said charge-to-voltage conversion unit, amplify signal charge of said charge-to-voltage conversion unit, and reset signal charge of said charge-to-voltage conversion unit.

4. The solid-state imaging device according to claim 3, wherein said pixels are arrayed in the vertical direction and in the horizontal direction in an even pitch.

5. The solid-state imaging device according to claim 3, wherein said transistor group comprises a plurality of transistors are arrayed in one column parallel to said slanted lines of said slanted grid.

6. The imaging device of claim 1, wherein the transistor group comprises a plurality of components arranged along a line parallel to the slanted lines of the pixel pairs.

7. An imaging apparatus comprising:
   a condensing optical unit configured to condense incident light;
   a solid-state imaging device configured to receive the light condensed by said condensing optical unit to subject this to photoelectric conversion; and
   a signal processing unit configured to process the signal subjected to photoelectric conversion;
   wherein said solid-state imaging device includes a pixel block, the pixel block comprising:
      four pixels arranged in a slanted grid array which is inclined relative to a scanning direction, each pixel including a photoelectric conversion unit configured to convert incident light quantity into an electric signal, the photoelectric conversion elements arranged in two linear pixel pairs arranged along adjacent slanted lines of the grid, and
      two charge-to-voltage conversion units (a) configured to convert signal charge read out from said photoelectric conversion units into a voltage signal and (b) respectively disposed between two pixels closest to each other, the two pixels being from different pixel pairs, each charge-to-voltage conversion unit coupled to and shared by its respective two pixels; and
   a transistor group coupled to the charge-to-voltage conversion units and shared by the pixel pairs and located proximate to one of the pixel pairs.

8. The imaging apparatus of claim 7, wherein the transistor group comprises a plurality of components arranged along a line parallel to the slanted lines of the pixel pairs.

9. A camera comprising:
   an imaging apparatus; and an optical system configured to guide incident light to an imaging area of said imaging apparatus,
   wherein said imaging apparatus comprises
      (A) a pixel block comprising
         (i) four pixels making up arranged in a slanted grid array which is inclined relative to a scanning direction, which include each pixel including a photoelectric conversion unit configured to convert incident light quantity into an electric signal, the photoelectric conversion units arranged in two linear pixel pairs arranged along adjacent slanted lines of the grid, and
         (ii) a two charge-to-voltage conversion unit units (a) configured to convert signal charge read out from said photoelectric conversion unit units into a voltage signal and (b) respectively disposed between two pixels adjacent closest to each other, the two pixels being from different pixel pairs in the diagonal direction of the pixels of said plurality of pixels into voltage, each charge-to-voltage conversion unit coupled to and shared (c) by its respective two pixels; and
      (B) a transistor group coupled to the charge-to-voltage conversion units and shared by the pixel pairs and located proximate to one of the pixel pairs.

10. The camera of claim 9, wherein the transistor group comprises a plurality of components arranged along a line parallel to the slanted lines of the pixel pairs.

* * * * *